US009240549B2

(12) United States Patent
Ohba et al.

(10) Patent No.: US 9,240,549 B2
(45) Date of Patent: *Jan. 19, 2016

(54) MEMORY COMPONENT, MEMORY DEVICE, AND METHOD OF OPERATING MEMORY DEVICE

(71) Applicant: Sony Corporation, Tokyo (JP)

(72) Inventors: Kazuhiro Ohba, Miyagi (JP); Shuichiro Yasuda, Kanagawa (JP); Tetsuya Mizuguchi, Kanagawa (JP); Katsuhisa Aratani, Aichi (JP); Masayuki Shimuta, Kanagawa (JP); Akira Kouchiyama, Kanagawa (JP); Mayumi Ogasawara, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/201,376

(22) Filed: Mar. 7, 2014

(65) Prior Publication Data

US 2014/0183438 A1 Jul. 3, 2014

Related U.S. Application Data

(63) Continuation of application No. 13/846,193, filed on Mar. 18, 2013, now Pat. No. 8,730,709, which is a continuation of application No. 13/018,744, filed on Feb. 1, 2011, now Pat. No. 8,427,860.

(30) Foreign Application Priority Data

Feb. 9, 2010 (JP) .................................. 2010-026573
Nov. 24, 2010 (JP) .................................. 2010-261517

(51) Int. Cl.
*H01L 45/00* (2006.01)
*G11C 11/16* (2006.01)
(Continued)

(52) U.S. Cl.
CPC ............ *H01L 45/1253* (2013.01); *G11C 11/16* (2013.01); *G11C 13/0011* (2013.01);
(Continued)

(58) Field of Classification Search
CPC ........................... G11C 13/0069; G11C 11/16
USPC ............................................... 365/148, 158
See application file for complete search history.

(56) References Cited

U.S. PATENT DOCUMENTS 6,867,996 B2* 3/2005 Campbell et al. ............. 365/100
2004/0042259 A1* 3/2004 Campbell et al. ............. 365/158
(Continued)

FOREIGN PATENT DOCUMENTS

CN 102405499 A 4/2012
JP 00/48196 8/2000
(Continued)

OTHER PUBLICATIONS

Japanese Office Examination report issued in connection with related Japanese Patent Application No. 2010-261517 dated Jul. 29, 2014.
(Continued)

*Primary Examiner* — Michael Tran
(74) *Attorney, Agent, or Firm* — Dentons US LLP

(57) ABSTRACT

A memory component including first and second electrodes with a memory layer therebetween, the memory layer having first and second memory layers, the first memory layer containing aluminum and a chalcogen element of tellurium, the second memory layer between the first memory layer and the first electrode and containing an aluminum oxide and at least one of a transition metal oxide and a transition metal oxynitride having a lower resistance than the aluminum oxide.

20 Claims, 48 Drawing Sheets

(51) Int. Cl.
*G11C 13/00* (2006.01)
*H01L 27/24* (2006.01)

(52) U.S. Cl.
CPC ........ *H01L27/2436* (2013.01); *H01L 27/2472* (2013.01); *H01L 45/085* (2013.01); *H01L 45/1266* (2013.01); *H01L 45/145* (2013.01); *H01L 45/146* (2013.01); *H01L 45/1633* (2013.01)

(56) References Cited

U.S. PATENT DOCUMENTS

| | | |
|---|---|---|
| 2006/0244147 A1 | 11/2006 | Lee et al. |
| 2008/0016684 A1 | 1/2008 | Olechnowicz et al. |
| 2009/0262569 A1* | 10/2009 | Shinozaki .................... 365/148 |
| 2009/0283739 A1* | 11/2009 | Kiyotoshi ........................ 257/4 |
| 2009/0294751 A1* | 12/2009 | Kiyotoshi ........................ 257/4 |
| 2009/0303774 A1* | 12/2009 | Ho et al. ...................... 365/148 |
| 2010/0265750 A1 | 10/2010 | Yan et al. |

FOREIGN PATENT DOCUMENTS

| | | |
|---|---|---|
| JP | 2002-536840 | 10/2002 |
| JP | 2005-197634 | 7/2005 |
| JP | 2009-043873 | 2/2009 |
| JP | 2009-043905 | 2/2009 |
| JP | 2009-164467 | 7/2009 |

OTHER PUBLICATIONS

Chinese Office Examination report issued in connection with related Chinese patent application No. CN 201110035461.9 dated Aug. 5, 2014.

* cited by examiner

EXAMPLE 1

EXAMPLE 2

EXAMPLE 3

TYPICAL Tr (100 μA)

NUMBER OF REPETITIONS

SMALL Tr (50 μA)

NUMBER OF REPETITIONS

COMPARATIVE EXAMPLE 1

TYPICAL Tr (100 μA)

SMALL Tr (50 μA)

COMPARATIVE EXAMPLE 2

TYPICAL Tr (100 μA)

SMALL Tr (50 μA)

COMPARATIVE EXAMPLE 3

AFTER 1000 REPETITIONS

TYPICAL Tr (100 μA)

SMALL Tr (50 μA)

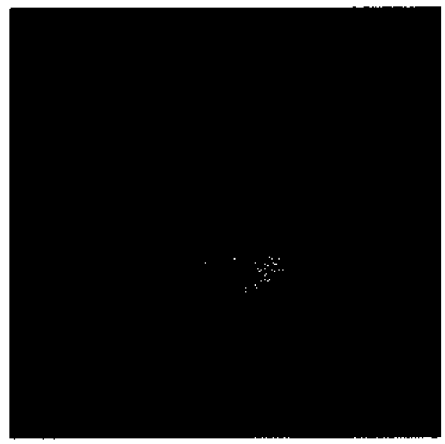
FIG.22A  Ti
FIG.22B  O
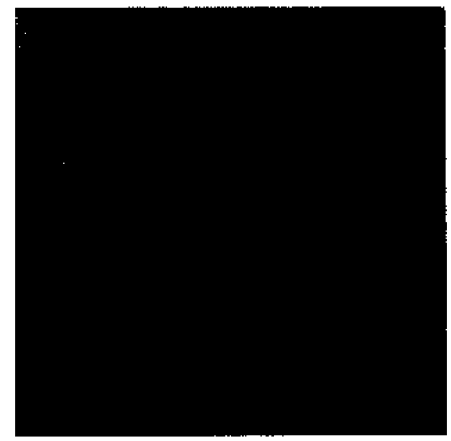
FIG.22C  Al

EXAMPLE 4-1

TYPICAL Tr (100 μA)

SMALL Tr (50 μA)

EXAMPLE 4-2

TYPICAL Tr (100 μA)

SMALL Tr (50 μA)

EXAMPLE 5-1

TYPICAL Tr (100 μA)

SMALL Tr (50 μA)

EXAMPLE 6-1

EXAMPLE 6-2

TYPICAL Tr (100 μA)

NUMBER OF REPETITIONS

SMALL Tr (50 μA)

NUMBER OF REPETITIONS

EXAMPLE 6-3

TYPICAL Tr (100 μA)

SMALL Tr (50 μA)

EXAMPLE 6-4

TYPICAL Tr (100 μA)

SMALL Tr (50 μA)

EXAMPLE 6-5

TYPICAL Tr (100 μA)

NUMBER OF REPETITIONS

SMALL Tr (50 μA)

NUMBER OF REPETITIONS

EXAMPLE 7-1

EXAMPLE 7-2

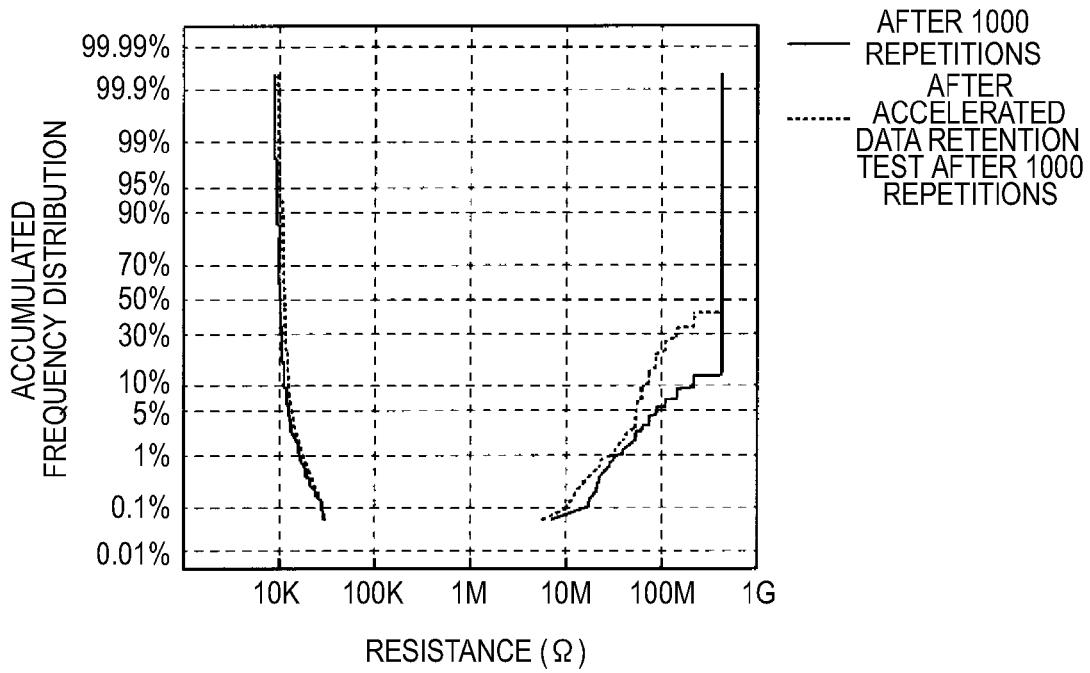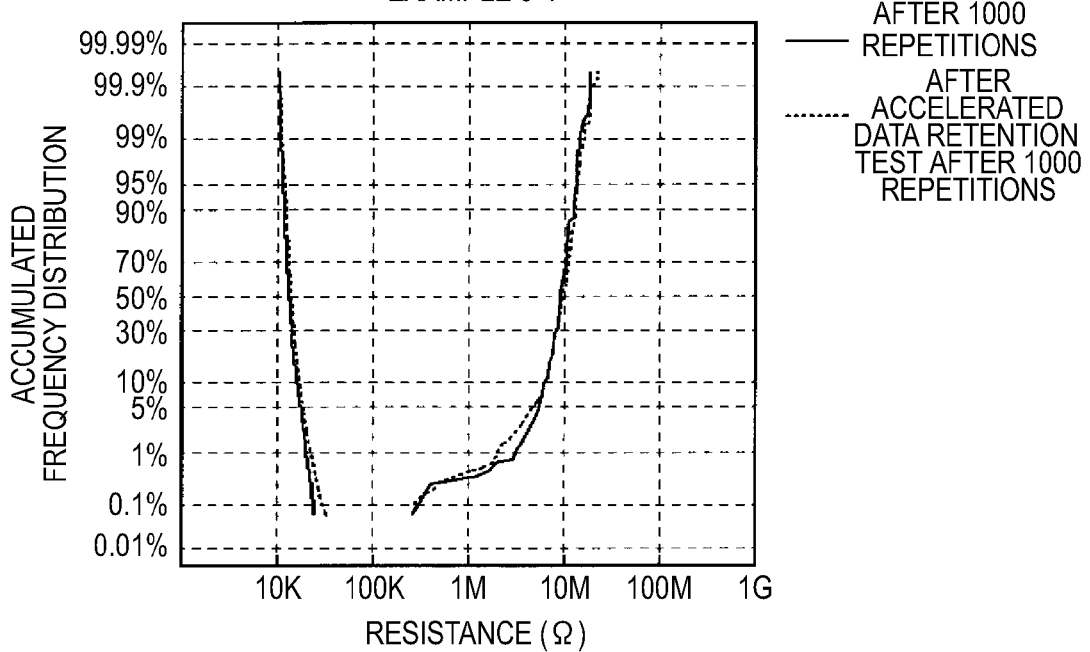

EXAMPLE 9-1

EXAMPLE 9-2

EXAMPLE 10

EXAMPLE 11

EXAMPLE 10

EXAMPLE 11

EXAMPLE 12

EXAMPLE 13-1

TYPICAL Tr (100 μA)

SMALL Tr (50 μA)

EXAMPLE 13-2

TYPICAL Tr (100 μA)

NUMBER OF REPETITIONS

SMALL Tr (50 μA)

NUMBER OF REPETITIONS

EXAMPLE 13-3

TYPICAL Tr (100 μA)

SMALL Tr (50 μA)

EXAMPLE 14

EXAMPLE 15

EXAMPLE 16

EXAMPLE 17

EXAMPLE 18

COMPARATIVE EXAMPLE 4

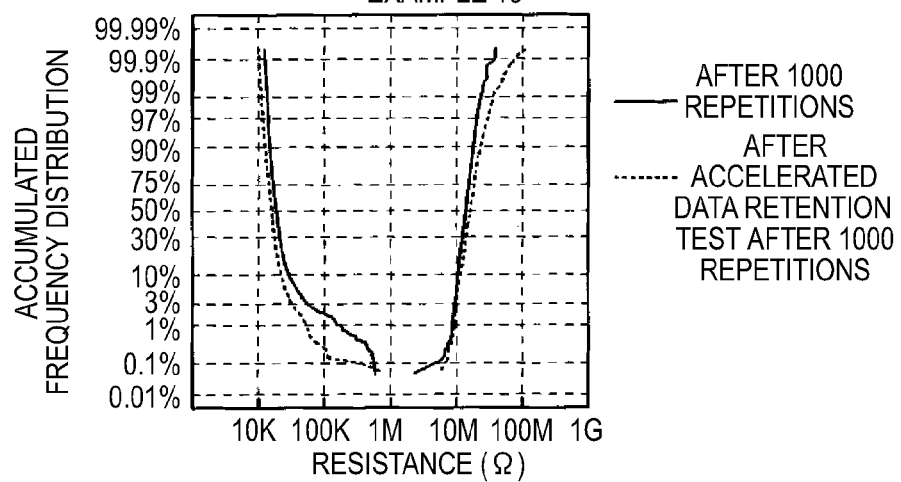
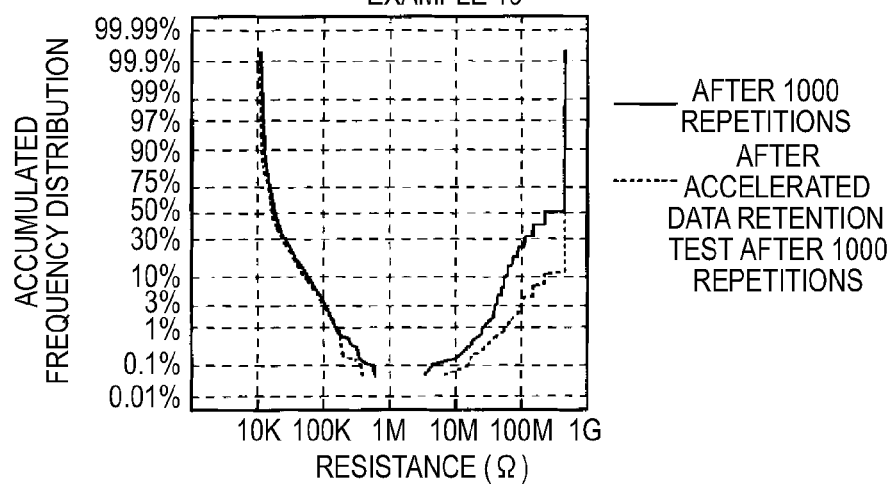
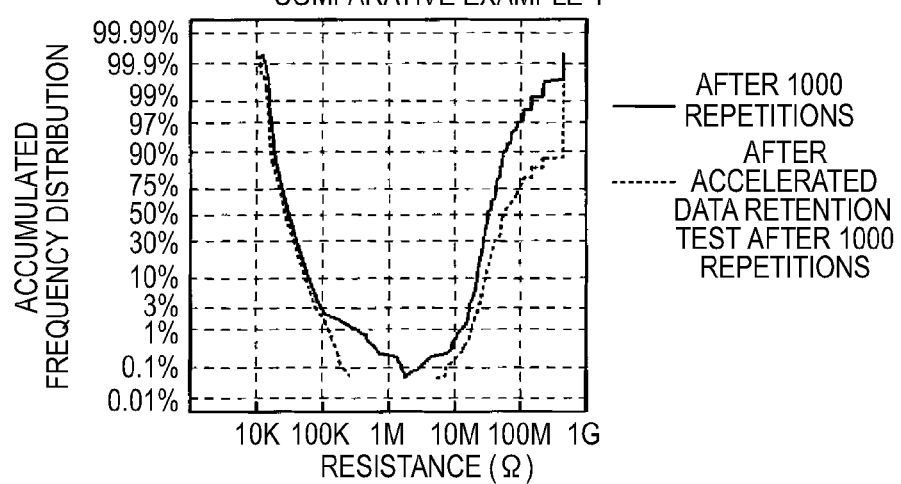

EXAMPLE 20

TYPICAL Tr (100 μA)

NUMBER OF REPETITIONS

SMALL Tr (50 μA)

NUMBER OF REPETITIONS

MEMORY COMPONENT, MEMORY DEVICE, AND METHOD OF OPERATING MEMORY DEVICE

RELATED APPLICATION DATA

This application is a continuation of U.S. patent application Ser. No. 13/846,193 filed Mar. 18, 2013 which is a continuation of U.S. patent application Ser. No. 13/018,744 filed Feb. 1, 2011, now U.S. Pat. No. 8,427,860 issued Apr. 23, 2013 the entirety of which is incorporated herein by reference to the extent permitted by law. The present application claims the benefit of priority to Japanese Patent Application Nos. JP 2010-026573 filed on Feb. 9, 2010 and JP 2010-0261517 filed on Nov. 24, 2010 in the Japan Patent Office, the entirety of which is incorporated by reference herein to the extent permitted by law.

BACKGROUND OF THE INVENTION

1. Field of the Invention

The present invention relates to a memory component and a memory device capable of storing information using a change in electrical characteristics of a memory layer that includes an ion source layer and a resistance variable layer, and a method of operating a memory device.

2. Description of the Related Art

In information equipment such as a computer, high-speed and high-density DRAMs (Dynamic Random Access Memory) have been widely used as a random access memory. However, DRAMs involve high manufacturing costs due to their complicated manufacturing process as compared to typical logic circuit LSIs and signal processing circuits used in electronic equipment. Moreover, DRAMs are volatile memories in which information is lost when power is turned off. Therefore, it is necessary for DRAMs to perform a frequent refresh operation; that is, the written information (data) must be read, amplified again and rewritten.

In the related art, for example, flash memories, FeRAMs (Ferroelectric Random Access Memories; ferroelectric memories), MRAMs (Magnetoresistive Random Access Memories; magnetic memory components), and the like have been proposed as nonvolatile memories which can retain information even when power is turned off. These memories can retain the written information for an extended period even when no power is supplied. However, these memories have their advantages and disadvantages. That is, flash memories have a high degree of integration but are disadvantageous in terms of operating speed. FeRAMs have limitations in micro-patterning required for higher degrees of integration and also have problems with their manufacturing process. MRAMs have problems with their power consumption.

Therefore, a new type of memory component is proposed which is particularly advantageous in overcoming the limitations in micro-patterning memory components. This memory component has a structure in which an ion conductor containing a certain metal is sandwiched between two electrodes. In this memory component, the metal contained in the ion conductor is contained in any one of the two electrodes. As a result, when a voltage is applied between the two electrodes, the metal contained in the electrode diffuses into the ion conductor as ions. Thus, electrical characteristics, such as a resistance value or a capacitance, of the ion conductor are changed. For example, JP-T-2002-536840 proposes an example of a memory device using this property. The memory device proposed in JP-T-2002-536840 has a configuration in which the ion conductor is made of a solid solution of chalcogenide and metal. Specifically, the ion conductor is made of a material in which Ag, Cu or Zn is dissolved in AsS, GeS, and GeSe, and Ag, Cu, or Zn is contained in any one of the two electrodes.

In the configuration disclosed in JP-T-2002-536840, due to a temperature rise during the manufacturing process or a long-term thermal load when data is retained for an extended period, crystallization of the ion conductor is accelerated, and the original electrical characteristics such as a resistance value are changed. Therefore, JP-A-2005-197634 proposes a configuration in which a thin memory film made of a gadolinium oxide film is provided between the ion conductor and the electrode.

SUMMARY OF THE INVENTION

However, the configuration disclosed in JP-A-2005-197634 has an insufficient erasure performance, and when a number of bits are rewritten, the resistance value in the erased state tends to shift towards the lower side. Thus, a resistance separation width between the resistance value in the written state and the resistance value in the erased state is not sufficient, and there is room for improvement in repetition durability.

Therefore, it is desirable to provide a memory component and a memory device having improved repetition durability and a method of operating a memory device.

A memory component according to an embodiment of the present invention includes a first electrode, a memory layer, and a second electrode which are provided in that order. The memory layer includes the following constituent elements (A) and (B).

(A) An ion source layer containing aluminum (Al) together with at least one chalcogen element selected from the group consisting of tellurium (Te), sulfur (S), and selenium (Se).

(B) A resistance variable layer provided between the ion source layer and the first electrode and containing an aluminum oxide and at least one of a transition metal oxide and a transition metal oxynitride having a lower resistance than the aluminum oxide.

A memory device according to an embodiment of the present invention includes a plurality of memory components, each including a first electrode, a memory layer, and a second electrode which are provided in that order, and a pulse application means for selectively applies a voltage or current pulse to the plurality of memory components. The plurality of memory components are configured by the memory component according to the embodiment of the present invention.

A method of operating a memory device according to an embodiment of the present invention includes the steps of applying a voltage between a first electrode and a second electrode, so that in an ion source layer, aluminum (Al) ions and ions of a metal element contained in the ion source layer are moved towards the first electrode side, and in a resistance variable layer, a conduction path is formed by a reduction reaction of an aluminum oxide or the ions of the metal element, thus realizing a low-resistance state; and applying a reverse polarity voltage between the first electrode and the second electrode, so that in the ion source layer, the aluminum (Al) ions and the ions of the metal element contained in the ion source layer are moved towards the second electrode side, and in the resistance variable layer, the aluminum (Al) ions form an aluminum oxide through an oxidation reaction, thus realizing a high-resistance state, or the reduced metal element is ionized to move towards the ion source layer, thus destroying the conduction path and realizing a high-resistance state.

In the memory component, the memory device, or the method of operating the memory device according to the embodiment of the present invention, when a voltage or current pulse of a "positive direction" (for example, the first electrode side is the negative potential, and the second electrode side is the positive potential) is applied to the memory component in the initial state (high-resistance state), in the ion source layer, aluminum (Al) ions and ions of a metal element contained in the ion source layer are moved towards the first electrode side. In this case, in the first electrode, a conduction path is formed by a reduction reaction of an aluminum oxide or the ions of the metal element, whereby a low-resistance state (a written state) is realized. When a voltage pulse of a "negative direction" (for example, the first electrode side is the positive potential, and the second electrode side is the negative potential) is applied to the memory component in the low-resistance state, in the ion source layer, the aluminum (Al) ions and the ions of the metal element contained in the ion source layer are moved towards the second electrode side. In this case, in the resistance variable layer, the aluminum (Al) ions form an aluminum oxide through an oxidation reaction, or the reduced metal element is ionized by the oxidation reaction and dissolved into the ion source layer, whereby the conduction path is destroyed and the resistance of the resistance variable layer increases (the initial state or an erased state is realized).

Although whether the write operation and the erase operation will be associated to either the low-resistance state or the high-resistance state depends on definitions; in this specification, the low-resistance state is defined as the written state, and the high-resistance state is defined as the erased state.

In this specification, since the resistance variable layer contains the aluminum oxide and at least one of the transition metal oxide and the transition metal oxynitride having a lower resistance than the aluminum oxide, even when the voltage or current pulse of the positive direction is applied to the memory component, it is difficult for a voltage bias to be applied to the transition metal oxide or the transition metal oxynitride. Therefore, even when the memory component is in the written state (low-resistance state), the transition metal oxide or the transition metal oxynitride is not reduced but forms an oxide film or an oxynitride film on the first electrode. Therefore, it is possible to prevent an unnecessary oxidation reaction between the first electrode and the chalcogen element contained in the ion source layer from occurring in response to repeated write and erase operations.

According to the memory component or the memory device of the embodiment of the present invention, since the resistance variable layer contains the aluminum oxide and at least one of a transition metal oxide and a transition metal oxynitride having a lower resistance than the aluminum oxide, it is possible to improve the repetition durability thereof.

According to the method of operating the memory device of the embodiment of the present invention, when a voltage is applied between a first electrode and a second electrode, in an ion source layer, aluminum (Al) ions and ions of a metal element contained in the ion source layer are moved towards the first electrode side, and in a resistance variable layer, a conduction path is formed by a reduction reaction of an aluminum oxide or the ions of the metal element, thus realizing a low-resistance state. Moreover, when a reverse polarity voltage is applied between the first electrode and the second electrode, in the ion source layer, the aluminum (Al) ions and the ions of the metal element contained in the ion source layer are moved towards the second electrode side, and in the resistance variable layer, the aluminum (Al) ions form an aluminum oxide through an oxidation reaction, thus realizing a high-resistance state, or the reduced metal element is ionized to move towards the ion source layer, thus destroying the conduction path and realizing a high-resistance state. Therefore, it is possible to improve the repetition durability of the memory device.

BRIEF DESCRIPTION OF THE DRAWINGS

FIGS. 22A to 22C are TEM-EDX images of a memory component of Example 2.

FIGS. 37A and 37B are diagrams showing the results of Examples 8-3 and 8-4.

FIGS. 52A to 52C are diagrams showing the results of Example 19.

DESCRIPTION OF THE PREFERRED EMBODIMENTS

Hereinafter, preferred embodiments of the present invention will be described in detail with reference to the drawings. The description will be given in the following order.

1. First Embodiment (Memory component where a first layer made of a transition metal oxide and a second layer containing an aluminum oxide as its main component are laminated in that order as a resistance variable layer, and an ion source layer includes an intermediate layer and an ion supply layer)

2. Modification 1 (Memory component where a resistance variable layer contains an aluminum oxide and a transition metal oxide in the mixed state, and an ion source layer includes an intermediate layer and an ion supply layer)

3. Modification 2 (Memory component where a first layer made of a transition metal oxide and a second layer containing an aluminum oxide as its main component are laminated in that order as a resistance variable layer, and an ion source layer is made up of a single layer)

4. Modification 3 (Memory component where a resistance variable layer contains an aluminum oxide and a transition metal oxide in the mixed state, and an ion source layer is made up of a single layer)

5. Second Embodiment (Memory component where a first layer made of a transition metal oxynitride and a second layer containing an aluminum oxide as its main component are laminated in that order as a resistance variable layer, and an ion source layer includes an intermediate layer and an ion supply layer)

6. Modification 4 (Memory component where a first layer includes a transition metal oxide layer and a transition metal oxynitride layer)

7. Third Embodiment (Memory component where a transition metal is added in an intermediate layer)

8. Fourth Embodiment (Memory component where oxygen is added in at least one of an intermediate layer and an ion supply layer)

9. Memory device

10. Examples (First Embodiment)

Figure 1:
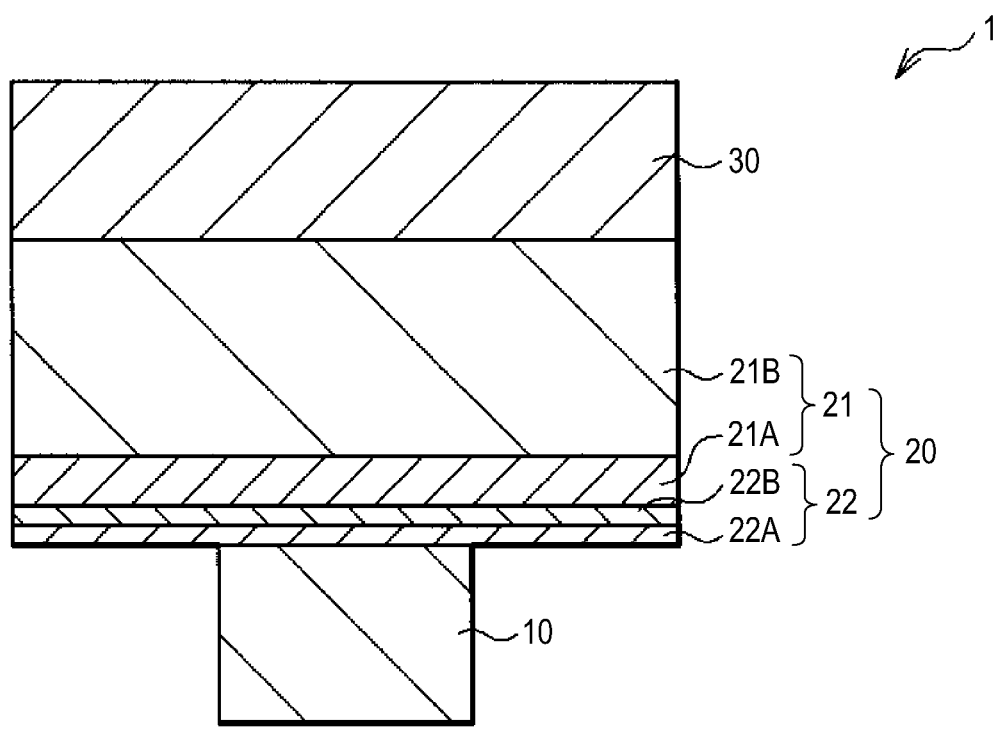
FIG. 1 is a cross-sectional view showing a configuration of a memory component according to a first embodiment of the present invention.

FIG. 1 is a cross-sectional view showing a configuration of a memory component 1 according to a first embodiment of the present invention. The memory component 1 includes a lower electrode 10 (first electrode), a memory layer 20, and an upper electrode 30 (second electrode) which are provided in that order. The memory layer 20 includes an ion source layer 21 and a resistance variable layer 22 which are provided in that order from the side of the upper electrode 30.

The lower electrode 10 is provided on a silicon substrate 41 on which a CMOS (Complementary Metal Oxide Semiconductor) circuit, for example, is formed as described later (see FIG. 13), and serves as a connection portion to the CMOS circuit portion. The lower electrode 10 is formed of a wiring material used in the semiconductor process, such as, for example, tungsten (W), tungsten nitride (WN), copper (Cu), aluminum (Al), Molybdenum (Mo), tantalum (Ta), and silicide. When the lower electrode 10 is formed of a material such as Cu which is likely to cause ionic conduction under an electric field, the surface of the lower electrode 10 made of Cu or the like may be coated with a material such as W, WN, TiN, or TaN which rarely cause ionic conduction or thermal diffusion.

The lower electrode 10 is preferably formed of at least one transition metal selected from the group consisting of titanium (Ti), zirconium (Zr), hafnium (Hf), vanadium (V), niobium (Nb), Ta, chromium (Cr), Mo, and W or a nitride thereof. This is because a transition metal oxide (or a first oxide layer 22A made of a transition metal oxide) in a resistance variable layer 22 described later can be easily formed by oxidizing the surface of the lower electrode 10.

The ion source layer 21 has the role of an ion supply source and mainly has an amorphous structure. The ion source layer 21 contains at least one chalcogen element selected from the group consisting of tellurium (Te), sulfur (S), and selenium (Se) as an ion conducting material which becomes anions. Moreover, the ion source layer 21 contains Al as an element that forms an oxide at the time of erasure.

In addition, the ion source layer 21 contains at least one metal element. As the metal element contained in the ion source layer 21, at least one metal element selected from the group consisting of Cu, zinc (Zn), silver (Ag), nickel (Ni), cobalt (Co), manganese (Mn), iron (Fe), Ti, Zr, Hf, V, Nb, Ta, Cr, Mo, and W is preferably used, for example. The element Al and some of these metal elements have the function of an ion conducting material which becomes cations.

Since the ion source layer 21 preferably contains Zr as the metal element in order to make the ion source layer 21 amorphous. This is because the characteristics of retaining the resistance value of a low-resistance state (a written state) or a high-resistance state (an initial state or an erased state) can be improved. In this specification, the low-resistance state is defined as the written state, and the high-resistance state is defined as the erased state. Moreover, when combined with Zr, the element Cu easily forms an amorphous structure, maintains a uniform micro-structure of the ion source layer 21, and has the function of a metal element which becomes cations.

Other elements may be added in the ion source layer 21 as necessary. Examples of additive elements include magnesium (Mg), germanium (Ge), silicon (Si), and the like. The element Mg easily becomes cations and is used to form an oxide film with a removal bias to easily realize a high-resistance state. The element Ge forms an oxide at the time of erasure similarly to Al, thus stabilizing the high-resistance state (erased state) and also contributing to an increase of the allowable number of repeated operations. The element Si is an additive element which can both suppress a film detachment during a high-temperature heat treatment of the memory layer 20 and improve the data retention characteristics, and which may be added in the ion source layer 21 together with Zr.

A specific example of such a material of the ion source layer 21 includes materials having the compositions ZrTeAl, ZrTeAlGe, CuZrTeAl, CuZrTeAlGe, CuHfTeAl, CuTiTeAl, AgZrTeAl, NiZrTeAl, CoZrTeAl, MnZrTeAl, and FeZrTeAl.

The content of Al in the ion source layer 21 is 30 to 50 at %, for example. The content of Zr in the ion source layer 21 is preferably 7.5 to 26 at %, and the composition ratio (=[Zr (at %)]/[total number of atoms of chalcogen element (at %)]) of Zr to the total number of atoms of the chalcogen element contained in the ion source layer 21 is preferably in the range of 0.2 to 0.74. The content of Ge in the ion source layer 21 is preferably 15 at % or smaller. The content of Si in the ion source layer 21 is preferably in the range of about 10 to 45 at %. With this configuration, the respective constituent elements can best perform their roles. Details thereof will be described later.

The resistance variable layer 22 is provided between the ion source layer 21 and the lower electrode 10 and has the function of a barrier to electrical conduction. The resistance variable layer 22 contains an aluminum oxide (AlOx) and a transition metal oxide having a lower resistance than the aluminum oxide. Specifically, the resistance variable layer 22 has a configuration in which a first layer 22A made of a transition metal oxide and a second layer 22B having a high resistance and containing an aluminum oxide as its main component are laminated in that order from the side of the lower electrode 10. In this way, the repetition durability of the memory component 1 can be increased.

The transition metal oxide (or the first layer 22A) contained in the resistance variable layer 22 is preferably an oxide having conductive properties and one which does not have high insulation properties. Specifically, the transition metal oxide is preferably an oxide of at least one transition metal selected from the group consisting of Ti, Zr, Hf, V, Nb, Ta, Cr, Mo, and W.

The aluminum oxide (or the second layer 22B) contained in the resistance variable layer 22 is formed by an oxidation reaction on the lower electrode 10 side caused by a movement or diffusion of ions of Al contained in the ion source layer 21 or application of a voltage to the lower electrode 10 and the upper electrode 30. Although the aluminum oxide (or the second layer 22B) contained in the resistance variable layer 22 is already formed at the time of manufacturing the memory component 1, the aluminum oxide tends to grow larger (that is, the thickness becomes larger) in the high-resistance state (erased state) described later.

The thickness of the first layer 22A is preferably 1 nm or more. This is because favorable resistance separation characteristics can be obtained with that thickness. Moreover, the first layer 22A preferably has a thickness such that the resistance of the first layer 22A becomes lower than the resistance value of the second layer 22B. This is because, if the thickness of the first layer 22A is too large, the first layer 22A has a higher resistance than the second layer 22B, thus deteriorating the operation characteristics. The density of the transition metal oxide constituting the first layer 22A is preferably 4 g/cm$^3$ or smaller in the case of a titanium oxide (TiOx), for example.

In addition, the ion source layer 21 preferably has a two-layered structure in which an intermediate layer 21A and an ion supply layer 21B are laminated in that order from the side of the lower electrode 10. The intermediate layer 21A contains at least one chalcogen element selected from the group consisting of Te, S, and Se together with Al. The ion supply layer 21B has the same configuration as the ion source layer 21 described above. That is, the ion supply layer 21B contains at least one metal element selected from the group consisting of Cu, Zn, Ag, Ni, Co, Mn, Fe, Ti, Zr, Hf, V, Nb, Ta, Cr, Mo, and W together with Al and a chalcogen element. With this configuration, it is possible to improve the data retention characteristics while maintaining favorable repetition durability and allow a low-current nonvolatile memory operation. The ion supply layer 21B preferably contains the above-mentioned metal element and has a configuration in which an unnecessary element diffusion and a layer mixing are suppressed.

In particular, the ion supply layer 21B preferably contains at least one element selected from the group consisting of Cu, Ti, Zr, and Hf together with Al and a chalcogen element. The use of these elements enable stabilizing an amorphous structure to maintain a matrix structure, and as a result, the reliability of a write and erase operation is improved. Among them, when combined with Zr, the element Cu easily forms an amorphous structure and has a function of maintaining a uniform micro-structure of the ion supply layer 21B.

In addition, the ion supply layer 21B may contain other additive elements such as Ge, Si, or Mg as necessary.

The ratio (Al concentration) of the content of Al to the content of a chalcogen element in the intermediate layer 21A is preferably smaller than the ratio (Al concentration) of the content of Al to the content of a chalcogen element in the ion supply layer 21B. Since it is considered that the Al in the intermediate layer 21A is generated by a diffusion which is caused by a concentration gradient with respect to the ion supply layer 21B, it is considered that the Al content is smaller than a stoichiometric composition of $Al_2Te_3$, for example. Therefore, it is considered that most of the Al in the intermediate layer 21A is present in the ionic state. The applied potential is effectively used for driving the ions, whereby the above-described data retention characteristics can be improved and a low-current nonvolatile memory operation is made possible.

The upper electrode 30 is formed of a wiring material used in the well-known semiconductor process similarly to the lower electrode 10.

In the memory component 1 of the present embodiment, when a voltage or current pulse is applied from a power supply (a pulse application means) (not shown) through the lower electrode 10 and the upper electrode 30, the electrical characteristics (for example, a resistance value) of the memory layer 20 are changed by a redox reaction of the aluminum oxide or the ions of the metal element contained in the ion source layer 21 (specifically, the ion supply layer 21B). In this way, information is stored (written, erased, and read). The operation of the memory component 1 will be described in detail below.

First, a positive voltage is applied to the memory component 1 so that the upper electrode 30 is on the positive potential side, and the lower electrode 10 is on the negative potential side, for example. In this way, the Al ions are moved towards the lower electrode 10 side in the ion source layer 21, and a reduction reaction of the second layer 22B containing an aluminum oxide as its main component occurs on the transition metal oxide layer 22A, whereby a low-resistance state (written state) is realized.

Moreover, the metal element contained in the ion source layer 21 is ionized, and the metal ions are moved and diffused into the resistance variable layer 22 and reduced on the lower electrode 10 side. As a result, a conduction path which is reduced to a metallic state or a lower resistance state than the second layer 22B is formed at the interface between the lower electrode 10 and the memory layer 20. Alternatively, the ionized metal element remains in the resistance variable layer 22 and forms an impurity level, and a conduction path is formed in the resistance variable layer 22. Therefore, the resistance value of the memory layer 20 decreases and changes from the high-resistance state of the initial state to the low-resistance state.

After that, even when the positive voltage is removed so that no voltage is applied to the memory component 1, the low-resistance state is maintained. In this way, information is written. When the memory component 1 is applied to a once-writable memory device which is called a PROM (Programmable Read Only Memory) is used, recording of information is completed only by the above-described recording process.

On the other hand, when the memory component 1 is applied to an erasable memory device, namely, a RAM (Random Access Memory), an EEPROM (Electronically Erasable and Programmable Read Only Memory), or the like, an erasure process is necessary. In the erasure process, a negative voltage is applied to the memory component 1 so that the upper electrode 30 is on the negative potential side, and the lower electrode 10 is on the positive potential side, for example. In this way, the Al ions are moved towards the upper electrode 30 side in the ion source layer 21, and the Al ions form the second layer 22B containing an aluminum oxide as its main component on the first layer 22A through an oxidation reaction, whereby a high-resistance state (erased state) is realized.

Moreover, the metal element in the reduced state which forms the conduction path in the memory layer 20 is ionized by an oxidation reaction and dissolved into the ion source layer 21 or combined with Te or the like, whereby the resistance state changes to a higher resistance state. In this way, the conduction path formed by the metal element disappears or decreases, and the resistance value increases. Alternatively, an additive element such as Ge present in the ion source layer 21 forms an oxide film on the lower electrode 10, whereby the resistance state changes to a high-resistance state.

After that, even when the negative voltage is removed so that no voltage is applied to the memory component 1, the high-resistance state is maintained. In this way, written information can be erased. By repeating such a process, an operation of writing information and erasing written information to/from the memory component 1 can be performed repeatedly.

For example, when a high-resistance state is associated to information of "0" and a low-resistance state is associated to information of "1," the information can be changed from "0" to "1" by an information recording process with the application of a positive voltage, and the information can be changed from "1" to "0" by an information erasure process with the application of a negative voltage.

In order to demodulate the recorded data, it is preferable that the ratio of an initial resistance value to the resistance value after the recording is large. However, if the resistance value of the high-resistance layer is too high, it is difficult to write information, that is, realize the low-resistance state, and thus a writing threshold voltage becomes too high. Therefore, the initial resistance value is adjusted to 1 GΩ or smaller. The resistance value of the high-resistance layer 22 can be controlled, for example, by the thickness thereof, the amount of oxygen contained therein, and the like.

In the above description, the write operation is defined as an operation of changing the resistance state to the low-resistance state "1", and the erase operation is defined as an operation of changing the resistance state to the high-resistance state "0". To the contrary, an operation of changing the resistance state from the high-resistance state "1" to the low-resistance state "0" may be defined as the erase operation. In this case, the write operation and the erase operation may be switched from those in the above description.

In this specification, since the resistance variable layer 22 has a configuration in which the first layer 22A made of a transition metal oxide and the second layer 22B containing an aluminum oxide as its main component are laminated in that order from the side of the lower electrode 10, even when the above-mentioned positive voltage is applied to the memory component, a voltage bias is rarely applied to the first layer 22A. Therefore, even when the memory component is in the written state (low-resistance state), the first layer 22A is not reduced but forms an oxide film on the lower electrode 10. Therefore, an unnecessary oxidation reaction between the lower electrode 10 and the chalcogen element contained in the ion source layer 21 is suppressed from occurring in response to repeated write and erase operations.

That is, when the first layer 22A is not provided on the lower electrode 10 made of a metal material such as W or Ti, but the ion source layer 21 or the intermediate layer 21A is formed in contact with the lower electrode 10, favorable operation characteristics and favorable data retention characteristics are obtained. That is, the high-resistance state and the low-resistance state are clearly realized when the number of repeated operations is 10 to 100. However, when the number of repeated operations increases further, errors occur mainly in the erase operation, and the resistance state rarely returns to the high-resistance state, whereby the element characteristics deteriorate. This is considered to be attributable to the fact that in addition to the above-described redox reaction, an oxidation reaction also occurs in which the lower electrode 10 reacts with the chalcogen element contained in the intermediate layer 21A or the ion source layer 21. In the present embodiment, since the first layer 22A made of the transition metal oxide is provided on the lower electrode 10, an unnecessary oxidation reaction in which the lower electrode 10 is chalcogenized is suppressed, the repetition reliability is improved, and the lifespan of a memory is improved.

In addition, when the resistance variable layer 22 has a two-layered structure of the first layer 22A and the second layer 22B, and the ion source layer 21 has a two-layered structure of the intermediate layer 21A and the ion supply layer 21B, the data retention characteristics are improved while maintaining favorable repetition durability. Although the reason thereof is not clear, this is considered to be attributable to the following fact.

When a low-resistance state is realized by the write operation, a reduction reaction occurs near the interface of the lower electrode 10. Specifically, the second layer 22B containing the aluminum oxide as its main component is reduced, and the Al ions are moved into the ion source layer 21 and reduced near the interface of the lower electrode 10, whereby metal-like Al is formed. When a write voltage bias is stopped so as to realize a data retention state, the Al metal is easily oxidized, and a high-resistance state is realized when the Al metal combines with oxygen. This is considered to be the data retention error of the low-resistance state. On the other hand, the chalcogen element abundant in the intermediate layer 21A reacts with Al metal very easily, and even when Al metal is generated, since the generated Al metal will sequentially react with the chalcogen element, a high-resistance state is realized. Therefore, there will be little data retention error, and the data retention performance is improved.

That is, as described above, the ratio (Al concentration) of the content of Al to the content of the chalcogen element in the intermediate layer 21A is smaller than the ratio (Al concentration) of the content of Al to the content of the chalcogen element in the ion supply layer 21B. Therefore, the Al metal generated by the reduction reaction of the Al ions at the time of the write operation becomes an aluminum oxide again when the write voltage bias is removed, and the aluminum oxide does not increase the component resistance but is dissolved into the intermediate layer 21A which is capable of dissolving Al. Therefore, there will be no increase in the resistance, and favorable data retention characteristics can be obtained.

In addition, as for the erase operation, although ionized Al is contained in the intermediate layer 21A, the Al ions can easily move in the intermediate layer 21A containing an abundant chalcogen element. Therefore, Al ions are easily supplied by the erase bias and the erasure performance is improved. As a result, it is considered that the resistance separation width between the low-resistance state and the high-resistance state is widened.

In addition to this, since the ion source layer 21 has a two-layered structure of the intermediate layer 21A and the ion supply layer 21B, the data retention characteristics at a low current and a high speed can be improved.

That is, when the memory component 1 is combined with transistors to form a nonvolatile memory cell, in order to increase the capacity of a memory cell using the high-tech semiconductor process, it is necessary to achieve miniaturization of the memory component 1 and the transistor. Since the driving current decreases as the size of the transistor is miniaturized, in order to realize a high-capacity and low-power nonvolatile memory, it is necessary to improve data retention characteristics in the state of being rewritten with a low current. Furthermore, in order to realize a high-capacity nonvolatile memory capable of performing a high-speed rewrite operation, it is necessary to have data retention characteristics of retaining the rewritten resistance state at a low current of the miniaturized transistor and at a high speed using short pulses on the nanosecond order.

However, in the related art, since the low-resistance and high-resistance recording states realized by lower rewrite energy are likely to be affected by thermal disturbance, there was a problem in that it is difficult to retain data as the current decreases and the rewrite speed increases.

When data is written with a low current of a transistor having low current driving capability, since the resistance value of the low-resistance state increases, the retention characteristics of the resistance value is the key factor of a low-current operation. In the memory component 1 of the present embodiment, as described above, the data retention performance is improved, and data retention of a higher resistance value is possible. Therefore, a low-current nonvolatile memory operation is possible.

In addition, in the present embodiment, as described above, the ion source layer 21 preferably contains Zr, Cu, Ge, and the like in addition to Al. The reason thereof will be described below.

When Zr is contained in the ion source layer 21, particularly when Zr is present together with Al and Cu, an amorphous structure is easily stabilized. Even when ions of Al and Cu are moved from the ion source layer 21, for example, at the time of the write operation, it is easy to maintain an amorphous structure and the matrix structure of the ion source layer 21 is maintained. For example, the ions of Al and Cu are moved by a write bias, whereby the composition of the ion source layer 21 is changed, and the composition ratio of these elements decreases. However, since the amorphous structure is maintained stably due to the presence of Zr even when the composition ratio changes, it is possible to suppress an unnecessary movement or diffusion of ions. Thus, the written state retention performance is improved.

With regard to the retention of the high-resistance state at the time of erasure, in a state where the conduction path in which Al or Cu is in a metallic state or a state close thereto is oxidized to form an oxide or a compound with a chalcogen element such as S, Se, and Te, when the conduction path contains Zr, and the ion source layer 21 has a stable amorphous structure, an unnecessary ion diffusion is suppressed. Therefore, it is unlikely that unnecessary ions are diffused again from the ion source layer 21 due to heat or the like in a retention state where no erasure voltage bias is applied. It is also unlikely that the oxide or chalcogenide in the high-resistance state is reduced again to realize a low-resistance state. Thus, the high-resistance state is maintained even when the data is held over an extended period or a high-temperature state higher than the room temperature.

In addition, since the ion source layer 21 contains Al, when a negative voltage is applied to the memory component 1 during the erase operation so that the upper electrode 30 is on the negative potential side and the lower electrode 10 is on the positive potential side, for example, the second layer 22B containing an aluminum oxide as its main component is formed on the first layer 22A through the oxidation reaction of the Al ions, whereby the high-resistance state (erased state) is stabilized. In addition, the element Al contributes to an increase of the allowable number of repeated operations from the perspective of self-reproduction of the second layer 22B. In addition to Al, other elements such as Ge having the same function may be contained.

Given the above, when Zr, Al, Cu, Ge, and the like are contained in the ion source layer 21, a wide-range resistance value retention performance, a high-speed write/erase operation performance are improved and the allowable number of repeated operations is increased as compared to the memory component of the related art. In addition, by adjusting an erasure voltage at the time of changing the resistance state from the low-resistance state to the high-resistance state to create an intermediate state between the high-resistance state and the low-resistance state, it is possible to retain the intermediate state stably. Therefore, it is possible to realize a multi-valued memory as well as a two-valued memory.

Meanwhile, the important characteristics related to the memory operation, including the characteristics of the write/erase operation of applying such a voltage and the resistance value retention characteristics, and the allowable number of repeated operations varies depending on the composition ratio of Zr, Cu, Al, and Ge.

For example, if the content of Zr is too large, the resistance value of the ion source layer 21 decreases too much, and it is unable to apply an effective voltage to the ion source layer 21. Thus, particularly, it is difficult to perform the erase operation, and the erasure threshold voltage increases with the composition ratio of Zr. Furthermore, if the content of Zr increases further, it is difficult to perform the write operation (that is, realize the low-resistance state). On the other hand, if the composition ratio of Zr is too small, the effect of improving the wide-range resistance value retention characteristics as described above decreases. Therefore, the composition ratio of Zr in the ion source layer 21 is preferably 7.5 at % or more, and more preferably 26 at % or smaller.

When an appropriate amount of Cu is added in the ion source layer 21, the element Cu accelerates making the ion source layer 21 amorphous. However, if the content of Cu is too large, since Cu in the metallic state is not sufficiently stable in the ion source layer 21 containing the chalcogen element, the element Cu may deteriorate the written data retention characteristics and have an adverse effect on a high-speed write operation. On the other hand, a combination of Zr and Cu has an effect of making it easy to form an amorphous structure and maintaining a uniform micro-structure of the ion source layer 21. In this way, since the material components in the ion source layer 21 are prevented from becoming nonuniform by the repeated operation, the allowable number of repeated operations increases and the data retention characteristics are also improved. When a sufficient amount of Zr is contained within the above-mentioned range, since the amorphous structure is stable, the written data retention characteristics are not affected.

Moreover, if the content of Al is too large, the Al ions can easily move, and the written state is easily realized by the reduction of the Al ions. Since Al in the metallic state has a low stability in the solid chalcogenide electrolyte, the retention performance of the written state which is the low-resistance state decreases. On the other hand, if the composition ratio of Al is too small, the effect of improving the erase operation itself and the data retention characteristics in the high-resistance state decreases, and the allowable number of repeated operation decreases. Therefore, the composition ratio of Al is preferably 30 at % or more, and more preferably 50 at % or smaller.

Although Ge may be not necessarily contained, since the written data retention characteristics deteriorate when the content of Ge is too large, the composition ratio of Ge is preferably 15 at % or smaller.

Although Si may be not necessarily contained, the effect of preventing a film detachment of the memory layer 20 is not obtained if the composition ratio thereof is too small, and favorable memory operation characteristics is not obtained if the composition ratio thereof is too larger. Therefore, the composition ratio of Si in the ion source layer 21 is preferably in the range of about 10 to 45 at %.

Hereinafter, a method of manufacturing the memory component 1 of the present embodiment will be described.

First, the plug of the lower electrode 10, for example, made of a titanium nitride (TiN) is formed on a substrate on which a CMOS circuit of a select transistor or the like is formed.

After that, a transition metal material film made of at least one transition metal selected from the group consisting of Ti, Zr, Hf, V, Nb, Ta, Cr, Mo, and W, or a nitride thereof is formed on the upper surface of the lower electrode 10, and the transition metal material film and at least the transition metal material film on the surface of the lower electrode 10 are oxidized, whereby the first layer 22A is formed.

Specifically, a Ti film is formed to a thickness of 1.0 nm on the upper surface of the lower electrode 10, for example, made of TiN as a transition metal material film by a sputtering method, for example. Subsequently, by oxidizing the Ti film with oxygen plasma, the first layer 22A made of TiOx is formed. At that time, since the thickness of Ti film is very small, there is a possibility that oxidation of the surface of the lower electrode 10 also progresses following the oxidation of the Ti film.

Figure 2:
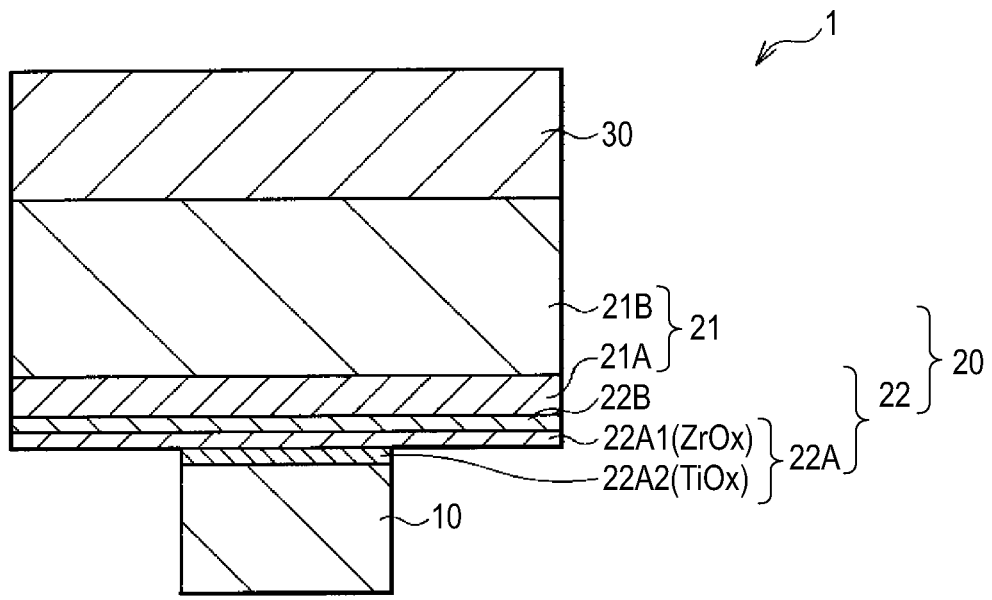
FIG. 2 is a cross-sectional view showing a modification of a first layer shown in FIG. 1.

Alternatively, a zirconium nitride (ZrN) film may be formed on the upper surface of the lower electrode 10, for example, made of TiN as the transition metal material film, and the ZrN film may be oxidized. At that time, sine the thickness of the ZrN film is very small, the Zr film is oxidized to produce a zirconium oxide (ZrOx), and the surface of the lower electrode 10 is also oxidized to form TiOx. Therefore, as shown in FIG. 2, for example, the first layer 22A made up of a ZrOx layer 22A1 and a TiOx layer 22A2 is formed. In this case, it is important that the ZrN film is sufficiently oxidized, and as a consequence, the TiOx is formed.

After that, the intermediate layer 21A made of Te is formed to a thickness of 4 nm by a sputtering method, for example. Subsequently, the ion supply layer 21B made of CuZrTeAlGe (Cu 11 at %-Zr 11%-Te 30%-Al 40%-Ge 8%) is formed to a thickness of 60 nm. In this way, the ion source layer 21 having a two-layered structure of the intermediate layer 21A and the ion supply layer 21B is formed. At that time, in the memory layer 20, Al contained in the ion supply layer 21B is diffused into the intermediate layer 21A to combine with surplus oxygen in the first layer 22A made of TiOx or oxygen entering into the other films, whereby the second layer 22B made of AlOx is formed on the first layer 22A.

The second layer 22B made of AlOx may be formed by forming an Al film serving as a source after forming the first layer 22A and oxidizing the Al film. However, as described above, by including the Al element serving as a source of the second layer 22B in the ion supply layer 21B, it is possible to easily form the memory layer 20 including the second layer 22B without introducing a deposition process of the second layer 22B. The thickness of the second layer 22B can be controlled by controlling the plasma oxidation conditions ($O_2$ atmosphere pressure and input power) of TiOx that constitutes the first layer 22A.

After the ion source layer 21 and the resistance variable layer 22 are formed, the upper electrode 30, for example, made of W is formed on the ion source layer 21. By doing so, a laminated film of the lower electrode 10, the memory layer 20, and the upper electrode 30 is formed.

After the laminated film is formed, the resistance variable layer 22, the ion source layer 21, and the upper electrode 30 in the laminated film are patterned by plasma etching or the like. Besides the plasma etching, the patterning may be performed using other etching methods such as ion milling or RIE (Reactive Ion Etching). Moreover, etching is performed on the surface of the upper electrode 30 so as to expose a contact portion of the upper electrode 30 for connecting to an external circuit that applies an intermediate potential (Vdd/2).

After the laminated film is patterned, a wiring layer (not shown), for example, made of Al is formed to a thickness of 200 nm, and the wiring layer is connected to the contact portion of the upper electrode 30. After that, the laminated film is subjected to heat treatment at a temperature of 300° C. for 2 hours in a vacuum heat treatment furnace, for example. In this way, the memory component 1 shown in FIG. 1 is manufactured.

In the manufacturing method described above, after the Ti film is formed in the step of forming the first layer 22A, the Ti film is oxidized with oxygen plasma, whereby the first layer 22A made of TiOx is formed. However, the first layer 22A may be formed by removing a natural oxide film formed on the surface of the lower electrode 10, for example, made of TiN or a film originating from the cleaning step during the forming of the lower electrode 10 by reverse sputtering, milling, or the like and then subjecting the surface of the lower electrode 10 to plasma oxidation.

As described above, in the present embodiment, the resistance variable layer 21 has a configuration in which the first layer 22A made of the transition metal oxide and the second layer 22B containing the aluminum oxide as its main component are laminated in that order from the side of the lower electrode 10. Therefore, it is possible to prevent an unnecessary oxidation reaction between the lower electrode 10 and the chalcogen element contained in the ion source layer 21 from occurring in response to repeated write and erase operations, increase the repetition durability, and improve the lifespan of a memory. Accordingly, it is possible to decrease a variation in the resistance value of the erased state and to obtain favorable characteristics having a sufficiently large resistance separation width in a multi-bit memory array.

Moreover, since the ion source layer 21 has the two-layered structure of the intermediate layer 21A and the ion supply layer 21B, it is possible to improve the data retention characteristics while maintaining favorable repetition durability and allow a low-current nonvolatile memory operation. Therefore, even when the current driving capability of the transistor is decreased with miniaturization, it is possible to retain information and realize a high-density and small memory device.

Furthermore, since the ion source layer 21 contains Zr, Al, Cu, Ge, and the like, the data retention characteristics are excellent. In addition, any of the lower electrode 10, the resistance variable layer 22, the ion source layer 21, and the upper electrode 30 can be made of materials which allow for sputtering, and the manufacturing process is simplified. That is, sputtering may be sequentially performed using a target made of a composition suitable for the materials of the respective layers. Moreover, deposition may be performed continuously by changing the target in the same sputtering apparatus.

(Modification 1)

Figure 3:
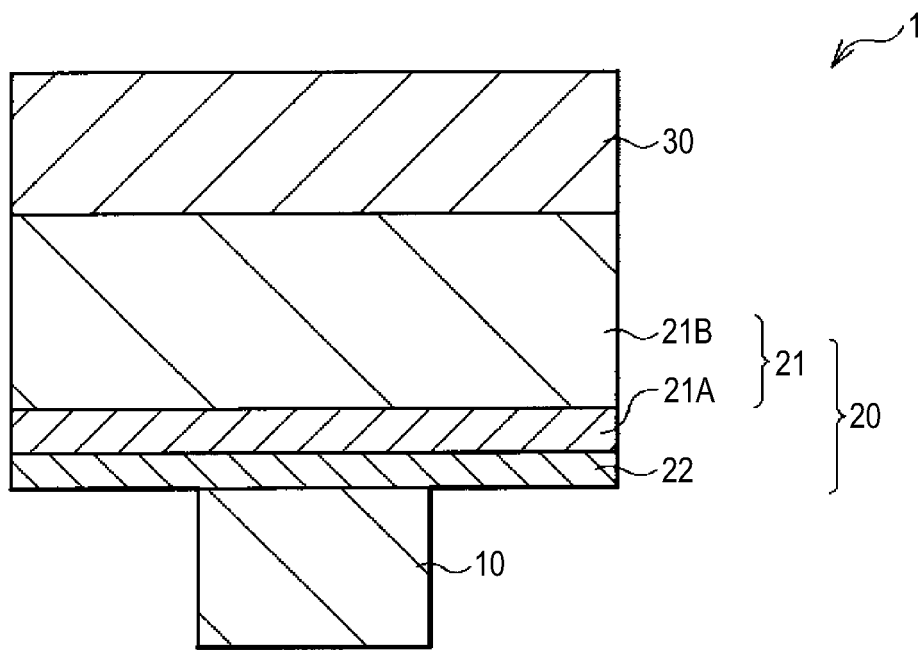
FIG. 3 is a cross-sectional view showing a configuration of a memory component according to Modification 1.

In the embodiment described above, a case where the resistance variable layer 22 has a configuration in which the first layer 22A made of the transition metal oxide and the second layer 22B containing the aluminum oxide as its main component are laminated in that order from the side of the lower electrode 10 has been described. However, the resistance variable layer 22 may have a single-layered structure in which the aluminum oxide and the transition metal oxide are contained in a mixed state as shown in FIG. 3.

In this case, when a positive voltage is applied to the memory component 1 so that the upper electrode 30 is on the positive potential side and the lower electrode 10 is on the negative potential side, for example, in the ion source layer 21, the Al ions and the ions of the metal element contained in the ion source layer 21 are moved towards the lower electrode 10 side. In this case, on the lower electrode 10, a conduction path is formed by the reduction reaction of the aluminum oxide or the ions of the metal element, whereby a low-resistance state (written state) is realized. When a negative voltage is applied to the memory component 1 in the low-resistance state so that the upper electrode 30 is on the negative potential side and the lower electrode 10 is on the positive potential side, for example, in the ion source layer 21, the Al ions and the ions of the metal element contained in the ion source layer 21 are moved towards the upper electrode 30 side. In this case, on the lower electrode 10, the Al ions form an aluminum oxide through an oxidation reaction, or the metal element in the reduced state is ionized by an oxidation reaction to be dissolved into the ion source layer 21, whereby the conduction path is destroyed and the high-resistance state (erased state) is realized.

In this example, since the resistance variable layer 22 contains the aluminum oxide and the transition metal oxide having a lower resistance than the aluminum oxide in the mixed state, even when the above-mentioned positive voltage is applied to the memory component, it is difficult for the voltage bias to be applied to the transition metal oxide. Therefore, even when the memory component is in the written state (low-resistance state), the transition metal oxide is not reduced but forms an oxide film on the lower electrode 10. Accordingly, it is possible to prevent an unnecessary oxidation reaction between the lower electrode 10 and the chalcogen element contained in the ion source layer 21 from occurring in response to repeated write and erase operations.

(Modification 2)

Figure 4:
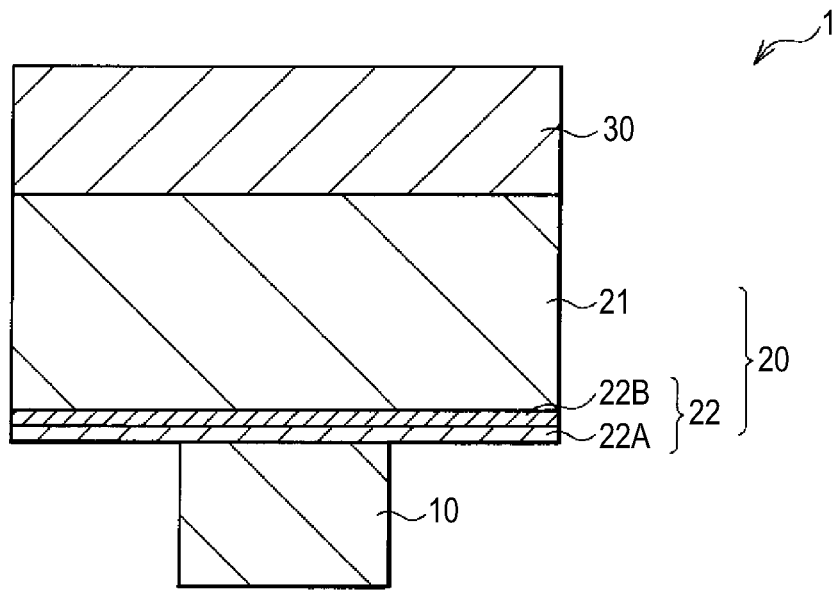
FIG. 4 is a cross-sectional view showing a configuration of a memory component according to Modification 2.

In the embodiment described above, a case where the ion source layer 21 has the two-layered structure of the intermediate layer 21A and the ion supply layer 21B has been described. However, the ion source layer 21 does not necessarily have the intermediate layer 21A but may have a single-layered structure of only the ion supply layer 21B as shown in FIG. 4.

(Modification 3)

Figure 5:
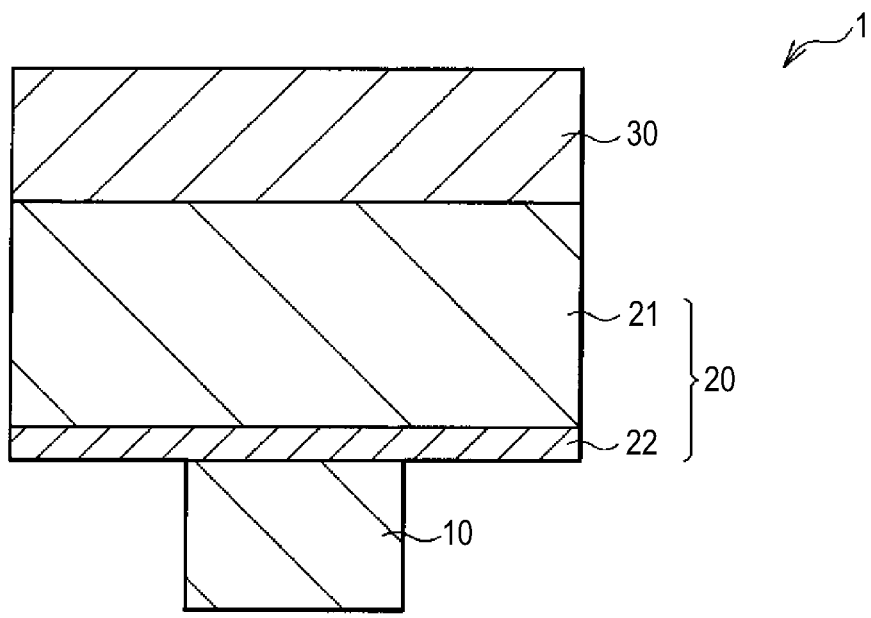
FIG. 5 is a cross-sectional view showing a configuration of a memory component according to Modification 3.

In addition, as shown in FIG. 5, the resistance variable layer 22 may be a single layer in which the aluminum oxide and the transition metal oxide are contained in the mixed state, and the ion source layer 21 may be a single layer of only the ion supply layer 21B.

(Second Embodiment)

Figure 6:
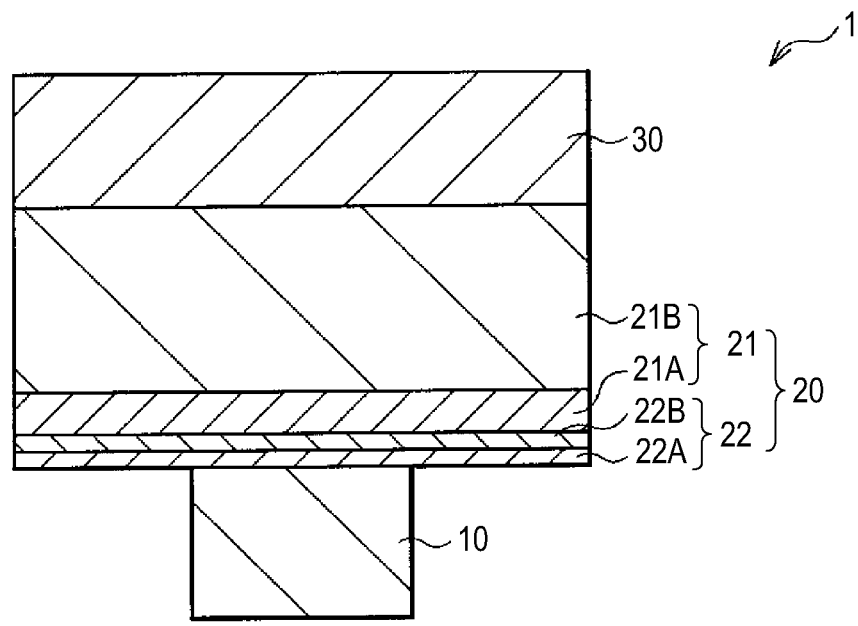
FIG. 6 is a cross-sectional view showing a configuration of a memory component according to a second embodiment of the present invention.

FIG. 6 shows the cross-sectional configuration of the memory component 1 according to a second embodiment of the present invention. The memory component 1 has the same configuration, operation, and effect as the first embodiment, except that the first layer 22A of the resistance variable layer 22 is made of a transition metal oxynitride, and the memory component 1 can be manufactured similarly to the first embodiment. Therefore, corresponding constituent elements will be denoted by the same reference numerals.

The transition metal oxide constituting the first layer 22A is preferably an oxynitride having conductive properties and one which does not have high insulation properties. Specifically, the transition metal oxide is preferably an oxide of at least one transition metal selected from the group consisting of Ti, Zr, Hf, V, Nb, Ta, Cr, Mo, and W.

Since the first layer 22A made of the transition metal oxynitride contains nitrogen (N) and does not contain surplus oxygen (O), the resistance thereof is low. Moreover, as described in the first embodiment, the second layer 22B made of the aluminum oxide is formed when Al contained in the ion supply layer 21B is diffused into the intermediate layer 21A to combine with surplus oxygen in the first layer 22A or oxygen entering into the other recording films. Therefore, since no surplus oxygen is contained in the first layer 22A, the generation of the aluminum oxide is suppressed, and the thickness of the second layer 22B decreases. Due to these facts, the partial pressure applied to the first layer 22A and the second layer 22B decreases, and the voltage applied to the ion supply layer 21B and the intermediate layer 21A increases, whereby ions can easily move and diffuse. Therefore, it is possible to decrease the threshold voltage, and the memory component 1 can be suitably used for a low-current operation. The operation current can be controlled by the amount of nitrogen contained in the first layer 22A.

Modifications 1 to 3 are also applicable to the second embodiment. That is, as shown in FIG. 3, the resistance variable layer 22 may have a single-layered structure in which the aluminum oxide and the transition metal oxynitride are contained in the mixed state. Moreover, the ion source layer 21 does not necessarily have the intermediate layer 21A but may have a single-layered structure of only the ion supply layer 21B as shown in FIG. 4. Furthermore, as shown in FIG. 5, the resistance variable layer 22 may be a single layer in which the aluminum oxide and the transition metal oxynitride are contained in the mixed state, and the ion source layer 21 may be a single layer of only the ion supply layer 21B.

(Modification 4)

Figure 7:
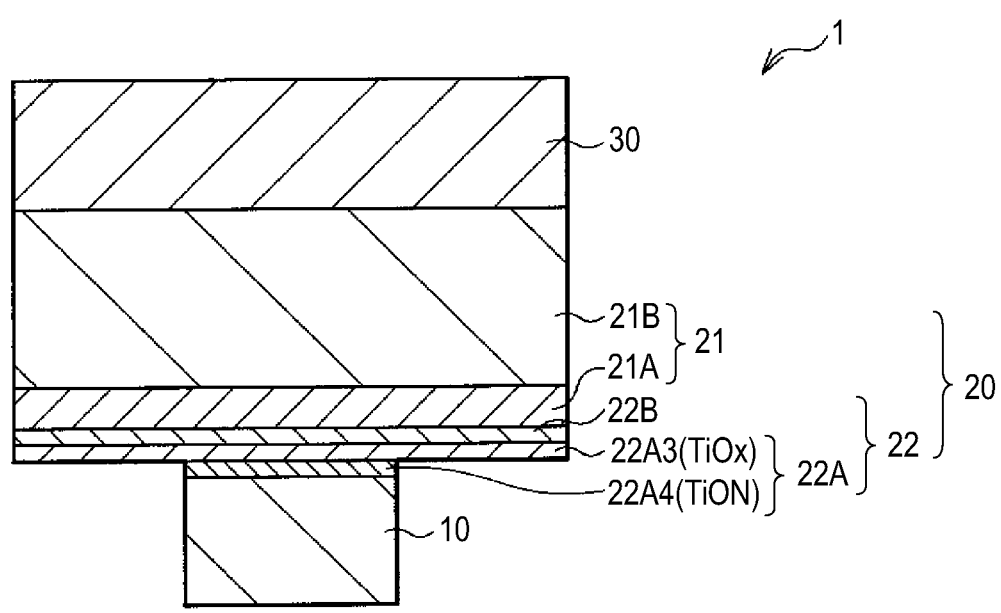
FIG. 7 is a cross-sectional view showing a configuration of a memory component according to Modification 4.

The first embodiment has been described for the case where the first layer 22A is made of the transition metal oxide, and the second embodiment has been described for the case where the first layer 22A is made of the transition metal oxynitride. However, as shown in FIG. 7, the first layer 22A may contain both a transition metal oxide layer 22A3 and a transition metal oxynitride layer 22A4.

That is, for example, similarly to the first embodiment, when the Ti film is formed on the upper surface of the lower electrode 10, for example, made of TiN as the transition metal material film, and the Ti film is oxidized with oxygen plasma, the transition metal oxide layer 22A3 made of TiOx is formed through the oxidation of the Ti film and/or the surface of the lower electrode 10. Since oxidation of TiN is not completely finished, there is a possibility that the transition metal oxynitride layer 22A4 made of a titanium oxynitride (TiON) is formed under the transition metal oxide layer 22A3. The same applies to a case where the surface of the lower electrode 10 made of TiN is directly subjected to plasma oxidation.

Figure 8:
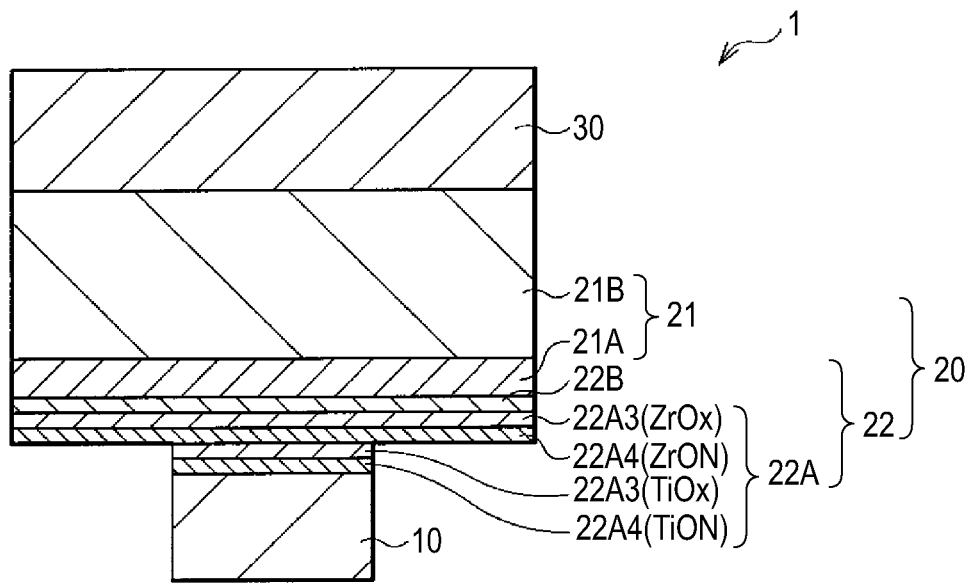
FIG. 8 is a cross-sectional view showing a modification of a first layer shown in FIG. 7.

Moreover, when a ZrN film is formed on the upper surface of the lower electrode 10, for example, made of TiN as the transition metal material film and the ZrN film is oxidized, there is possibility that as shown in FIG. 8, a transition metal oxide layer 22A3 made of ZrOx formed by the oxidation of the ZrN film, a transition metal oxynitride layer 22A4 made of an oxynitride (ZrON) of zirconium produced due to uncompleted oxidation of ZrN, a transition metal oxynitride layer 22A3 made of TiOx formed by the oxidation of the surface of the lower electrode 10, and a transition metal oxynitride layer 22A4 made of TiON produced due to uncompleted oxidation of TiN are formed in that order. Since the thickness of the ZrN film is very small, there is a possibility that the transition metal oxynitride layer 22A4 made of ZrON is not formed.

Modifications 1 to 3 are also applicable to Modification 4. That is, as shown in FIG. 3, the resistance variable layer 22 may have a single-layered structure in which the aluminum oxide, the transition metal oxide, and the transition metal oxynitride are contained in the mixed state. Moreover, the ion source layer 21 does not necessarily have the intermediate layer 21A but may have a single-layered structure of only the ion supply layer 21B as shown in FIG. 4. Furthermore, as shown in FIG. 5, the resistance variable layer 22 may be a single layer in which the aluminum oxide, the transition metal oxide, and the transition metal oxynitride are contained in the mixed state, and the ion source layer 21 may be a single layer of only the ion supply layer 21B.

(Third Embodiment)

Figure 9:
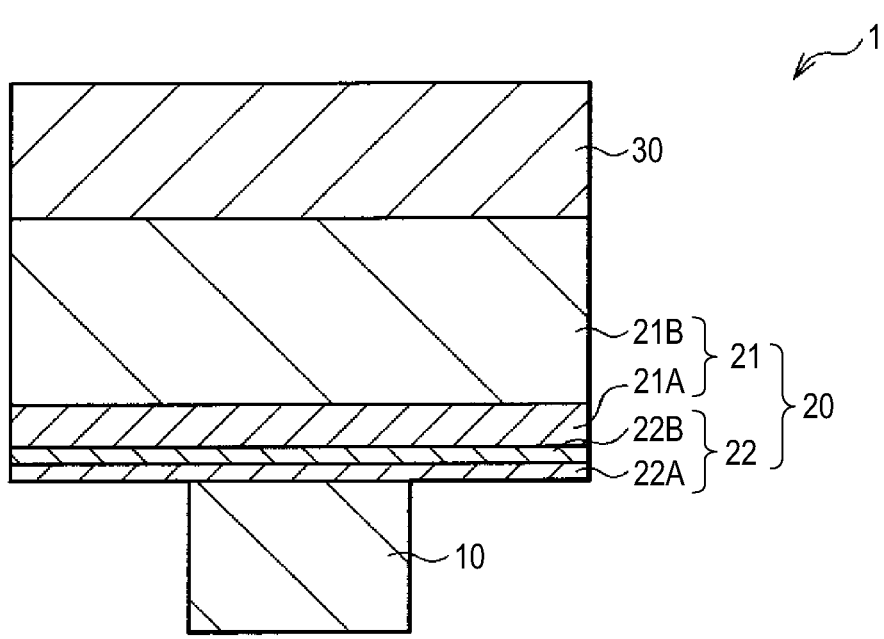
FIG. 9 is a cross-sectional view showing a configuration of a memory component according to a third embodiment of the present invention.

FIG. 9 shows the cross-sectional configuration of the memory component 1 according to a third embodiment of the present invention. The memory component 1 has the same configuration, operation, and effect as the first or second embodiment, except that a transition metal such as Zr is added in the intermediate layer 21A of the ion source layer 21, and the memory component 1 can be manufactured similarly to the first or second embodiment. Therefore, corresponding constituent elements will be denoted by the same reference numerals.

Since the intermediate layer 21A contains Zr, for example, as an additive element, the intermediate layer 21A has a higher resistance than the ion supply layer 21B. Therefore, a voltage can be easily applied to the intermediate layer 21A, and the memory component 1 can easily operate at a low current. Moreover, when a voltage is applied to the memory component 1, ions can move more effectively, and reliable write and erase operations are possible. Therefore, operation errors are reduced, and a resistance variation is improved.

Figure 10:
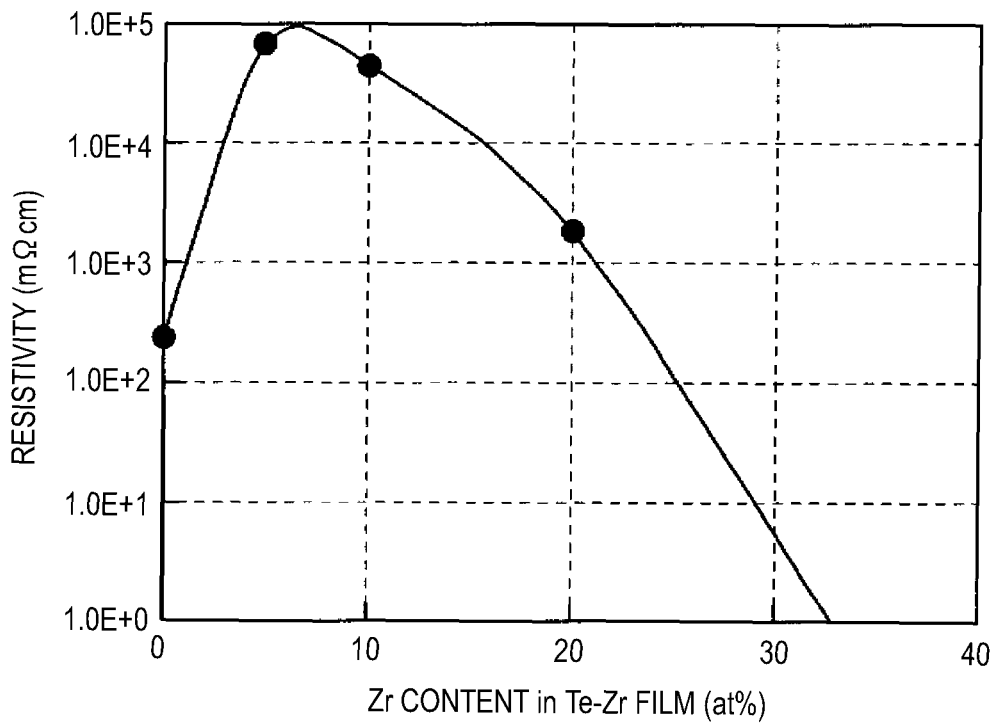
FIG. 10 is a diagram showing the dependence of the volume resistivity of a Te—Zr film on the additive amount of Zr.

FIG. 10 shows the calculation result of a volume resistivity obtained by measuring a sheet resistance of a film in which Zr is doped to a single substance of Te. As can be understood from FIG. 10, the resistivity of the Te—Zr film increases as the Zr content increases from 0% (pure Te), reaches the maximum value at the content of about 7%, and decreases at the higher content. From this, it can be understood that the resistivity of the intermediate layer 21A can be increased by adding several % of Zr in the intermediate layer 21A.

In addition to Zr, other transition metals such as Cu, Cr, Mn, Ti, or Hf have the effect of increasing the resistance of the intermediate layer 21A similarly to Zr. That is, the intermediate layer 21A preferably contains Al and a chalcogen element and also contain at least one transition metal selected from the group consisting of Zr, Cu, Cr, Mn, Ti, and Hf.

As described above, in the present embodiment, since the intermediate layer 21A contains at least one transition metal selected from the group consisting of Zr, Cu, Cr, Mn, Ti, and Hf so that the resistance of the intermediate layer 21A is higher than the ion supply layer 21B, it is possible to accelerate an ion movement at the time of the write and erase operations, stabilize the memory operation, and improve the resistance distribution of the written and erased states.

Modification 1, the second embodiment, and Modification 4 are also applicable to the present embodiment. That is, the resistance variable layer 22 may have a single-layered structure in which the aluminum oxide, the transition metal oxide, and the transition metal oxynitride are contained in the mixed state.

(Fourth Embodiment)

Figure 11:
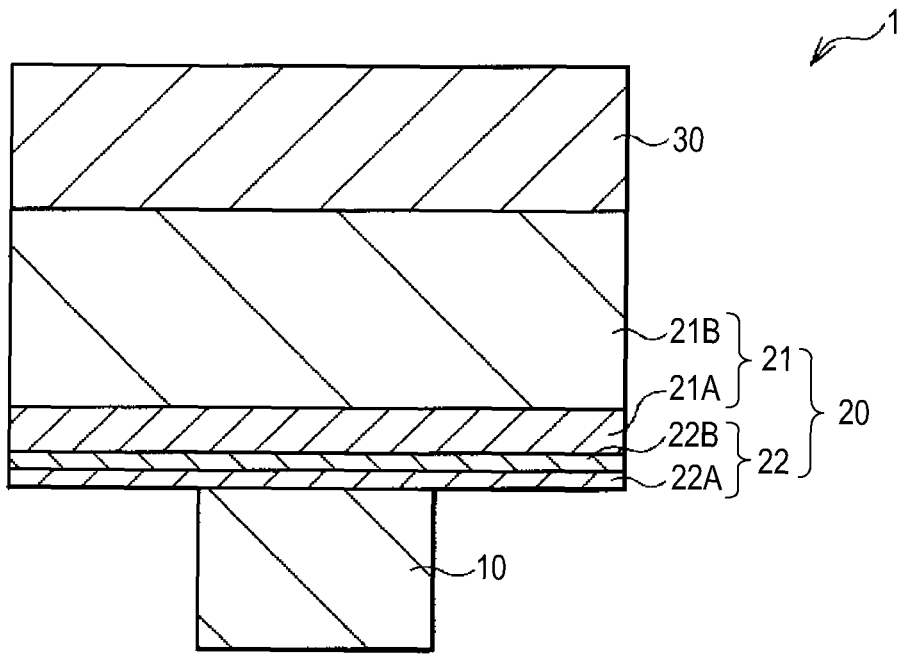
FIG. 11 is a cross-sectional view showing a configuration of a memory component according to a fourth embodiment of the present invention.

FIG. 11 shows the cross-sectional configuration of the memory component 1 according to a fourth embodiment of the present invention. The memory component 1 has the same configuration, operation, and effect as the first to third embodiments, except that oxygen (O) is added in at least one of the intermediate layer 21A and the ion supply layer 21B of the ion source layer 21, and the memory component 1 can be manufactured similarly to the first to third embodiments. Therefore, corresponding constituent elements will be denoted by the same reference numerals.

Since the ion supply layer 21B contains oxygen (O) as an additive element, the resistivity of the ion supply layer 21B increases. Therefore, at the time of the write operation, the partial pressure applied to the metal ions in the ion supply layer 21B increases, the metal ions can move more easily, and the conduction path can be formed more stably. Therefore, the written data retention characteristics are improved. The resistivity of the ion supply layer 21B can be controlled by the oxygen ($O_2$) flow rate during the deposition, and the resistivity of the ion supply layer 21B increases as the amount of introduced oxygen ($O_2$) increases.

On the other hand, since the intermediate layer 21A contains oxygen (O) as an additive element, the resistivity of the intermediate layer 21A increases. Therefore, at the time of the erase operation, the voltage applied to the intermediate layer 21A increases, and the metal ions can easily return to the ion supply layer 21B. In addition to this, a reaction in which the metal element of the conduction path is ionized to be dissolved into the ion source layer 21 or combined with tellurium (Te) or the like, thus realizing a higher resistance state, is likely to proceed. Therefore, the erasure characteristics are improved.

From the above, since both the intermediate layer 21A and the ion supply layer 21B contain oxygen (O) as the additive element, both the written data retention characteristics and the erasure characteristics are improved, thus providing more favorable characteristics than the related art where the write and erase characteristics are in a tradeoff relationship. Thus, the resistance separation width in the multi-bit memory array can be improved further.

Figure 12:
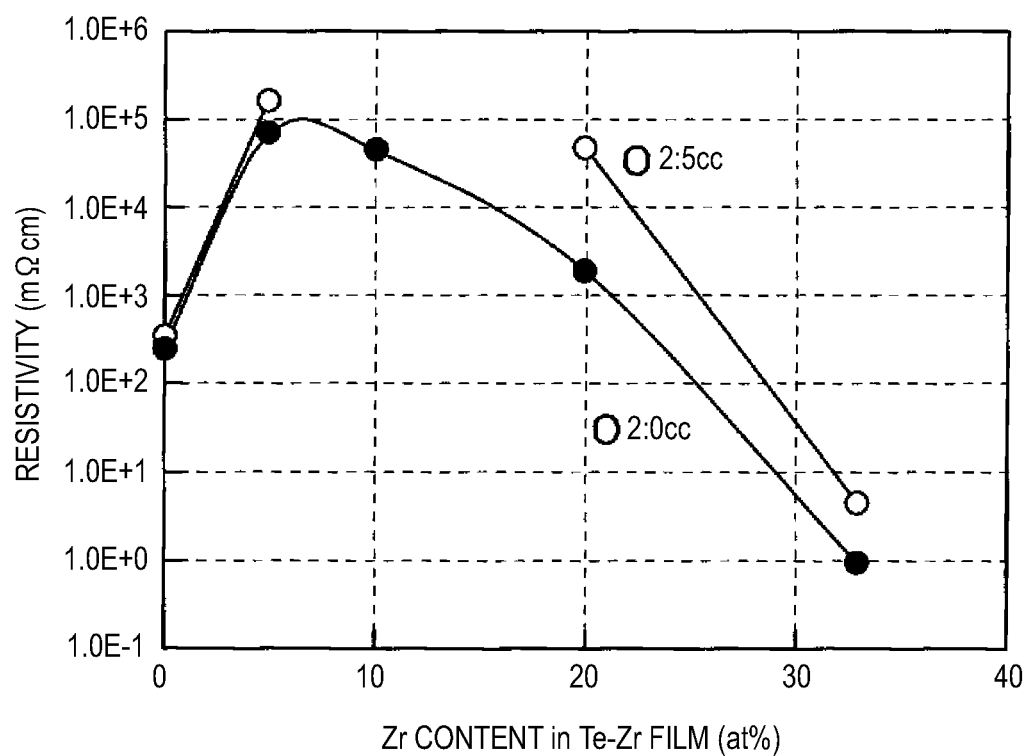
FIG. 12 is a diagram showing the dependence of the volume resistivity of a Te—Zr film on an oxygen flow rate at the time of film deposition.

FIG. 12 shows the calculation result of a volume resistivity obtained by measuring a sheet resistor in which Zr is doped to a single substance of Te when the oxygen ($O_2$) flow rate during the deposition was 0 cc and 5 cc. In FIG. 12, the deposition conditions such as power and deposition time were fixed. As can be understood from FIG. 12, the resistivity of Te—Zr film when the oxygen ($O_2$) flow rate during the deposition was 5 cc is higher than that when the flow rate was 0 cc. From this, it can be understood that the resistivity of the intermediate layer 21A can be increased to an appropriate value by adding both Zr and oxygen (O) in the intermediate layer 21A.

When other transition metals such as Cu, Ti, or Hf in addition to Zr are added together with oxygen (O), the effect of appropriately increasing the resistance of the intermediate layer 21A can be obtained similarly to Zr. That is, the intermediate layer 21A preferably contains Al and a chalcogen element and also contain oxygen (O) and at least one transition metal selected from the group consisting of Cu, Ti, Zr, and Hf.

Moreover, in FIG. 12, even when the Zr content is 0% (pure Te), a higher resistance is obtained when the oxygen ($O_2$) flow rate during the deposition was 5 cc than when the flow rate was 0 cc. Therefore, it can be understood that the resistance of the intermediate layer 21A can be increased by adding only oxygen (O) in the intermediate layer 21A without adding a transition element. In that case, the intermediate layer 21A preferably contain Al and chalcogen element and also contain oxygen (O) as an additive element.

In any of the above-mentioned cases, the intermediate layer 21A preferably have a higher resistance than the ion supply layer 21B. In this way, a voltage can be easily applied to the intermediate layer 21A, and the memory component 1 can easily operate at a low current. Moreover, when a voltage is applied to the memory component 1, ions can move more effectively, and reliable write and erase operations are possible. Therefore, operation errors are reduced, and a resistance variation is improved.

Given the above, in the present embodiment, oxygen (O) is added in at least one of the intermediate layer 21A and the ion supply layer 21B of the ion source layer 21 so as to increase the resistivity thereof. Therefore, it is possible to improve the written data retention characteristics by the effect of oxygen added in the ion supply layer 21B or improve the erasure characteristics by the effect of oxygen added in the intermediate layer 21A. Thus, the resistance separation width in the multi-bit memory array can be improved.

Modification 1, the second embodiment, and Modification 4 are also applicable to the present embodiment. That is, the resistance variable layer 22 may have a single-layered structure in which the aluminum oxide, the transition metal oxide, and the transition metal oxynitride are contained in the mixed state.

(Memory Device)

A memory device (memory) can be configured by arranging a number of the memory components 1 in an array form or a matrix form, for example. At that time, an element selection MOS transistor or a diode may be connected to the respective memory components 1 as necessary to configure a memory cell, and the memory cell may be connected to a sensing amplifier, an address decoder, a write/erase/read circuit, and the like through a wiring.

Figure 13:
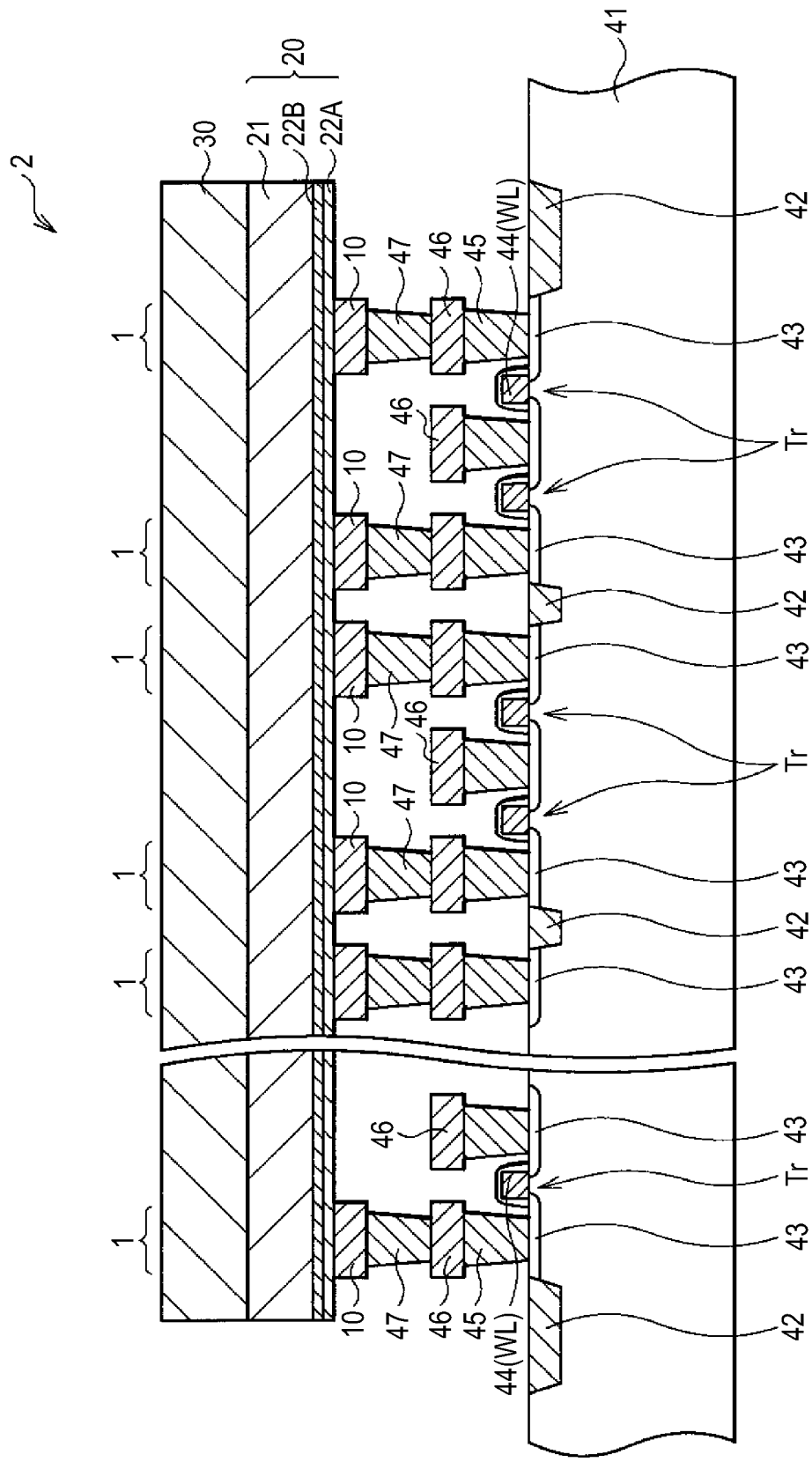
FIG. 13 is a cross-sectional view showing a simplified configuration of a memory cell array using the memory component of FIG. 1.
Figure 14:
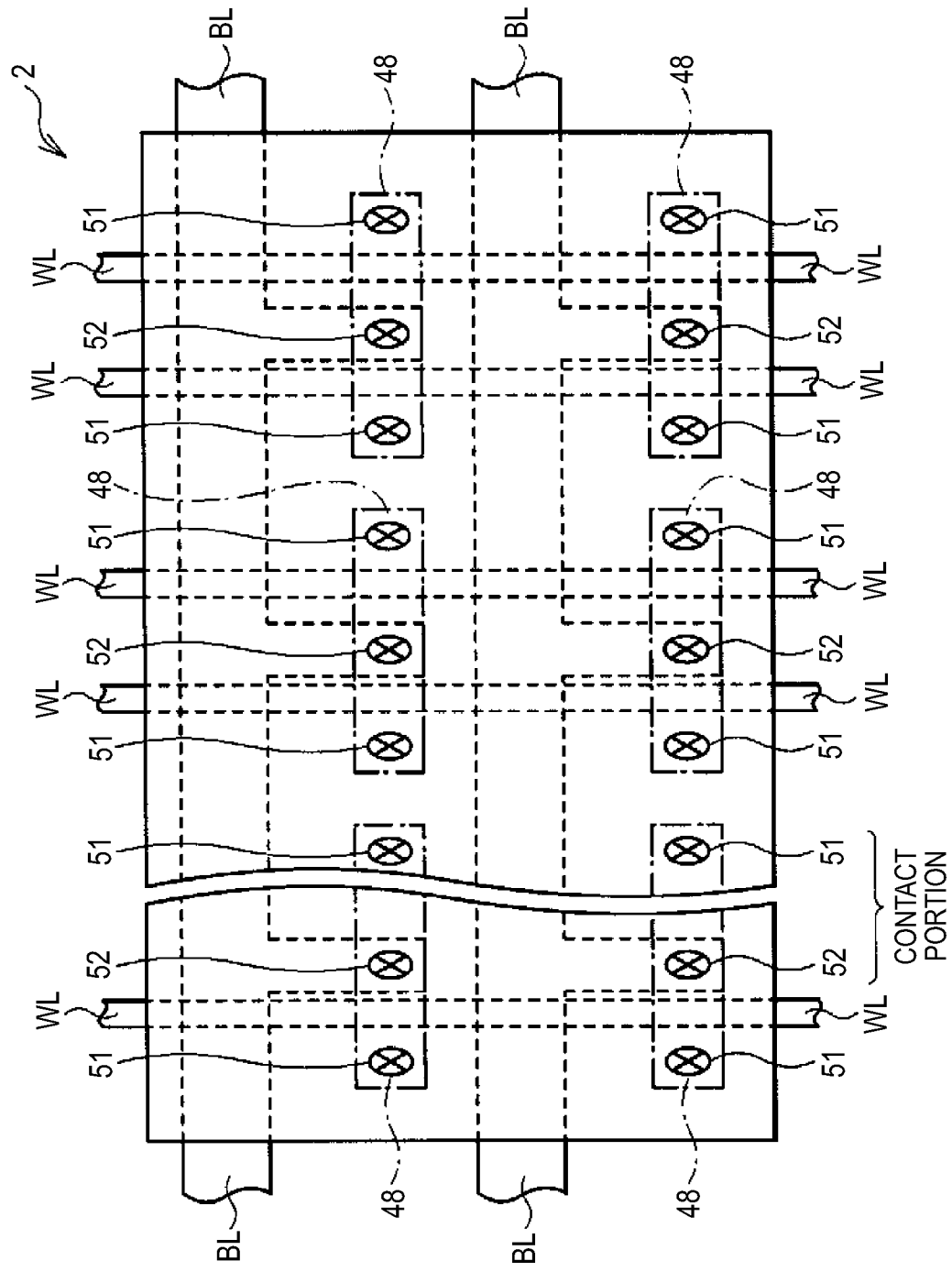
FIG. 14 is a plan view of the memory cell array.

FIGS. 13 and 14 show an example of a memory device (memory cell array 2) in which a number of memory components 1 are arranged in a matrix form, in which FIG. 13 shows the cross-sectional configuration, and FIG. 14 shows the planar configuration, respectively. In the memory cell array 2, wirings connected to the lower electrode 10 of each of the memory components 1 and wirings connected to the upper electrode 30 are provided so as to intersect each other, and the respective memory components 1 are disposed near the intersections of these wirings, for example.

The memory components 1 share the respective layers of the resistance variable layer 22, the ion source layer 21, and the upper electrode 30. That is, each of the resistance variable layer 22, the ion source layer 21, and the upper electrode 30 is configured by a common layer (the same layer) that is common to the respective memory components 1. The upper electrode 30 serves as a common electrode that is common to adjacent cells.

On the other hand, the lower electrode 10 is provided individually for each memory cell so as to be electrically separated between adjacent cells, the memory components 1 of the respective memory cells are defined at positions corresponding to the respective lower electrodes 10. The lower electrodes 10 are connected to the corresponding cell-selection MOS transistors Tr, and the respective memory components 1 are provided above the MOS transistors Tr.

The MOS transistor Tr includes a source/drain region 43 and a gate electrode 44. The source/drain region is formed in a region that is isolated by a component isolation layer 42 in a semiconductor substrate 41. A sidewall insulating layer is formed on the wall surface of the gate electrode 44. The gate electrode 44 also serves as a word line WL which is one address wiring of the memory component 1. One region of the source/drain region 43 of the MOS transistor Tr and the lower electrode 10 of the memory component 1 are electrically connected by a plug layer 45, a metal wiring layer 46, and a plug layer 47. The other region of the source/drain region 43 of the MOS transistor Tr is connected to the metal wiring layer 46 by the plug layer 45. The metal wiring layer 46 is connected to a bit line BL (see FIG. 14) which is the other address wiring of the memory component 1. In FIG. 14, an active region 48 of the MOS transistor Tr is depicted by a chain line, and a contact portion 51 is connected to the lower electrode 10 of the memory component 1, and a contact portion 52 is connected to the bit line BL.

In the memory cell array 2, when a voltage is applied to the bit line BL through the word line WL in a state where the gate of the MOS transistor Tr is in the on state, the voltage is applied to the lower electrode 10 of the selected memory cell through the source/drain of the MOS transistor Tr. Here, when the polarity of the voltage applied to the lower electrode 10 is a negative potential compared to the potential of the upper electrode 30 (common electrode), as described above, the resistance value of the memory component 1 transitions to the low-resistance state. In this way, information is written to the selected memory cell. Subsequently, when a voltage of the positive potential as compared to the potential of the upper electrode 30 (common electrode) is applied to the lower electrode 10, the resistance value of the memory component 1 transitions again to the high-resistance state. In this way, the information written to the selected memory cell is erased. In order to read the written information, a memory cell is selected by the MOS transistor Tr, and a predetermined voltage or current is applied to the selected cell. A current or voltage which is different in accordance with the resistance state of the memory component 1 is detected using a sense amplifier or the like which is connected in front of the bit line BL or the upper electrode 30 (common electrode). The voltage or current applied to the selected memory cell is controlled so as to be smaller than the threshold voltage at which the resistance state of the memory component 1 transitions.

The memory device of the present embodiment can be applied to various memory devices as mentioned above. For example, the memory device can be applied to any form of memory, such as a once-writable PROM (Programmable Read Only Memory), electrically erasable EEPROM (Erasable Programmable Read Only Memory), or a so-called RAM in which information can be written, erased, and read at a high speed.

EXAMPLES

Hereinafter, specific examples of the present invention will be described.

Example 1

A memory cell array having the memory component 1 was manufactured similarly to the first embodiment. First, a Ti film was formed to a thickness of 1 nm on a CMOS circuit, on which the plug of the lower electrode 10 made of TiN is formed, by sputtering. After that, the Ti film was oxidized by plasma oxidation, whereby the first layer 22A made of TiOx was formed.

Subsequently, the intermediate layer 21A made of Te was formed to a thickness of 4 nm, and then, the ion supply layer 21B made of CuZrTeAlGe (Cu 11 at %-Zr 11 at %-Te 30 at %-Al 40 at %-Ge 8 at %) was formed to a thickness of 60 nm. After that, the upper electrode 30 made of W was formed to a thickness of 50 nm. The process of this example can be summarized as follows.

TiN/Ti (1 nm)/plasma oxidation/Te (4 nm)/CuZrTeAlGe (60 nm)/W (50 nm)

After the laminated film of the lower electrode 10, the memory layer 20, and the upper electrode 30 was formed, the laminated film was patterned so that the resistance variable layer 22, the ion source layer 21, and the upper electrode 30 was left in a memory cell array portion. Moreover, etching was performed on the surface of the upper electrode 30 so as to expose the contact portion of the upper electrode 30 for connecting to an external circuit that applies an intermediate potential (Vdd/2).

After the laminated film was patterned, a wiring layer (not shown), for example, made of Al was formed to a thickness of 200 nm, and the wiring layer was connected to the contact portion of the upper electrode 30. After that, the laminated film was subjected to heat treatment at a temperature of 300° C. for 2 hours in a vacuum heat treatment furnace. In this way, a memory cell array having the memory component 1 shown in FIG. 1 was manufactured.

The repeated rewriting characteristics were examined for the obtained memory cell array of Example 1. During the examination, a pulse having a voltage Vw of 3 V, a current of about 100 µA, and a pulse width of 10 ns was used as a write pulse, a pulse having a voltage Ve of 2 V, a current of about 100 µA, and a pulse width of 10 nm was used as an erase pulse, and the rewrite operation was repeated $10^5$ times or more using the pulses. The results of the examination are shown in FIG. 15B. Moreover, the same repeated rewriting characteristics were examined when the current was 50 µA. The results of the examination are shown in FIG. 15C.

Figure 15A:
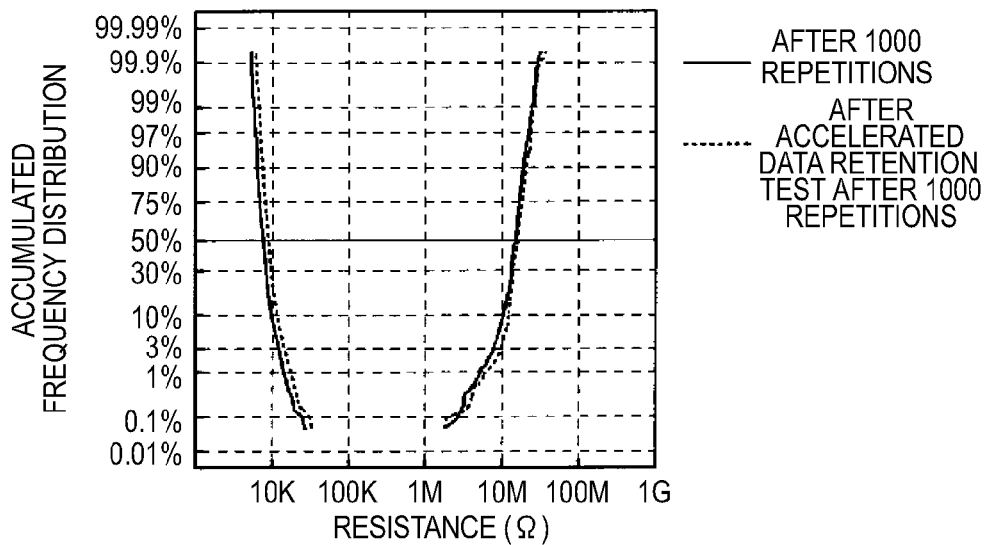
FIGS. 15A to 15C are diagrams showing the results of Example 1.
Figure 15B:
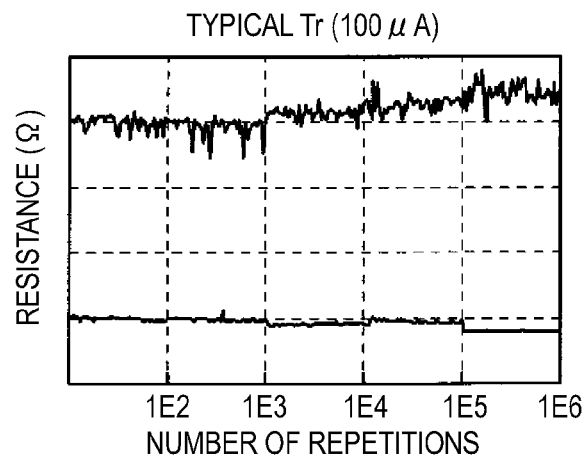
Figure 15C:
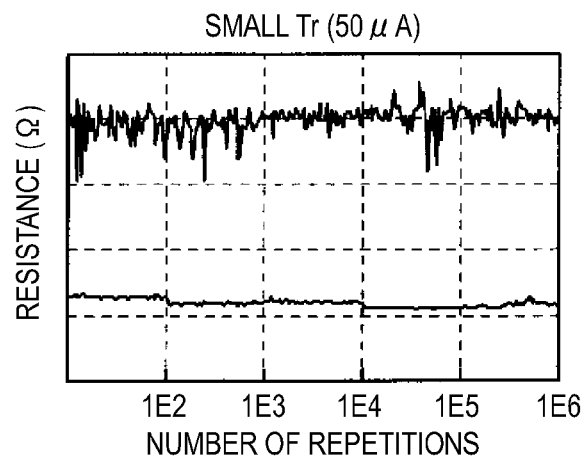

As can be understood from FIGS. 15B and 15C, a favorable memory operation wherein the resistance values of the low-resistance state and the high-resistance state are different in the order of one digit or more was obtained.

Subsequently, the cumulative frequency distribution after 1000 repetitions with a 4-kbit memory cell array and the cumulative frequency distribution after an accelerated data retention test at a temperature of 130° C. for 2 hours were examined. The results of the examination are shown in FIG. 15A.

As can be understood from FIG. 15A, the written state (low-resistance state) and the erased state (high-resistance state) are separated, favorable variation characteristics were obtained, and favorable resistance separation characteristics were obtained even after the accelerated data retention test.

Example 2

A natural oxide film formed on the lower electrode 10 was sufficiently removed, by reverse sputtering, from a CMOS circuit on which the plug of the lower electrode 10 made of TiN is formed. After that, the lower electrode 10 was directly subjected to plasma oxidation, whereby the first layer 22A made of TiOx was formed. Except for the above, a memory cell array having the memory component 1 was manufactured similarly to Example 1. The process of Example 2 can be summarized as follows.

TiN/plasma oxidation/Te (4 nm)/CuZrTeAlGe (60 nm)/W (50 nm)

Example 3

A natural oxide film formed on the lower electrode 10 was sufficiently removed, by reverse sputtering, from a CMOS circuit on which the plug of the lower electrode 10 made of W is formed. After that, the lower electrode 10 was directly subjected to plasma oxidation, whereby the first layer 22A made of a tungsten oxide (WOx) was formed. Except for the above, a memory cell array having the memory component 1 was manufactured similarly to Example 1. The process of Example 3 can be summarized as follows.

W/plasma oxidation/Te (4 nm)/CuZrTeAlGe (60 nm)/W (50 nm)

Comparative Example 1

A gadolinium (Gd) film was formed to a thickness of 1 nm on a CMOS circuit, on which the plug of the lower electrode made of TiN is formed, by sputtering. The Gd film was oxidized with plasma oxidation, whereby a gadolinium oxide (GdOx) film was formed. After that, the ion source layer made of CuZrTeAlGe (Cu 11 at %-Zr 11 at %-Te 30 at %-Al 40 at %-Ge 8 at %) was formed to a thickness of 60 nm, and the upper electrode made of W was formed to a thickness of 50 nm. Except for the above, a memory cell array having the memory component was manufactured similarly to Example 1. The process of Comparative Example 1 can be summarized as follows.

TiN/Gd (1 nm)/plasma oxidation/CuZrTeAlGe (60 nm)/W (50 nm)

Comparative Example 2

A Gd film was formed to a thickness of 1 nm on a CMOS circuit, on which the plug of the lower electrode made of TiN is formed, by sputtering. The Gd film was oxidized with plasma oxidation, whereby a GdOx film was formed. Subsequently, the intermediate layer made of Te was formed to a thickness of 4 nm, and the ion supply layer made of CuZrTeAlGe (Cu 11 at %-Zr 11 at %-Te 30 at %-Al 40 at %-Ge 8 at %) was formed to a thickness of 60 nm. After that, the upper electrode made of W was formed to a thickness of 50 nm. Except for the above, a memory cell array having the memory component was manufactured similarly to Example 1. The process of Comparative Example 2 can be summarized as follows.

TiN/Gd (1 nm)/plasma oxidation/Te (4 nm)/CuZrTeAlGe (60 nm)/W (50 nm)

Comparative Example 3

An intermediate layer made of Te was formed to a thickness of 4 nm on a CMOS circuit, on which the plug of the lower electrode made of TiN is formed, by sputtering. Subsequently, the ion supply layer made of CuZrTeAlGe (Cu 11 at %-Zr 11 at %-Te 30 at %-Al 40 at %-Ge 8 at %) was formed to a thickness of 60 nm, and the upper electrode made of W was formed to a thickness of 50 nm. Except for the above, a memory cell array having the memory component was manufactured similarly to Example 1. The process of Comparative Example 3 can be summarized as follows.

TiN/Te (4 nm)/CuZrTeAlGe (60 nm)/W (50 nm)

Figure 16A:
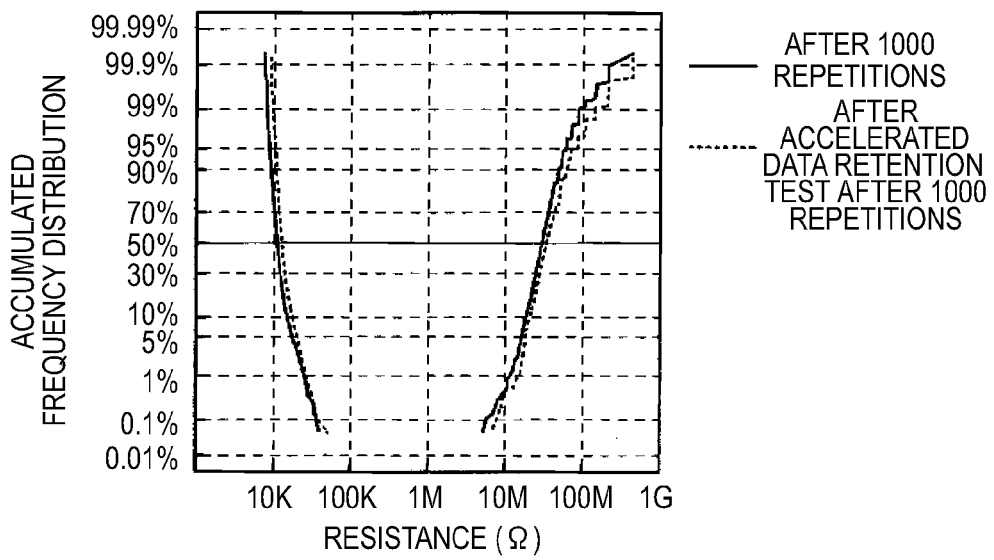
FIGS. 16A to 16C are diagrams showing the results of Example 2.
Figure 16B:
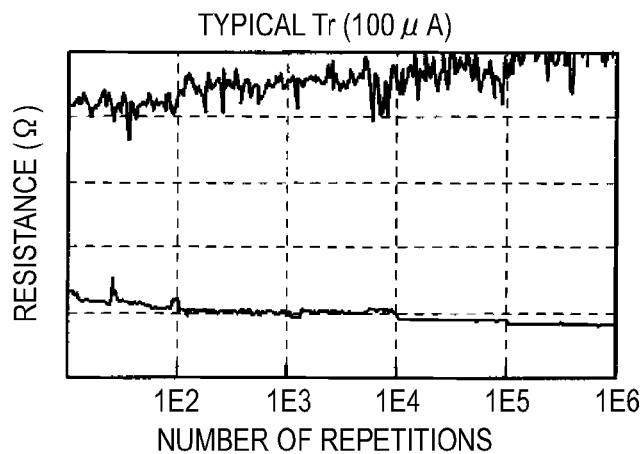
Figure 16C:
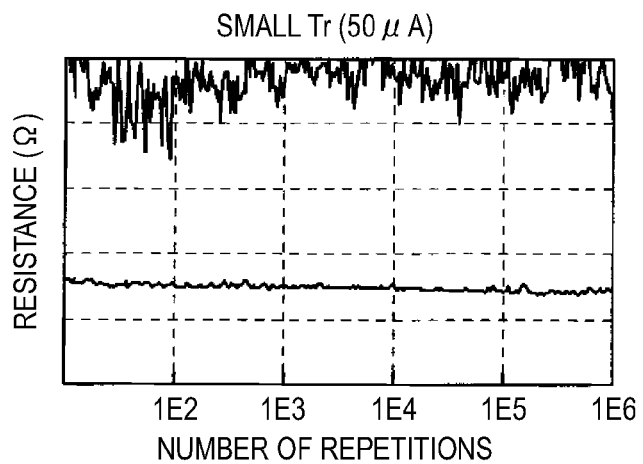
Figure 17A:
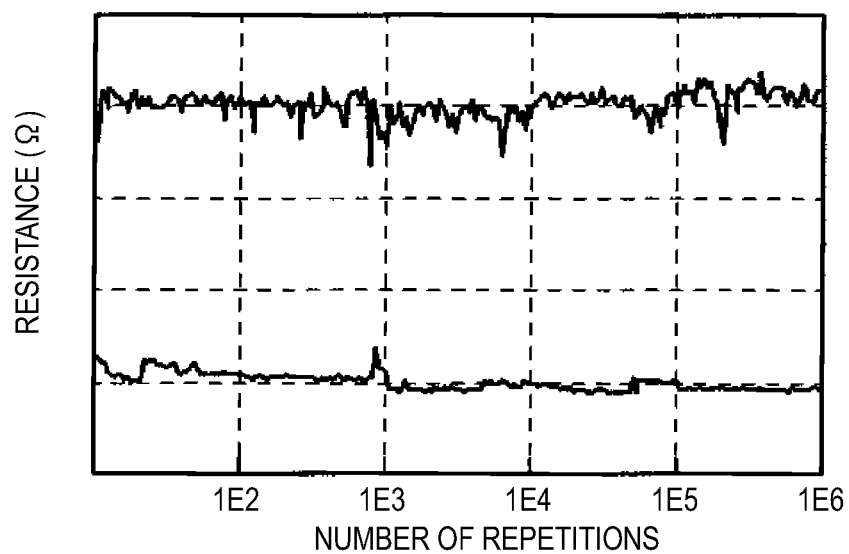
FIGS. 17A and 17B are diagrams showing the results of Example 3.
Figure 17B:
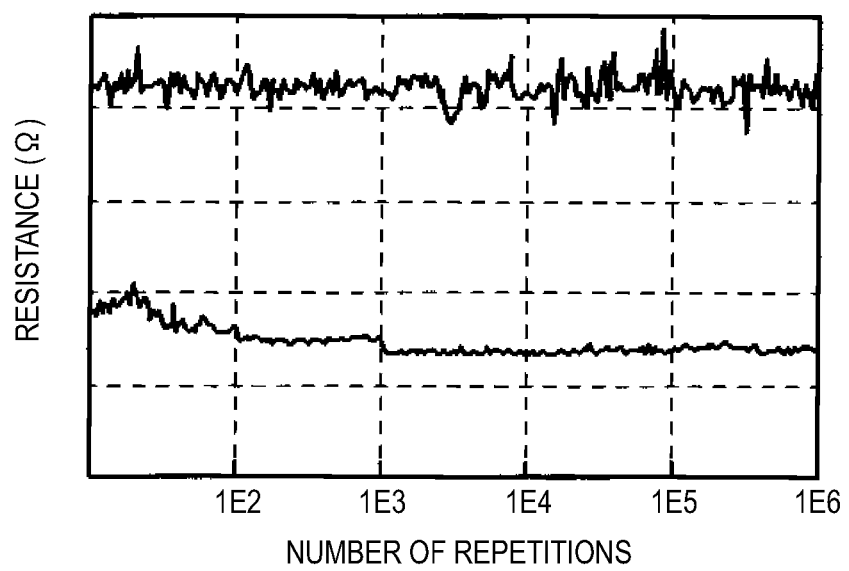
Figure 18A:
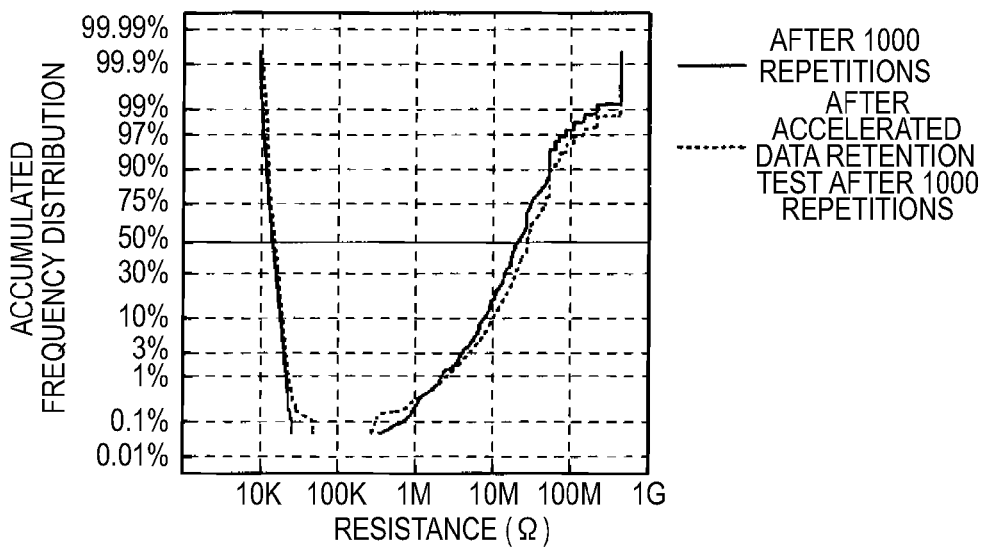
FIGS. 18A to 18C are diagrams showing the results of Comparative Example 1.
Figure 18B:
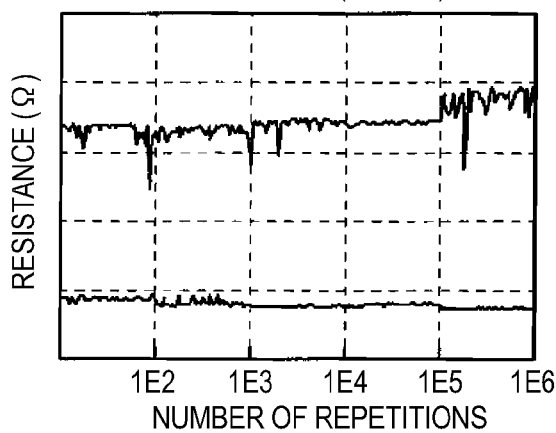
Figure 18C:
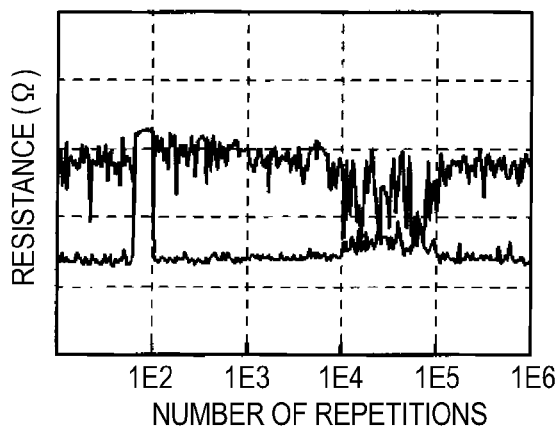
Figure 19A:
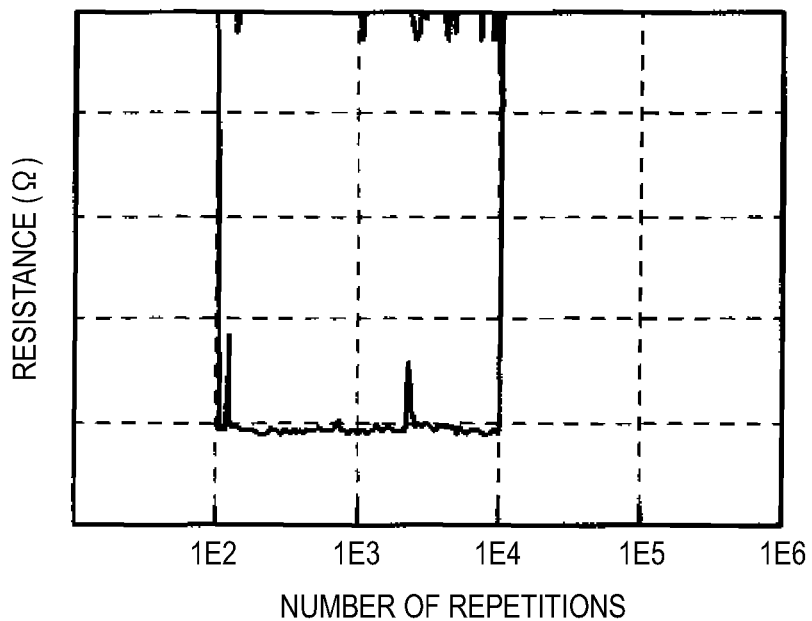
FIGS. 19A and 19B are diagrams showing the results of Comparative Example 2.
Figure 19B:
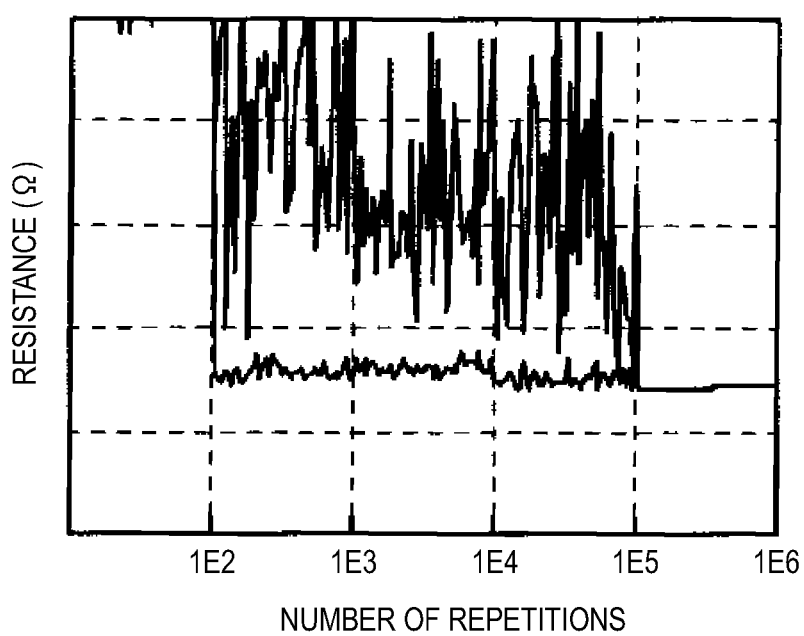
Figure 20A:
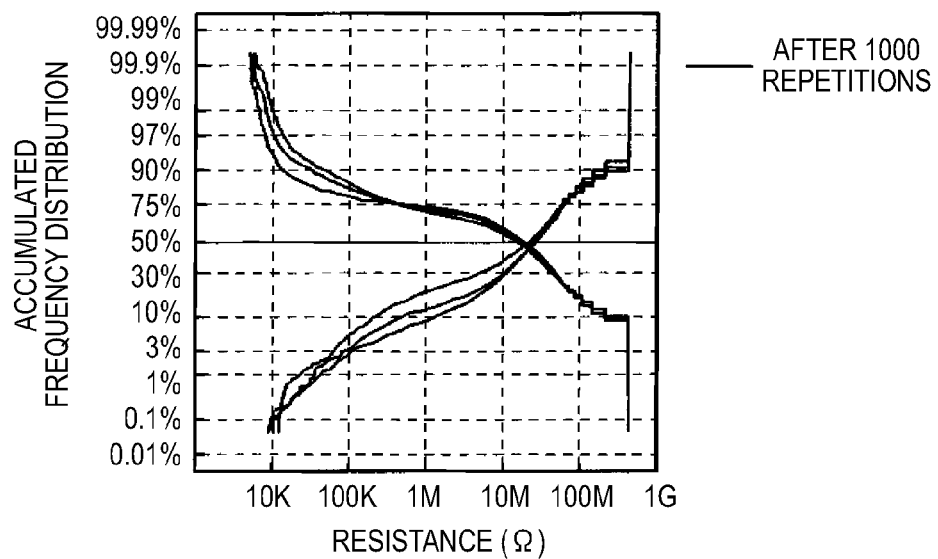
FIGS. 20A to 20C are diagrams showing the results of Comparative Example 3.
Figure 20B:
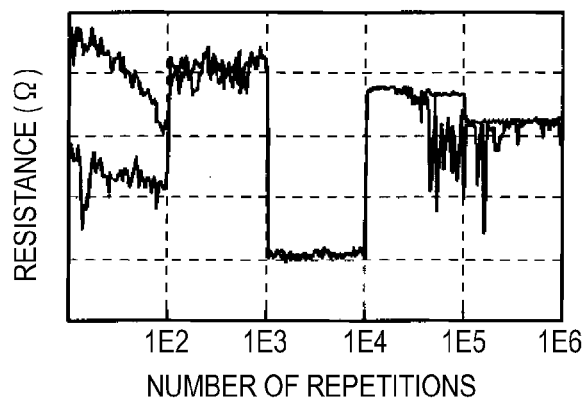
Figure 20C:
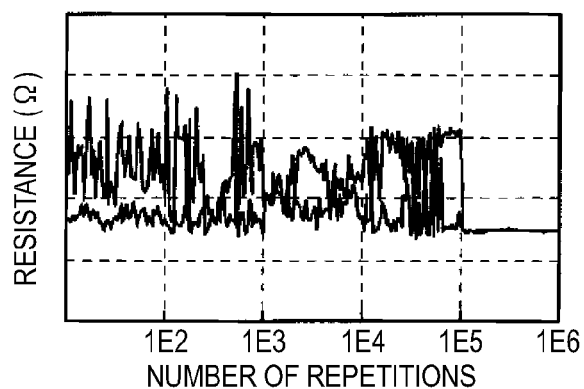

Similarly to Example 1, the cumulative frequency distribution for 4 kbit data after 1000 repetitions and/or the repetition characteristics with the current of 100 µA and 50 µA were examined for the obtained memory cell arrays of Examples 2 and 3 and Comparative Examples 1, 2, and 3. The cumulative frequency distribution for Example 2 is shown in FIG. 16A, and the repetition characteristics for Example 2 are shown in FIGS. 16B and 16C. The repetition characteristics for Example 3 are shown in FIGS. 17A and 17B. The cumulative frequency distribution for Comparative Example 1 is shown in FIG. 18A, and the repetition characteristics for Comparative Example 1 are shown in FIGS. 18B and 18C. The repetition characteristics for Comparative Example 2 are shown in FIGS. 19A and 19B. The cumulative frequency distribution for Comparative Example 3 is shown in FIG. 20A, and the repetition characteristics for Comparative Example 3 are shown in FIGS. 20B and 20C.

Examples 1 and 2 and Comparative Example 3

Presence of First Layer Made of Transition Metal Oxide

As can be understood from FIGS. 15A to 15C, 16A to 16C, and 20A to 20C, both favorable resistance separation characteristics and repetition characteristics were obtained with Examples 1 and 2 where the first layer 22A made of TiOx was formed on the lower electrode 10. In contrast, in the case of Comparative Example 3 where the first layer made of the transition metal oxide was not provided, and the intermediate layer and the ion supply layer were directly formed on the lower electrode, the high-resistance state and the low-resistance state were not separated favorably, and the repetition characteristics were poor.

Figure 21A:
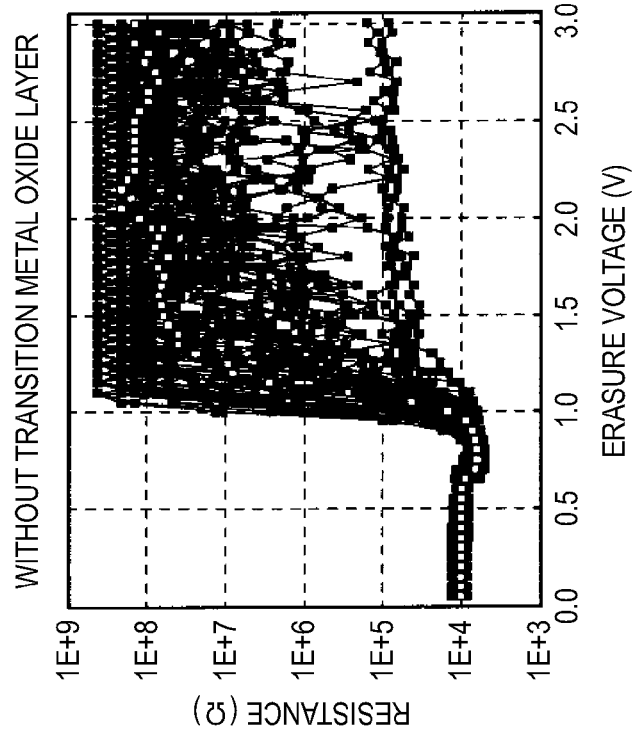
FIGS. 21A and 21B are diagrams showing the results of experiments to examine the effect of a first layer made of a transition metal oxide.
Figure 21B:
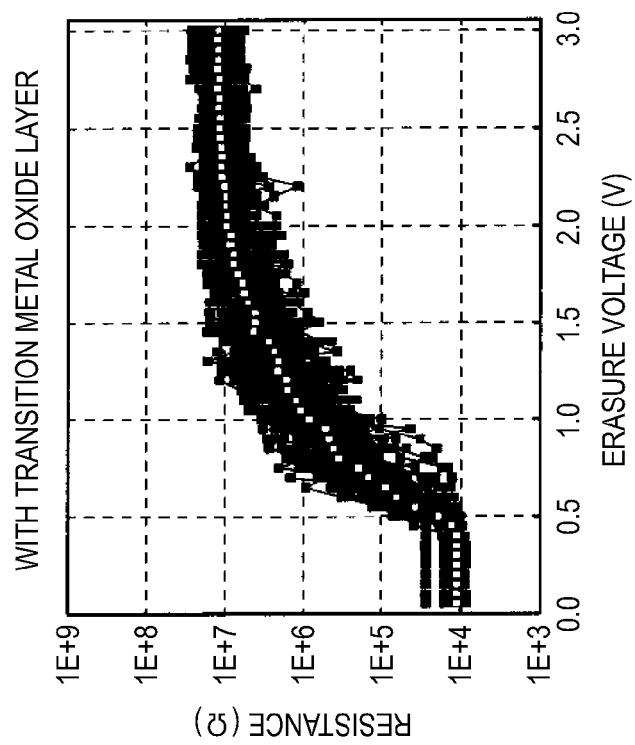
Figure 23:
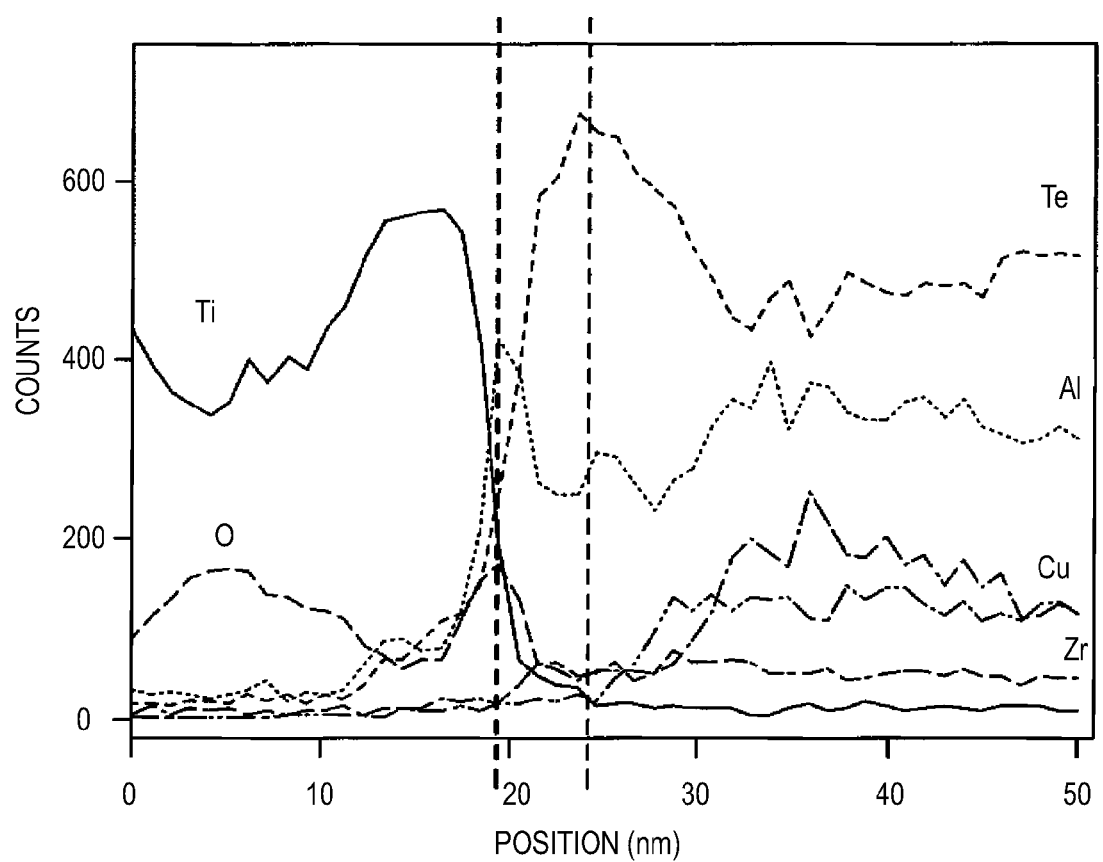
FIG. 23 is a diagram showing the results of EDX profiles of the respective elements shown in FIGS. 24A to 24F.
Figure 24C:
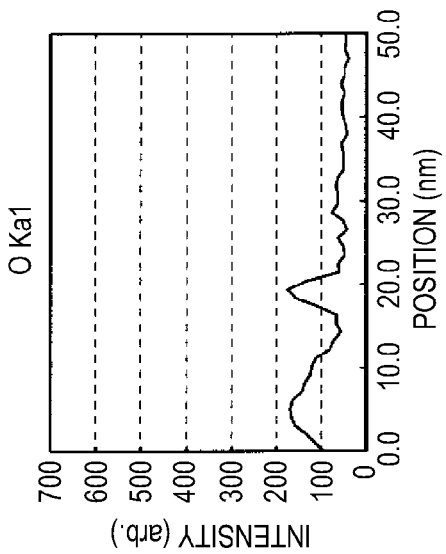
FIGS. 24A to 24F are diagrams showing the results of the EDX profiles of the respective components of the memory component of Example 2.
Figure 24F:
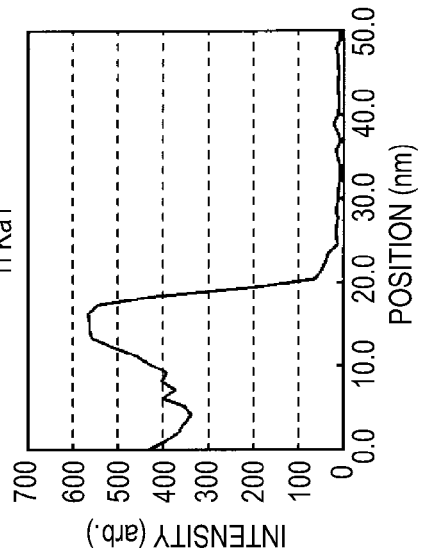
Figure 24B:
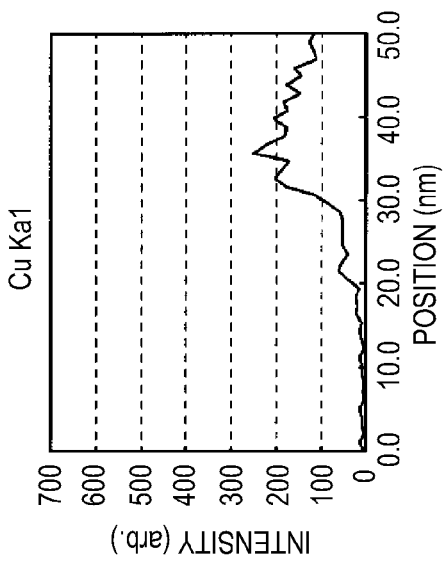
Figure 24E:
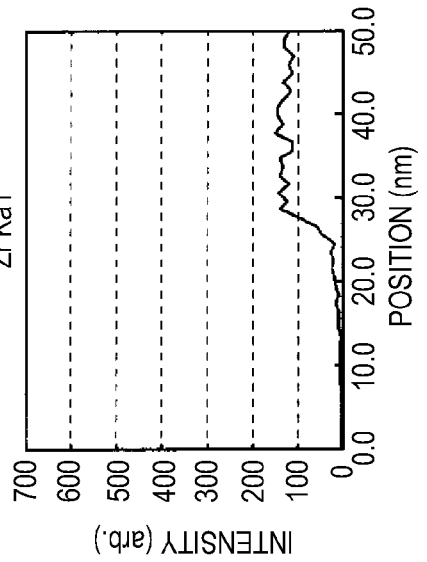
Figure 24A:
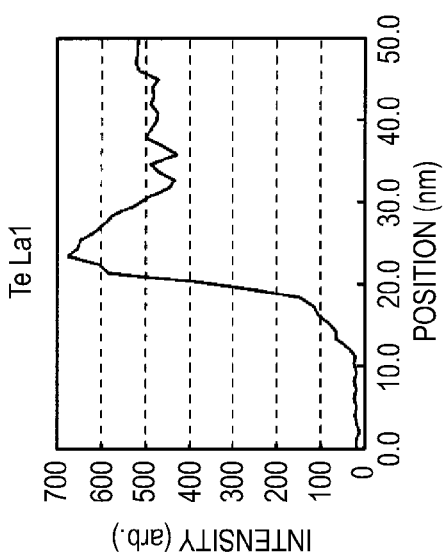
Figure 24D:
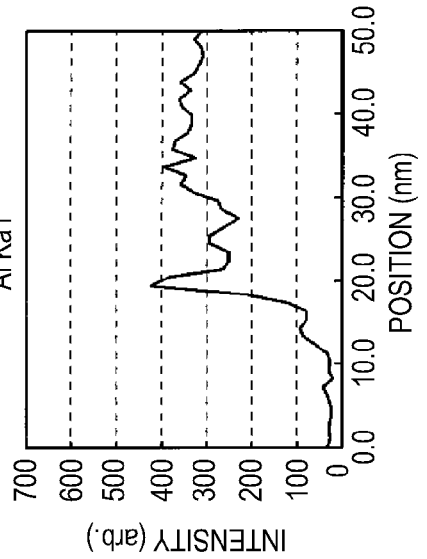

Although the reason thereof is not clear, FIGS. 21A and 21B show changes in the resistance; as a measurement example for evaluating the reason, when a voltage of 0 to 3 V was applied in the erasure direction to 60 components in the low-resistance state in which a write operation was performed. As shown in FIG. 21B, many components in which the first layer made of the transition metal oxide was not formed have transitioned to the low-resistance state in response to the erasure voltage. In contrast, as shown in FIG. 21A, none of the components in which the first layer made of the transition metal oxide was formed have failed to transition to the low-resistance state in response to the erasure voltage within the measurement range. This is considered to be attributable to the fact that the presence of the first layer made of the transition metal oxide on the lower electrode suppresses the occurrence of an unnecessary change other than the high-resistance state such as the formation of the Al oxide film when the erasure voltage was applied. This may be considered to be attributable to the fact that the reaction of Te which is an anion of an electrolyte and the lower electrode is suppressed in this example.

In addition, structure analysis and EDX measurement using TEM (Transmission Electron Microscope) were conducted with respect to the memory component 1 of Example 2. The TEM-EDX images are shown in FIGS. 22A to 22C, and the results of cross-sectional EDX line profiles are shown in FIG. 23 and FIGS. 24A to 24F. In the EDX measurement, EDX spectrums were acquired at respective points while scanning an electron beam condensed to a diameter of about 1 nm on cross-sectional samples in a linear direction at intervals of 1 nm. The results of the EDX line profiles are the results obtained by plotting the integral intensity of Te-L$\alpha$1 peak, Cu—K$\alpha$1 peak, O—K$\alpha$1 peak, Al—K$\alpha$1 peak, Zr—K$\alpha$1 peak, and Ti—K$\alpha$1 peak. The integral intensity of the respective peaks are values including the background noise components.

As can be understood from FIG. 23 and FIGS. 24A to 24F, in the case of Example 2, the peaks of Al and oxygen (O) were observed at the interface between the first layer 22A and the intermediate layer 21A including Te. Thus, it can be understood that the second layer 22B made of an aluminum oxide (Al—O) is formed. The presence of the second layer 22B was also observed from the TEM images in FIGS. 22A to 22C. Although not depicted in the figures, from the TEM images of Comparative Example 3 where the first layer made of the transition metal oxide was not formed on the lower electrode, it can be understood that the Al oxide layer is formed on the lower electrode. However, the repetition characteristics of Example 2 and Comparative Example 3 are greatly different. That is, in the case of Example 2, there was little deterioration in the repetition characteristics even after one million or more repetitions of the rewrite operation, and a further rewrite operation was possible. However, in the case of Comparative Example 3 where the first layer made of the transition metal oxide was not formed, the repetition characteristics deteriorated greatly after 10 repetitions.

That is, it can be understood that favorable resistance separation characteristics and favorable repetition characteristics were obtained when the resistance variable layer 22 had a configuration in which the first layer 22A made of the transition metal oxide and the second layer 22B containing the aluminum oxide as its main component are laminated in that order from the side of the lower electrode 10.

Example 3 and Comparative Example 2

Other Materials of First Layer Made of Transition Metal Oxide

As can be understood from FIGS. 17A and 17B, in the case of Example 3 in which the first layer 22A made of WOx was provided, favorable resistance separation characteristics and favorable repetition characteristics were obtained similarly to Examples 1 and 2.

In contrast, as can be understood from FIGS. 19A and 19B, in the case of Comparative Example 2 where the GdOx film was formed as the resistance variable layer, the initial resistance value was too high, and it was difficult to perform the write operation (realize the low-resistance state). Thus, it was difficult to repeat the write operation.

That is, it was understood that, even when the first layer 22A is made of WOx instead of TiOx, favorable resistance separation characteristics and favorable repetition characteristics can be obtained.

Examples 1 to 3 and Comparative Example 1

Difference in Low-Current Repetition Characteristics Depending on Presence of Intermediate Layer As can be understood from FIGS. 18B and 18C, in the case of Comparative Example 1 where the resistance variable layer made of GdOx was formed on the lower electrode but the intermediate layer was not provided, the resistance separation characteristics after repetition with the current of 100 µA were relatively favorable. However, the repetition characteristics with the current of 50 µA were inferior to Examples 1 to 3 where the intermediate layer 21A was provided.

That is, it was understood that the repetition characteristics at a lower current were improved when the ion source layer 21 had the two-layered structure of the intermediate layer 21A and the ion supply layer 21B.

Example 2

Aluminum Concentration Distribution of Intermediate Layer and Ion Supply Layer

In Example 2 described above, after the first layer 22A made of the transition metal oxide was formed, the intermediate layer 21A made of Te and the ion supply layer 21B made of CuZrTeAlGe were formed sequentially. However, as can be understood from the TEM images in FIGS. 22A to 22C and the results of the EDX line profiles in FIG. 23 and FIGS. 24A to 24F, actually, after the deposition, Al is diffused from the ion supply layer 21B into the intermediate layer 21A, and Al is also present in the intermediate layer 21A. However, it can be understood from the TEM images that the ratio (Al concentration) of the Al content to the chalcogen element content in the intermediate layer 21A is lower than that in the ion supply layer 21B. The effect of this example is attributable to this. That is, it is necessary that abundant Te is present as anions in the intermediate layer 21A, and the Te ions do not disturb the movement of Al ions at the time of the write and erase operation, particularly at the time of the erase operation. Moreover, since it is considered that the Al in the intermediate layer 21A is generated by a diffusion which is caused by a concentration gradient with respect to the ion supply layer 21B, it is considered that the Al content is smaller than a stoichiometric composition of $Al_2Te_3$, for example. Therefore, it is considered that most of the Al in the intermediate layer 21A is present in the ionic state. The applied potential is effectively used for driving the ions, whereby such an improvement in the characteristics is made possible.

That is, it was understood that the repetition characteristics at a low current can be improved when the Al concentration in the intermediate layer 21A was smaller than the Al concentration in the ion supply layer 21B.

Example 2 and Comparative Example 1

Difference in Data Retention Characteristics Depending on Presence of Intermediate Layer As can be understood from FIGS. 16A and 18A, in the case of Comparative Example 1 where the intermediate layer was not provided, the bits in the low-resistance state were changed to the high-resistance state after the accelerated data retention test after the repetition, and changes in the resistance distribution were observed. In contrast, in the case of Example 2 where the intermediate layer was provided, no change in the distribution of the low-resistance state was observed, and favorable data retention characteristics were obtained. Although the reason thereof is not clear, this is considered to be attributable to the following fact. That is, in the case of Example 2, due to the presence of the intermediate layer 21A in which the Al concentration is lower than the ion supply layer 21B, the Al ions are reduced by the reduction reaction at the time of the write operation to produce Al metal. When the write voltage bias is removed, the Al metal does not become an Al oxide to increase the component resistance but is dissolved into the intermediate layer 21A capable of dissolving Al. Thus, there is no resistance increase.

That is, it was understood that the data retention characteristics can be improved when the ion source layer 21 had the two-layered structure of the intermediate layer 21A and the ion supply layer 21B.

Example 4-1

Figure 25A:
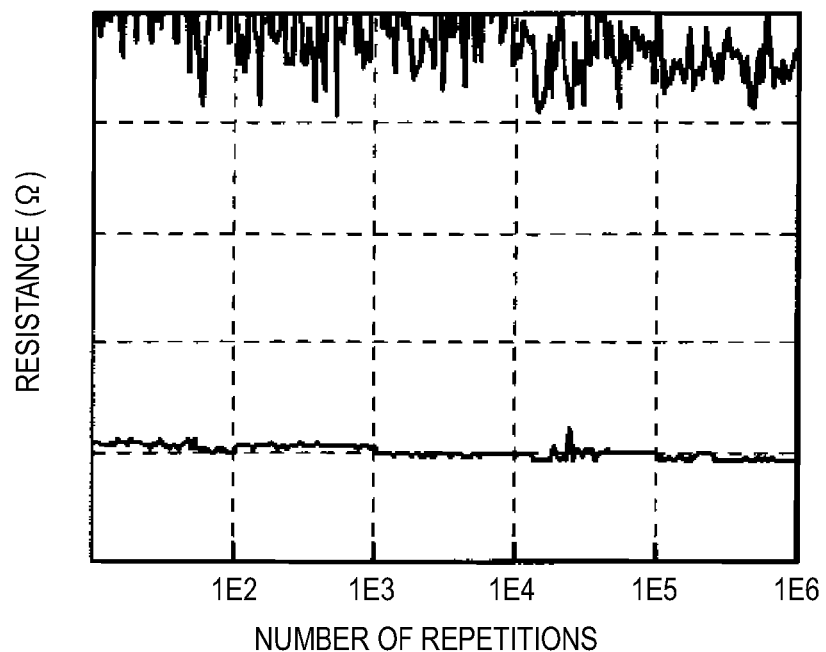
FIGS. 25A and 25B are diagrams showing the results of Example 4-1.
Figure 25B:
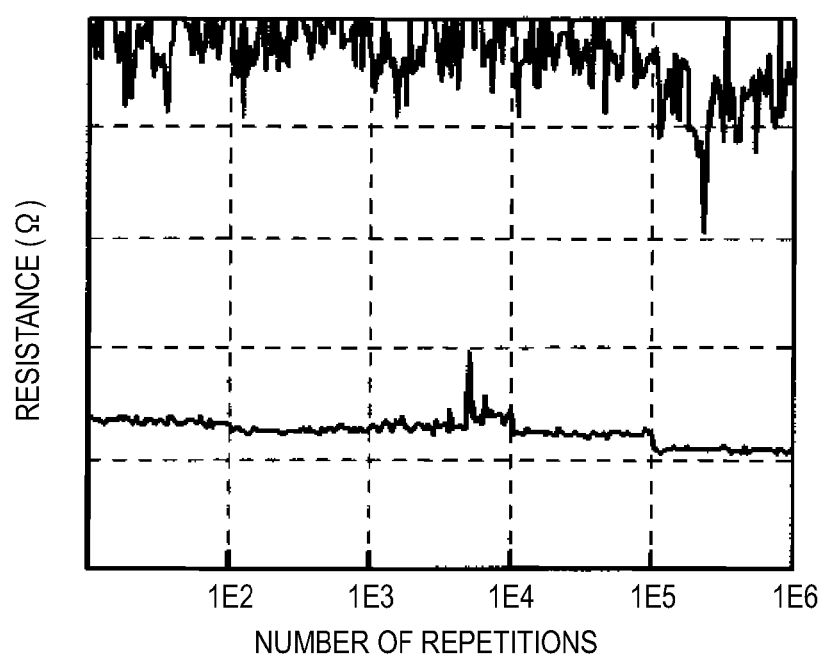

A memory cell array was manufactured similarly to Example 1, except that the first layer 22A was formed by subjecting a Ta film to plasma oxidation. The repeated rewriting characteristics and the resistance separation characteristics were examined for the obtained memory cell array. The obtained results were equivalent to those obtained in Example 1 as shown in FIGS. 25A and 25B.

Example 4-2

Figure 26A:
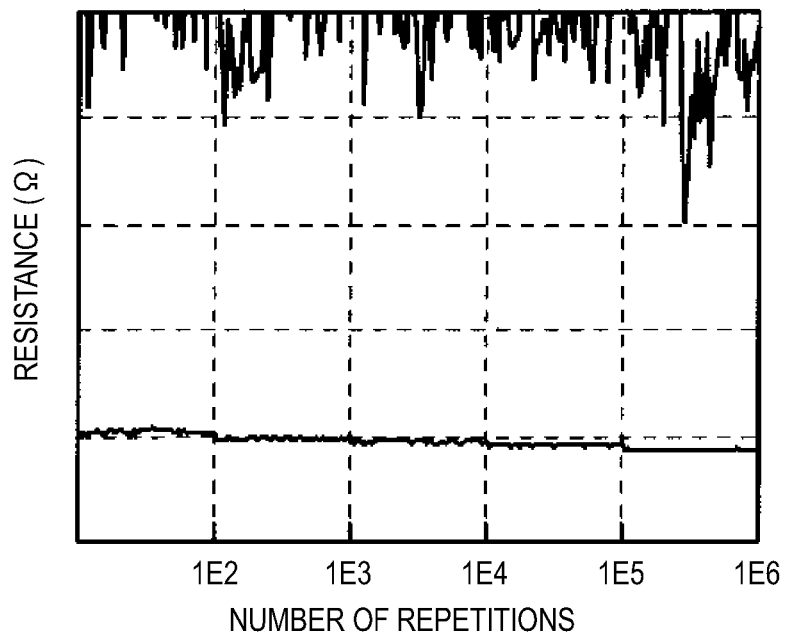
FIGS. 26A and 26B are diagrams showing the results of Example 4-2.
Figure 26B:
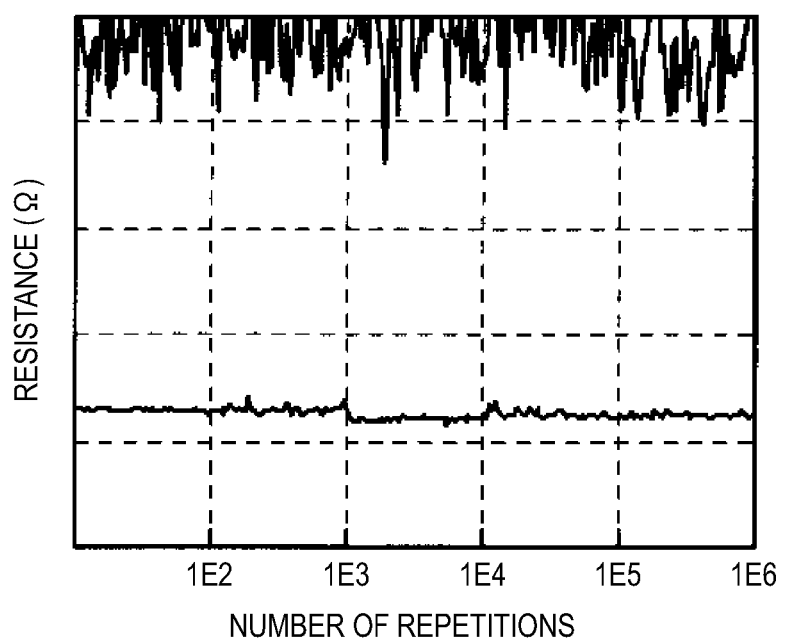

A memory cell array was manufactured similarly to Example 1, except that the first layer 22A was formed by subjecting a Zr film to plasma oxidation. The repeated rewriting characteristics and the resistance separation characteristics were examined for the obtained memory cell array. The obtained results were equivalent to those obtained in Example 1 as shown in FIGS. 26A and 26B.

Example 5-1

Figure 27A:
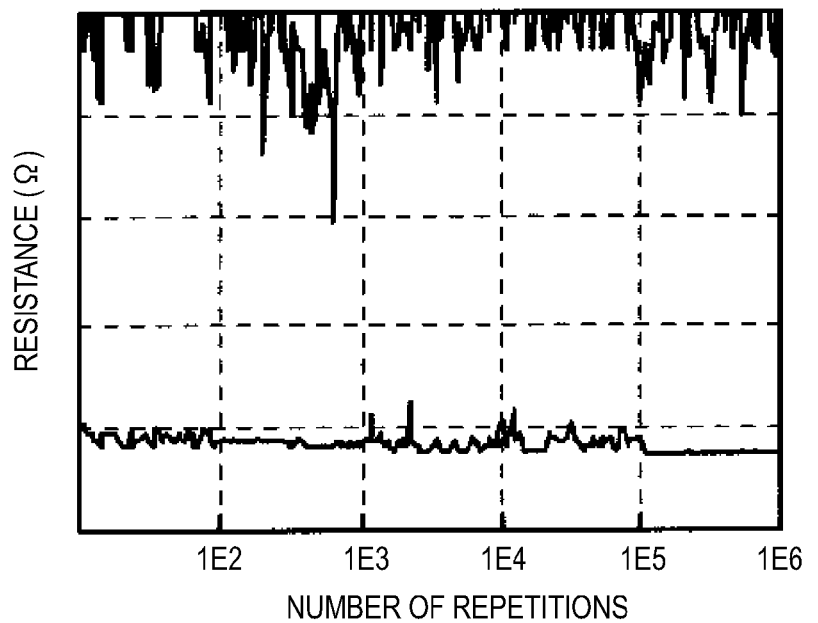
FIGS. 27A and 27B are diagrams showing the results of Example 5-1.
Figure 27B:
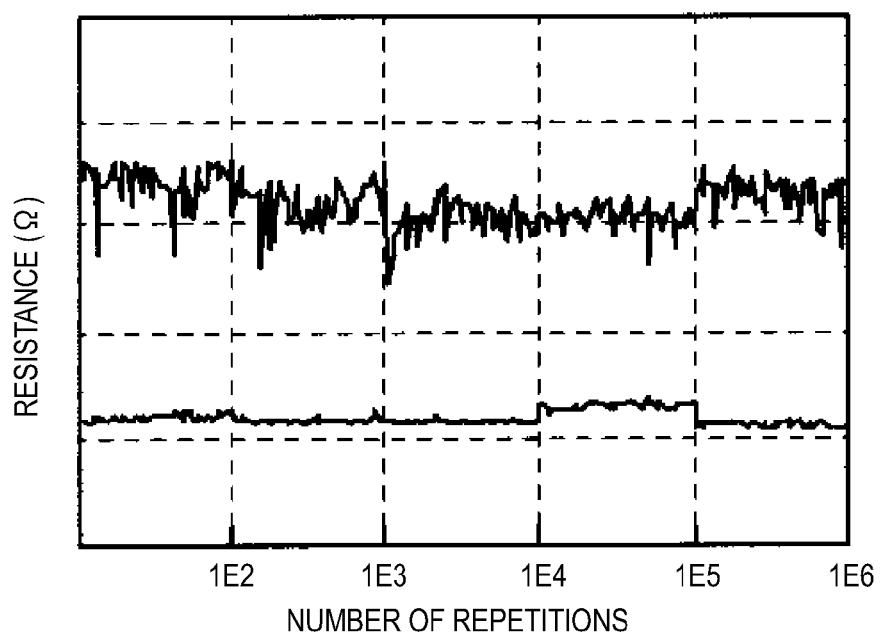

A memory cell array was manufactured similarly to Example 1, except that the intermediate layer 21A was made of GeS and the ion supply layer 21B was made of CuZrTeAlGe. The repeated rewriting characteristics and the resistance separation characteristics were examined for the obtained memory cell array. The obtained results were equivalent to those obtained in Example 1 as shown in FIGS. 27A and 27B.

Example 5-2

A memory cell array was manufactured similarly to Example 1, except that the intermediate layer 21A was made of Te and the ion supply layer 21B was made of CuTiTeAl. The repeated rewriting characteristics and the resistance separation characteristics were examined for the obtained memory cell array. The obtained results were equivalent to those obtained in Example 1.

Example 6-1

Figure 28A:
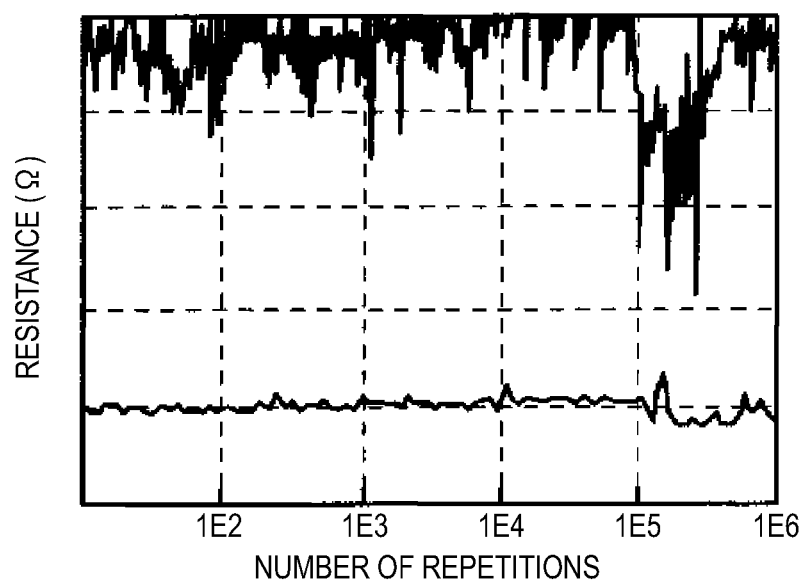
FIGS. 28A and 28B are diagrams showing the results of Example 6-1.
Figure 28B:
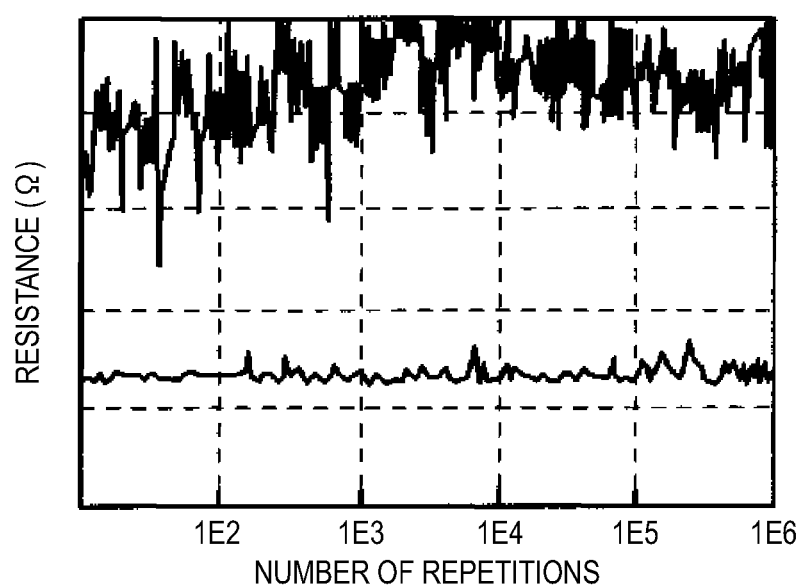

A memory cell array was manufactured similarly to Example 2, except that the intermediate layer 21A was made of Te (thickness: 5 nm), the ion supply layer 21B was made of Ag7Zr14Te36Al43 (thickness: 45 nm), and the upper electrode 30 was made of Zr (thickness: 50 nm). The repeated rewriting characteristics and the resistance separation characteristics were examined for the obtained memory cell array. The obtained results were equivalent to those obtained in Example 2 as shown in FIGS. 28A and 28B.

Example 6-2

Figure 29A:
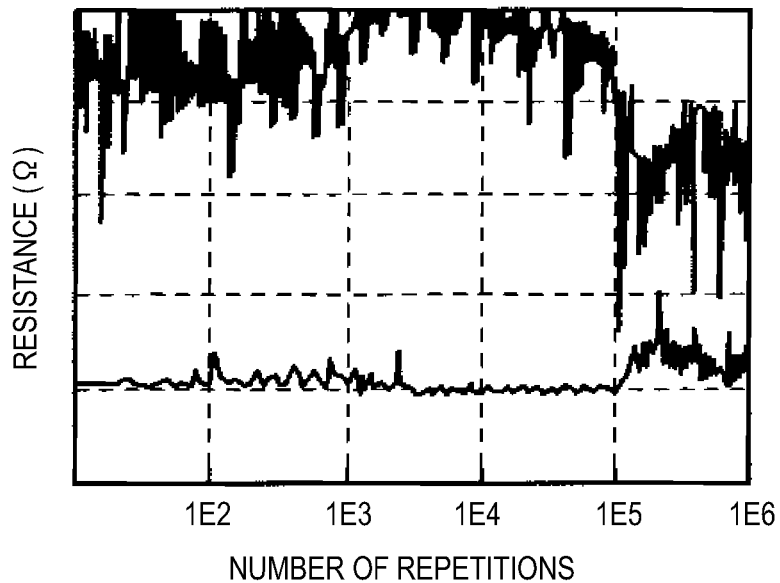
FIGS. 29A and 29B are diagrams showing the results of Example 6-2.
Figure 29B:
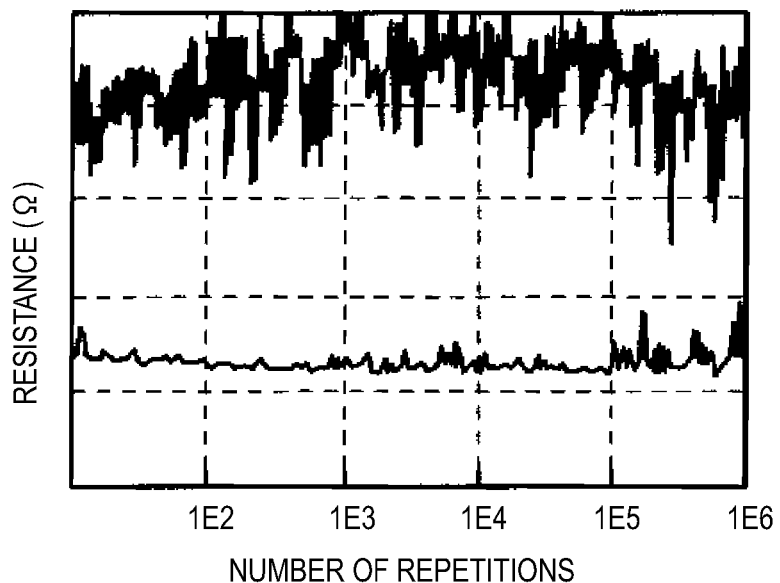

A memory cell array was manufactured similarly to Example 2, except that the intermediate layer 21A was made of Te (thickness: 5 nm), the ion supply layer 21B was made of Ni13Zr13Te33Al40 (thickness: 45 nm), and the upper electrode 30 was made of Zr (thickness: 50 nm). The repeated rewriting characteristics and the resistance separation characteristics were examined for the obtained memory cell array. The obtained results were equivalent to those obtained in Example 2 as shown in FIGS. 29A and 29B.

Example 6-3

Figure 30A:
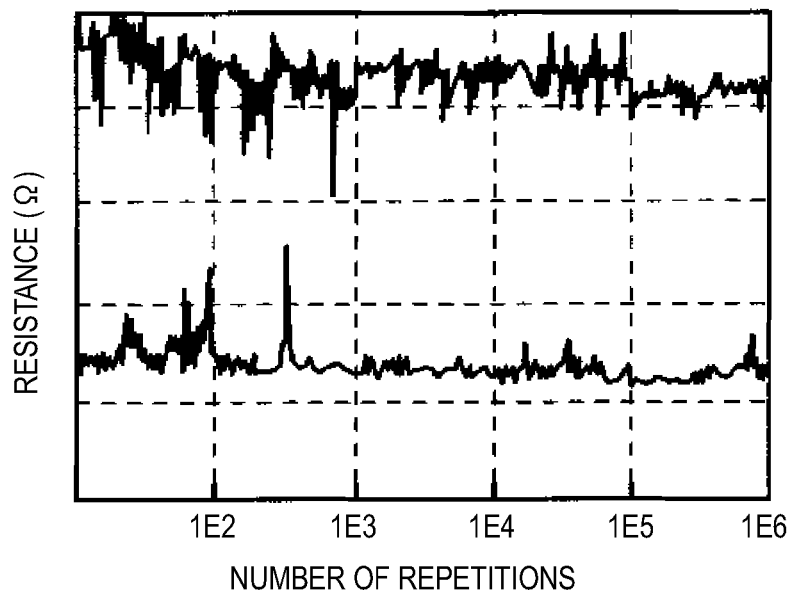
FIGS. 30A and 30B are diagrams showing the results of Example 6-3.
Figure 30B:
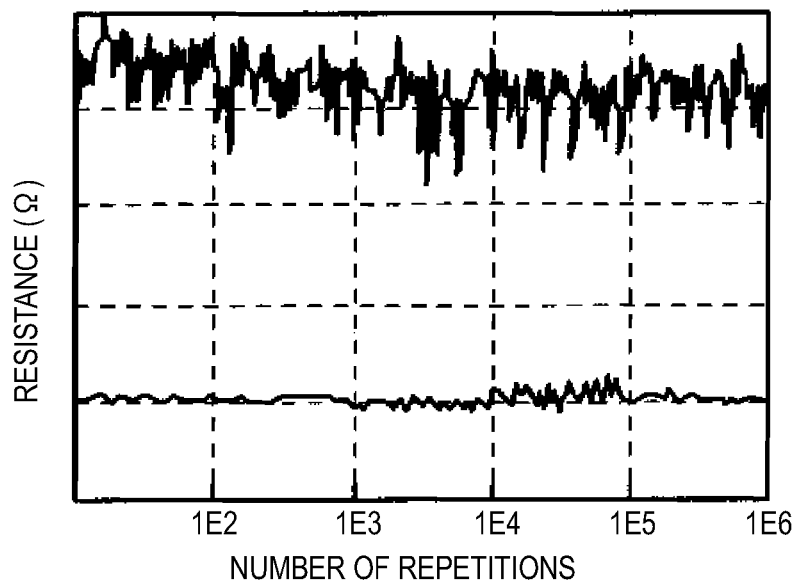

A memory cell array was manufactured similarly to Example 2, except that the intermediate layer 21A was made of Te (thickness: 5 nm), the ion supply layer 21B was made of Co7Zr14Te36Al43 (thickness: 45 nm), and the upper electrode 30 was made of Zr (thickness: 50 nm). The repeated rewriting characteristics and the resistance separation characteristics were examined for the obtained memory cell array. The obtained results were equivalent to those obtained in Example 2 as shown in FIGS. 30A and 30B.

Example 6-4

Figure 31A:
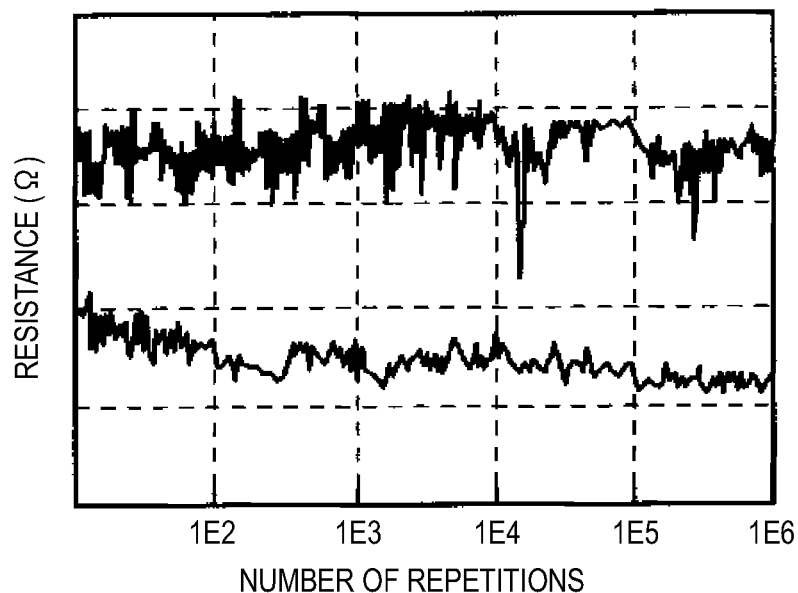
FIGS. 31A and 31B are diagrams showing the results of Example 6-4.
Figure 31B:
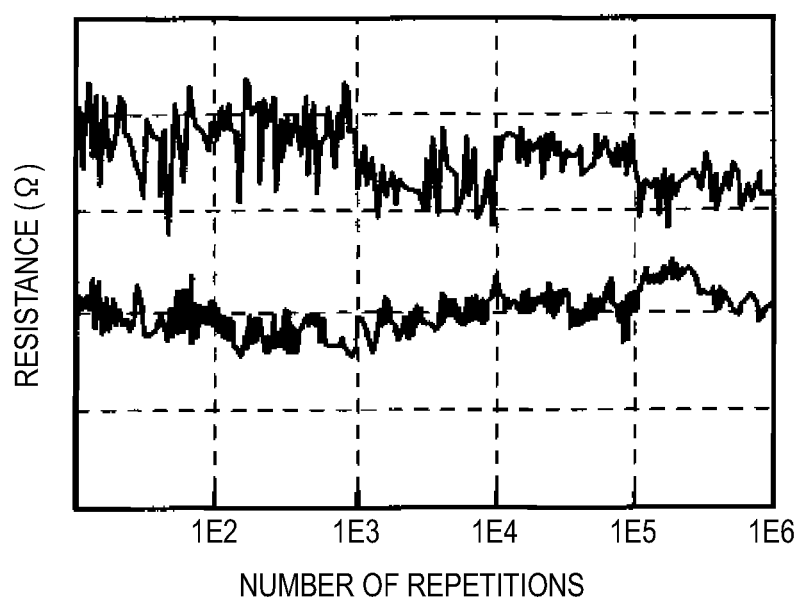

A memory cell array was manufactured similarly to Example 2, except that the intermediate layer 21A was made of Te (thickness: 5 nm), the ion supply layer 21B was made of Mn13Zr13Te33Al40 (thickness: 45 nm), and the upper electrode 30 was made of Zr (thickness: 50 nm). The repeated rewriting characteristics and the resistance separation characteristics were examined for the obtained memory cell array. The obtained results were equivalent to those obtained in Example 2 as shown in FIGS. 31A and 31B.

Example 6-5

Figure 32A:
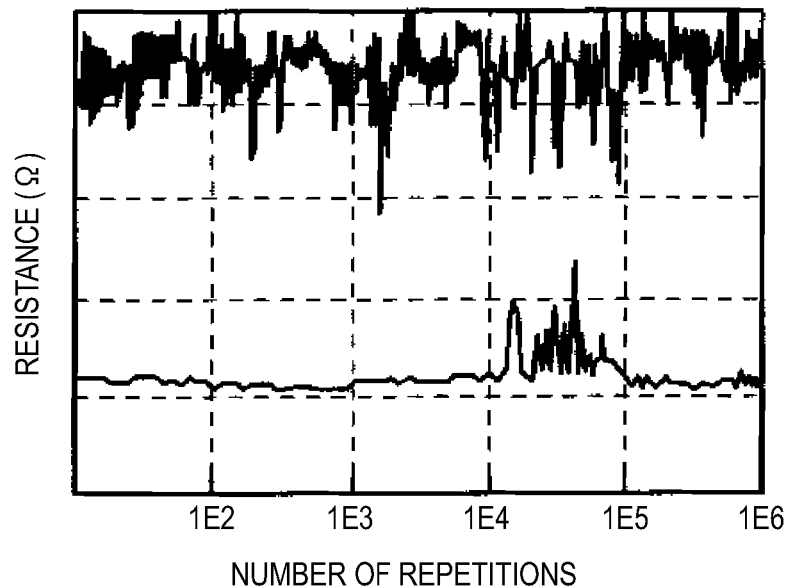
FIGS. 32A and 32B are diagrams showing the results of Example 6-5.
Figure 32B:
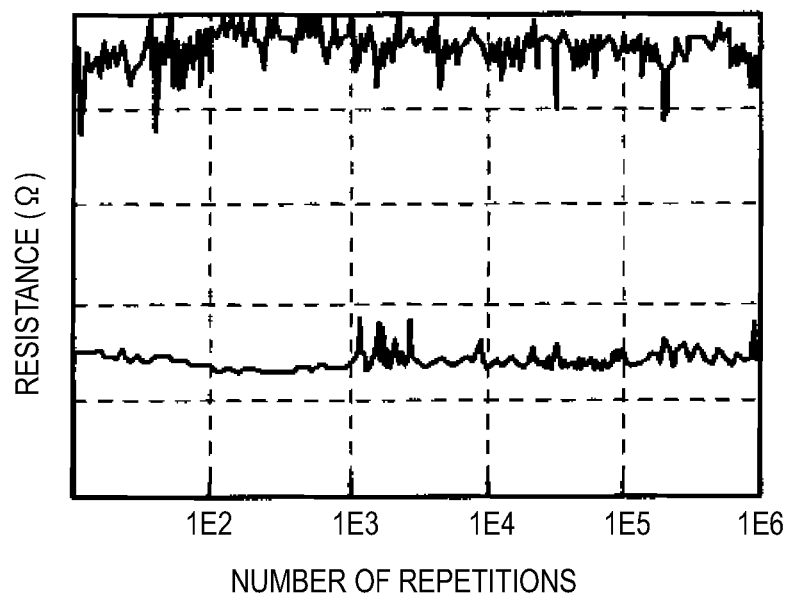

A memory cell array was manufactured similarly to Example 2, except that the intermediate layer 21A was made of Te (thickness: 5 nm), the ion supply layer 21B was made of Fe10Zr16Te39Al35 (thickness: 45 nm), and the upper electrode 30 was made of Zr (thickness: 50 nm). The repeated rewriting characteristics and the resistance separation characteristics were examined for the obtained memory cell array. The obtained results were equivalent to those obtained in Example 2 as shown in FIGS. 32A and 32B.

Example 7-1

Figure 33A:
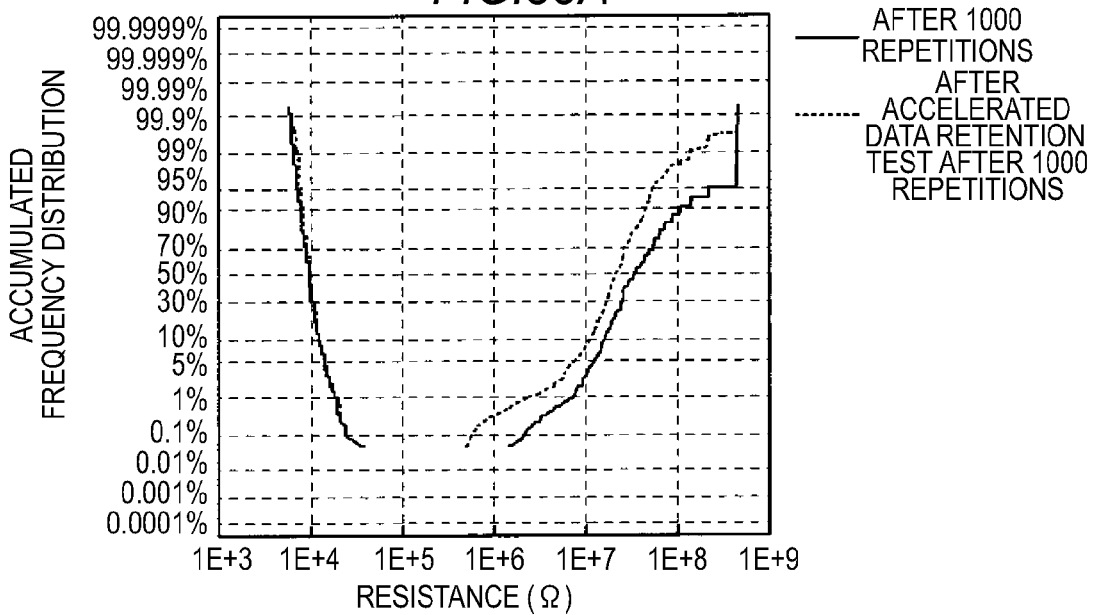
FIGS. 33A to 33C are diagrams showing the results of Example 7-1.
Figure 33B:
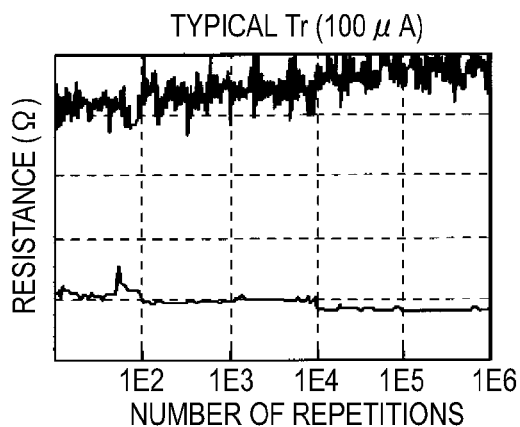
Figure 33C:
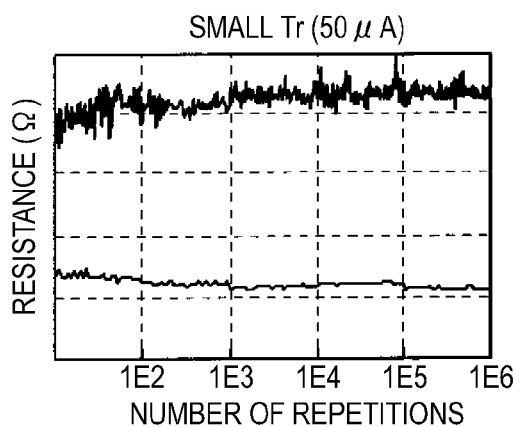

A memory cell array was manufactured similarly to Example 2, except that the ion supply layer 21B was made of Cu10Hf14Te37Al38. The cumulative frequency distribution, the repeated rewriting characteristics, and the resistance separation characteristics were examined for the obtained memory cell array. The obtained results were equivalent to those obtained in Example 2 as shown in FIGS. 33A to 33C.

Example 7-2

Figure 34A:
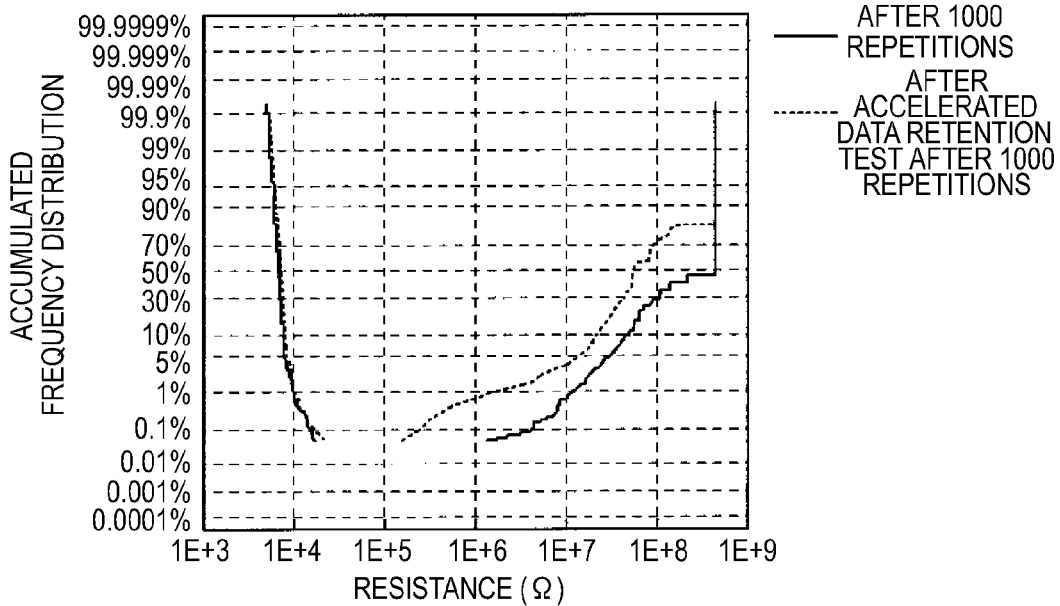
FIGS. 34A to 34C are diagrams showing the results of Example 7-2.
Figure 34B:
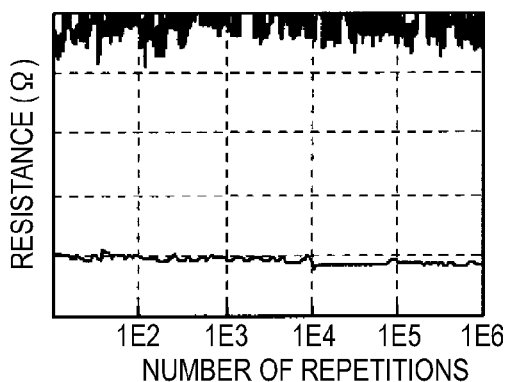
Figure 34C:
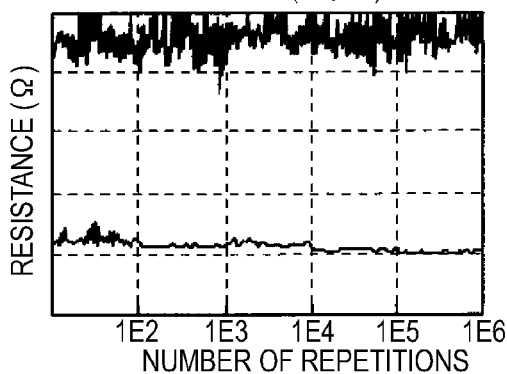

A memory cell array was manufactured similarly to Example 2, except that the ion supply layer 21B was made of Cu10Ti14Te37Al38. The cumulative frequency distribution, the repeated rewriting characteristics, and the resistance separation characteristics were examined for the obtained memory cell array. The obtained results were equivalent to those obtained in Example 2 as shown in FIGS. 34A to 34C.

Example 7-3

Figure 35A:
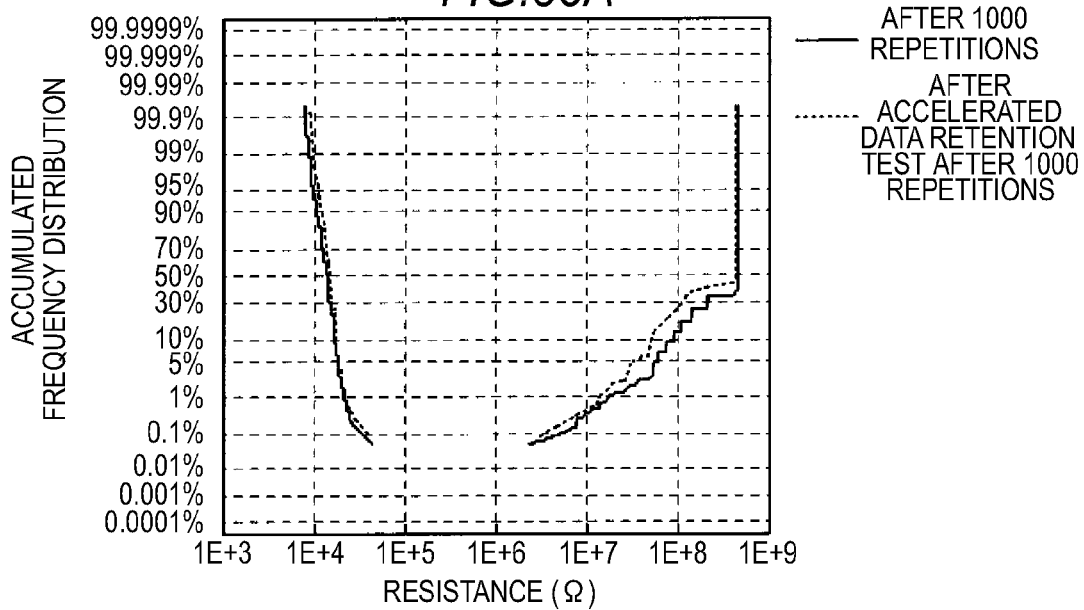
FIGS. 35A to 35C are diagrams showing the results of Example 7-3.
Figure 35B:
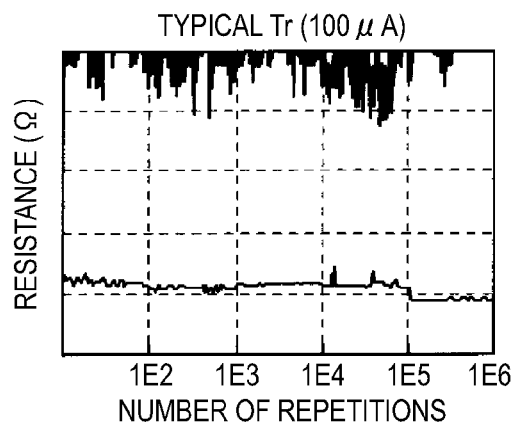
Figure 35C:
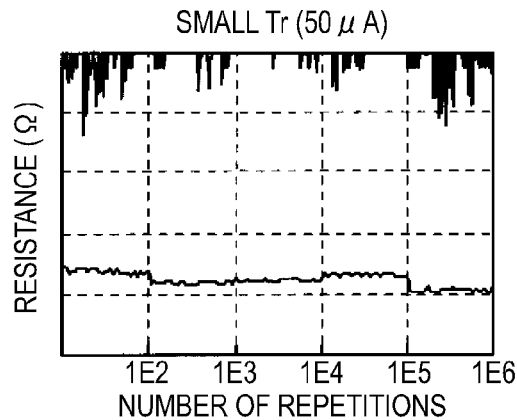
Figure 36A:
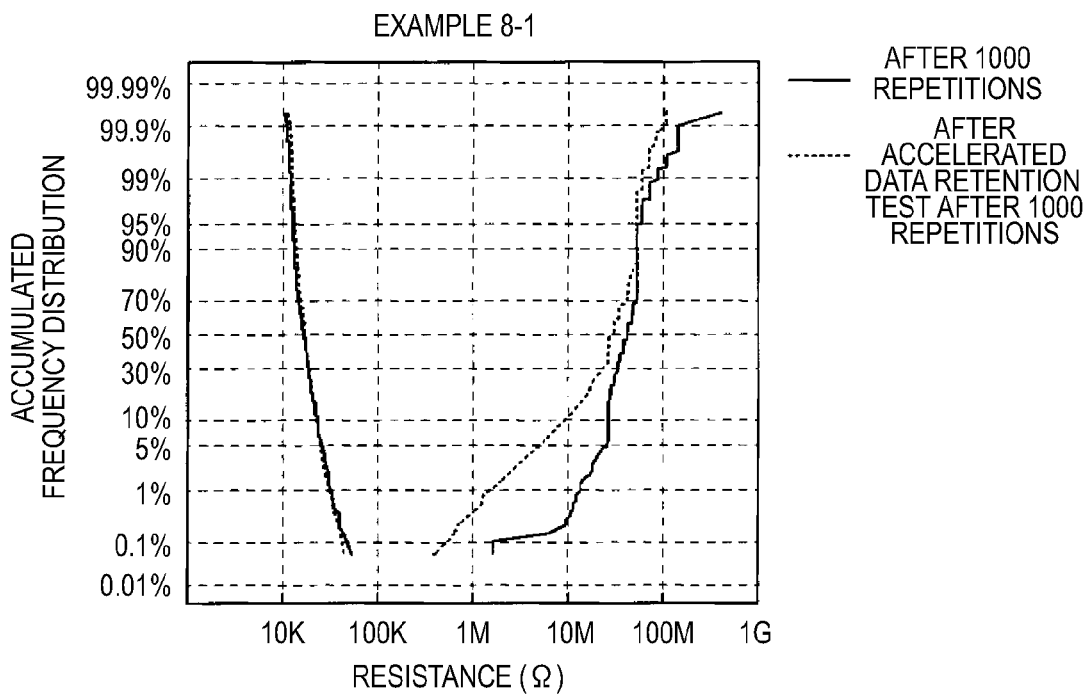
FIGS. 36A and 36B are diagrams showing the results of Examples 8-1 and 8-2.
Figure 36B:
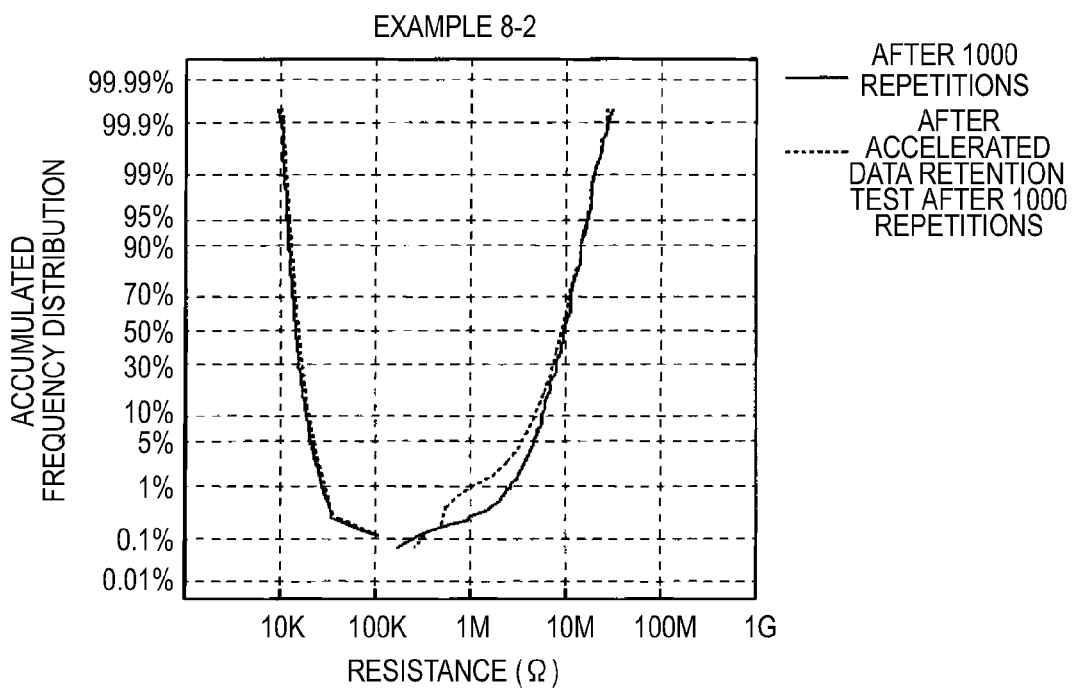

A memory cell array was manufactured similarly to Example 2, except that the intermediate layer 21A was made of Al1Te9 (thickness: 3.2 nm), the ion supply layer 21B was made of Cu12.5Hf7.5Te35.4Al38Ge6.6 (thickness: 60 nm), and the upper electrode 30 was made of tungsten (W) (thickness: 30 nm). The cumulative frequency distribution, the repeated rewriting characteristics, and the resistance separation characteristics were examined for the obtained memory cell array. The obtained results were equivalent to those obtained in Example 2 as shown in FIGS. 35A to 35C.

Examples 8-1 to 8-4

4-kbit memory cell arrays were manufactured similarly to Example 2. At that time, the surface of the lower electrode 10 made of a titanium nitride (TiN) was directly subjected to plasma oxidation, whereby the first layer 22A made of a titanium oxide (TiOx) was formed. The thickness and density of the first layer 22A was examined with respect to the obtained four samples (Examples 8-1 to 8-4) using an X-ray reflectivity technique. The examination results are shown in Table 1.

TABLE 1

| | Thickness (nm) | Density (g/cm³) |
|---|---|---|
| Example 8-1 | 1.15 | 3.314 |
| Example 8-2 | 1.563 | 3.871 |
| Example 8-3 | 2.954 | 3.998 |
| Example 8-4 | 4.762 | 3.046 |

The cumulative frequency distribution was examined for the obtained memory cell arrays of Examples 8-1 to 8-4 after 1000 repetitions of the write and erase operations and subsequently an accelerated temperature test were conducted. The results of the examination are shown in FIGS. 36A, 36B, 37A, and 37B.

As can be understood from Table 1 and FIGS. 36A to 37B, the thickness of the first layer 22A was 1 nm or more for all cases of Examples 8-1 to 8-4, and the written (low-resistance) state and the erased (high-resistance) state were separated. That is, it was confirmed that favorable resistance separation characteristics can be obtained when the thickness of the first layer 22A was 1 nm or more.

Examples 9-1 and 9-2

4-kbit memory cell arrays were manufactured similarly to Example 1. At that time, a Zr film was formed, as the transition metal material film, on the upper surface of the lower electrode 10 made of TiN, and the Zr film was oxidized, whereby a ZrOx layer 22A1 was formed. At that time, a TiOx layer 22A2 was also formed, and the first layer 22A in FIG. 2 was formed. Moreover, although the ZrOx layer 22A1 was formed using Zr in this example, the ZrOx layer 22A1 may be formed by oxidizing ZrN (see FIG. 2).

The thickness and density of the first layer 22A were examined for the obtained two samples (Examples 9-1 and 9-2). In the case of Example 9-1, the thickness and density of the TiOx layer 22A2 were 1.49 nm and 3.86 g/cm³, and the thickness and density of the ZrOx layer 22A1 were 1.48 nm and 5.23 g/cm³. In the case of Example 9-2, the thickness and density of the TiOx layer 22A2 were 2.39 nm and 3.70 g/cm³, and the thickness and density of the ZrOx layer 22A1 were 1.07 nm and 5.17 g/cm³.

In addition, the cumulative frequency distribution was examined for the memory cell arrays of Examples 9-1 and 9-2 after 1000 repetitions of the write and erase operations and subsequently an accelerated temperature test were conducted. The results of the examination are shown in FIGS. 38A and 38B.

Figure 38A:
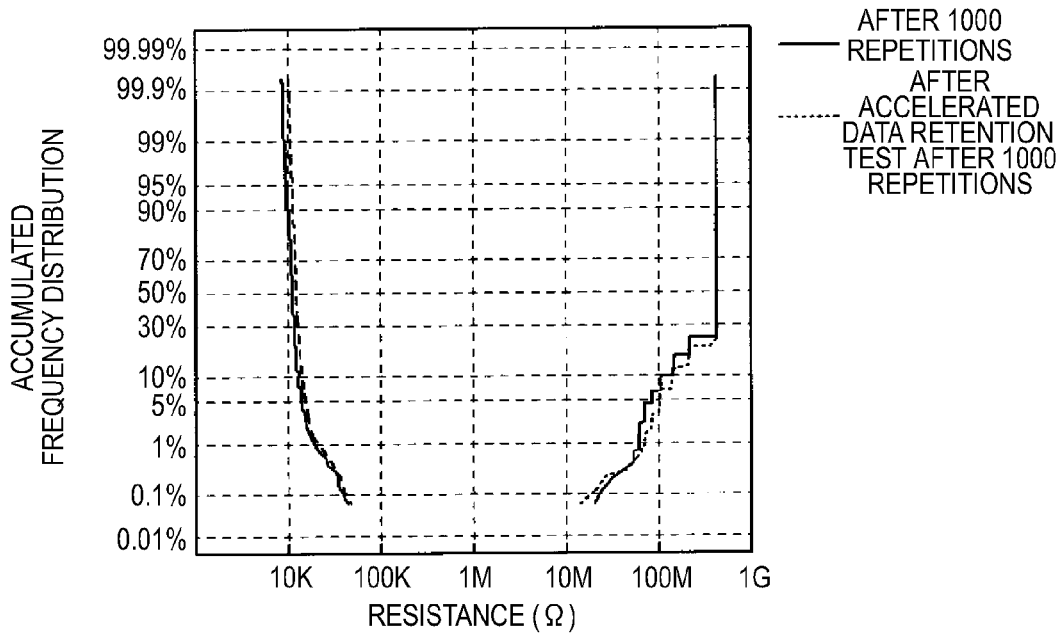
FIGS. 38A and 38B are diagrams showing the results of Examples 9-1 and 9-2.
Figure 38B:
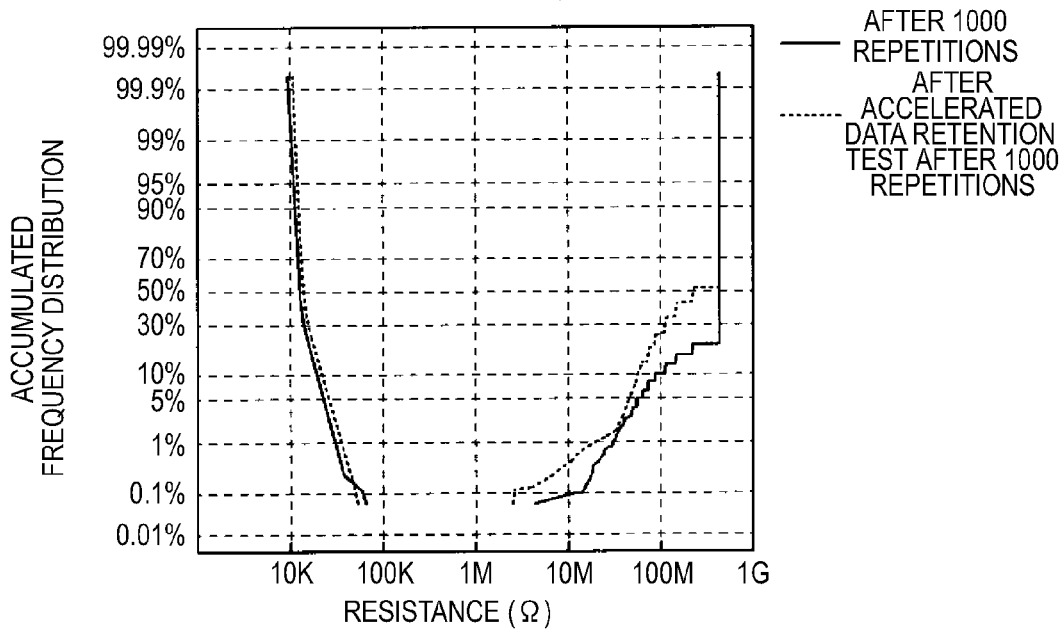

As can be understood from FIGS. 38A and 38B, the thickness of the first layer 22A was 1 nm or more for all cases of Examples 9-1 and 9-2, and the written (low-resistance) state and the erased (high-resistance) state were separated. That is, it was confirmed that favorable resistance separation characteristics can be obtained when the thickness of the first layer 22A was 1 nm or more.

Example 10

First Layer 22A Made of Oxynitride

A memory cell array having the memory component 1 was manufactured similarly to the second embodiment. First, a ZrN film was formed to a thickness of 0.5 nm on a CMOS circuit, on which the plug of the lower electrode 10 made of TiN is formed, by reactive sputtering. As the deposition conditions, the voltage applied to the Zr target was 3.5 kW, the flow rates of argon (Ar) and nitrogen (N₂) supplied into a chamber were 25 sccm and 300 sccm, respectively, and the total pressure was $2.1E^{-3}$ (Torr). The partial pressure of Ar atmosphere was estimated as $2.0E^{-4}$ (Torr) and the partial pressure of nitrogen atmosphere was estimated as $1.9E^{-3}$ (Torr). Subsequently, the ZrN film was oxidized by plasma oxidation, whereby the first layer 22A made of ZrON was formed.

Subsequently, the intermediate layer 21A made of Te was formed to a thickness of 5 nm, and the ion supply layer 21B made of CuZrTeAlGe (Cu 11 at %-Zr 11 at %-Te 30 at %-Al 40 at %-Ge 8 at %) was formed to a thickness of 60 nm. After that, the upper electrode 30 made of W was formed to a thickness of 50 nm. The process of this example can be summarized as follows.

TiN/ZrN (0.5 nm)/plasma oxidation/Te (5 nm)/CuZrTeAlGe (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 6 was manufactured.

Figure 39A:
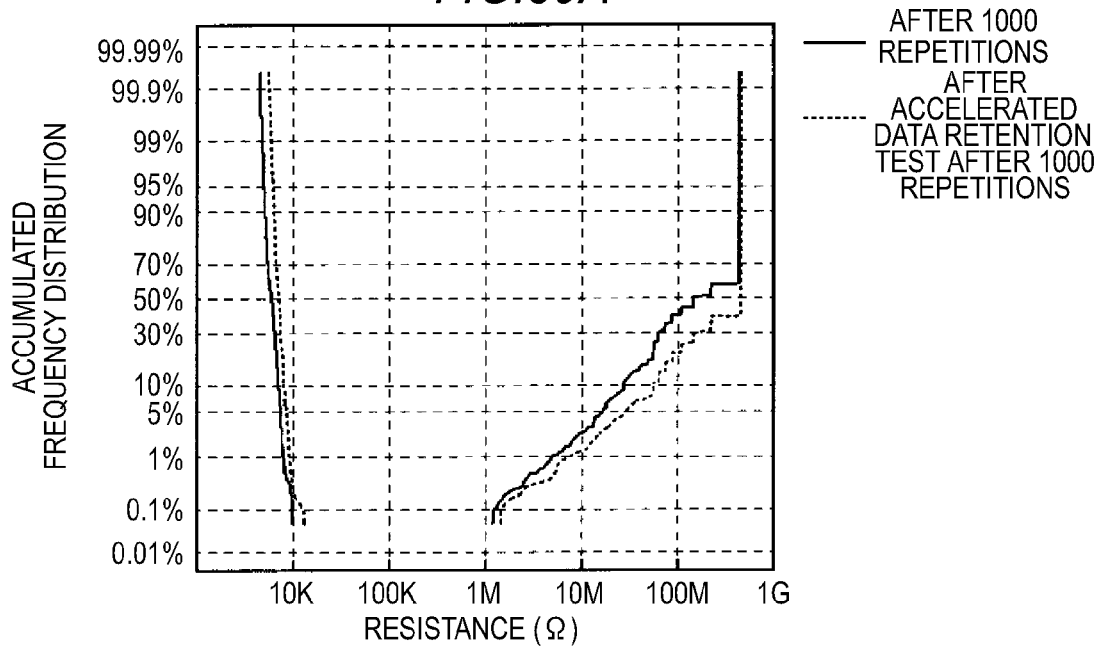
FIGS. 39A to 39C are diagrams showing the results of Example 10.
Figure 39B:
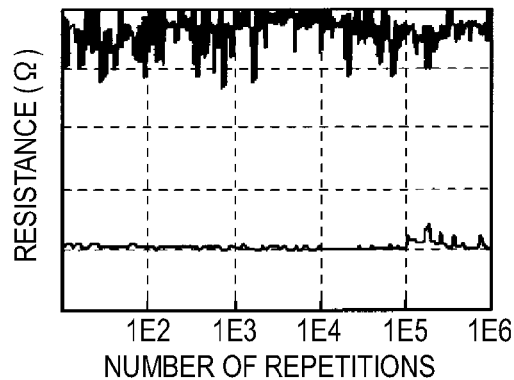
Figure 39C:
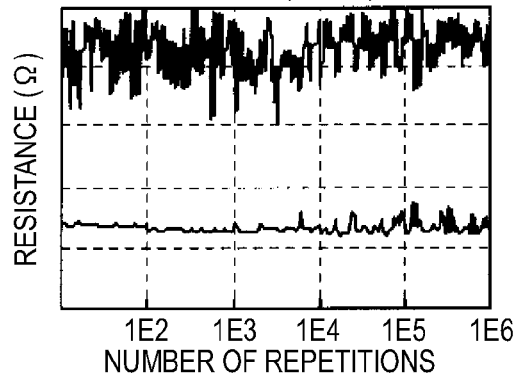

The cumulative frequency distribution, the repeated rewriting characteristics, and the resistance separation characteristics were examined for the obtained memory cell array of Example 10. As shown in FIGS. 39A to 39C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10.

Example 11

Transition Metal Added in Intermediate Layer 21A

A memory cell array having the memory component 1 was manufactured similarly to the third embodiment. First, a ZrN film was formed to a thickness of 0.5 nm on a CMOS circuit, on which the plug of the lower electrode 10 made of TiN is formed, by reactive sputtering similarly to Example 10. Subsequently, the ZrN film was oxidized by plasma oxidation, whereby the first layer 22A made of ZrON was formed.

Subsequently, the intermediate layer 21A made of Te95Zr5 was formed to a thickness of 5 nm, and the ion supply layer 21B made of CuZrTeAlGe (Cu 11 at %-Zr 11 at %-Te 30 at %-Al 40 at %-Ge 8 at %) was formed to a thickness of 60 nm. After that, the upper electrode 30 made of tungsten (W) was formed to a thickness of 50 nm. The process of this example can be summarized as follows.

TiN/ZrN (0.5 nm)/plasma oxidation/Te95Zr5 (5 nm)/CuZrTeAlGe (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 9 was manufactured.

Figure 40A:
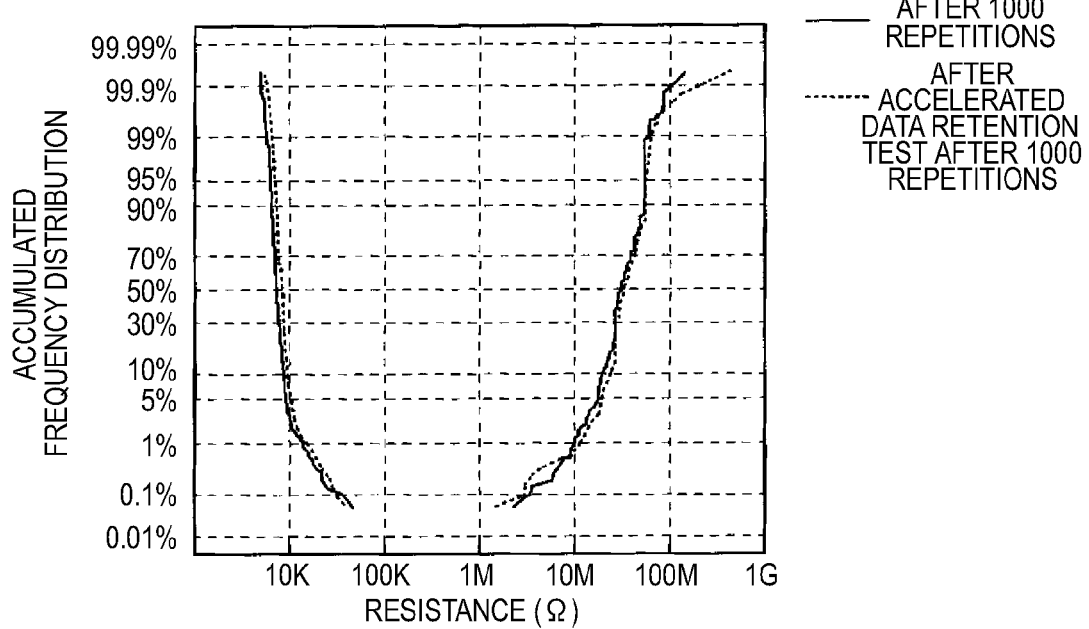
FIGS. 40A to 40C are diagrams showing the results of Example 11.
Figure 40B:
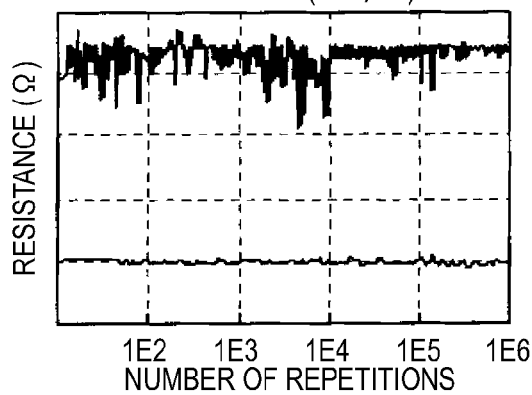
Figure 40C:
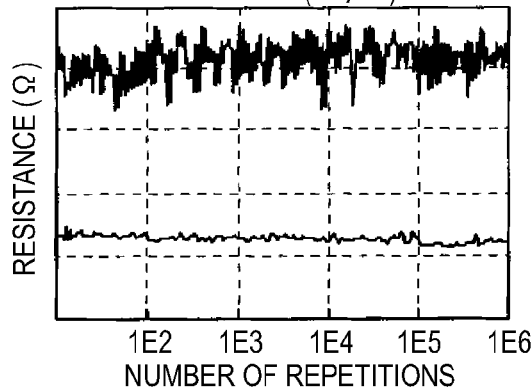

The cumulative frequency distribution, the repeated rewriting characteristics, and the resistance separation characteristics were examined for the obtained memory cell array of Example 11. As shown in FIGS. 40A to 40C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

Figure 41A:
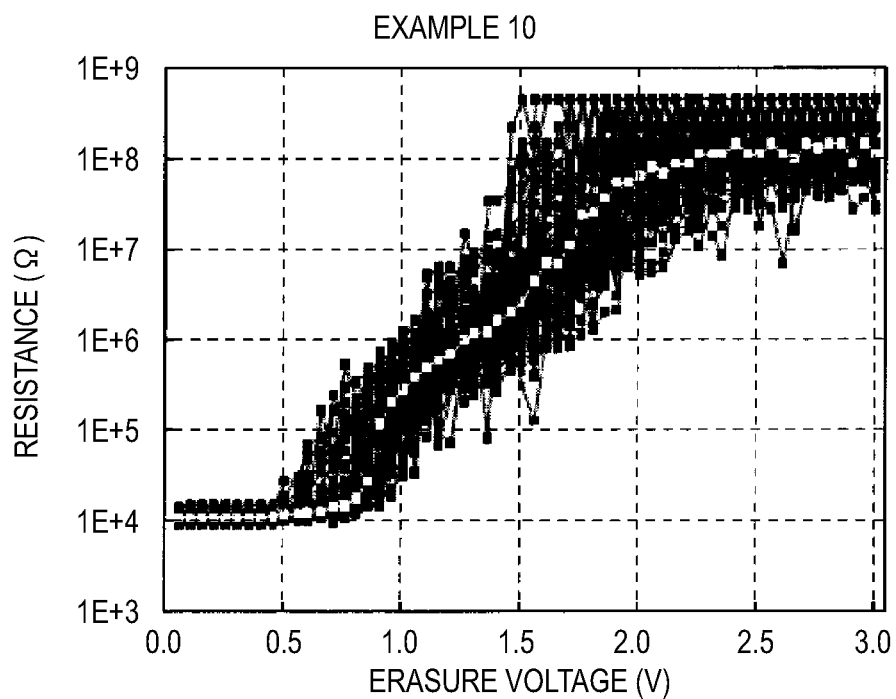
FIGS. 41A and 41B are diagrams showing the results of examination of erasure characteristics of Examples 10 and 11.
Figure 41B:
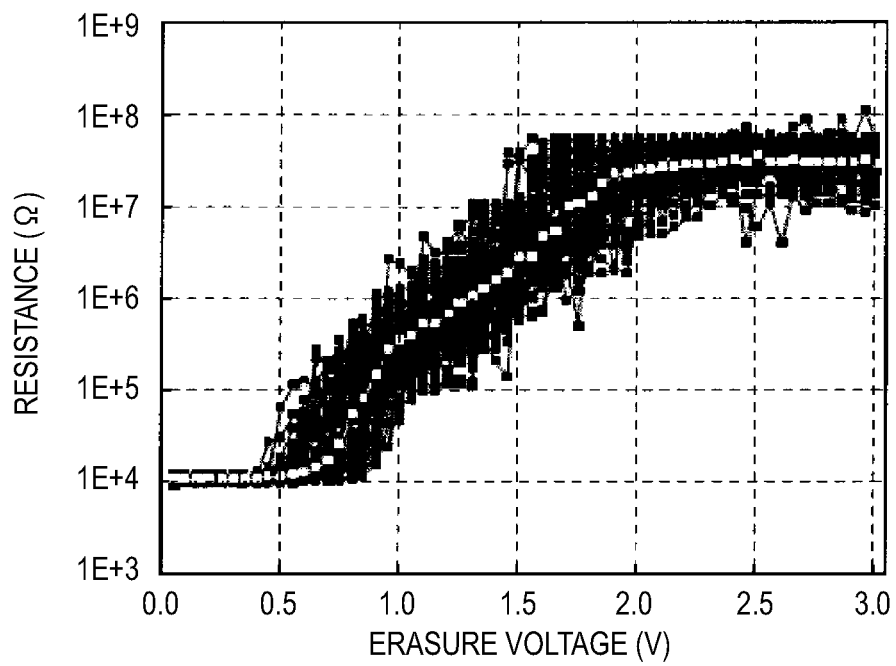

Moreover, the changes in the resistance were examined for the memory cell arrays of Examples 10 and 11 when a voltage of 0 to 3 V was applied in the erasure direction to 60 components in the low-resistance state in which a write operation was performed. The examination results are shown in FIGS. 41A and 41B. As can be understood from FIGS. 41A and 41B, it was confirmed that the components have not transitioned to the low-resistance state in response to the erasure voltage within the measurement range, and showed erasure characteristics equivalent or superior to those obtained in Example 1.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Zr was added in the intermediate layer 21A as the transition metal.

Example 12

Transition Metal Added in Intermediate Layer 21A

A memory cell array was manufactured similarly to Example 11 except that WN was used for the lower electrode 10. The process of this example can be summarized as follows.

WN/ZrN (0.5 nm)/plasma oxidation/Te95Zr5 (5 nm)/CuZrTeAlGe (60 nm)/W (50 nm)

Figure 42A:
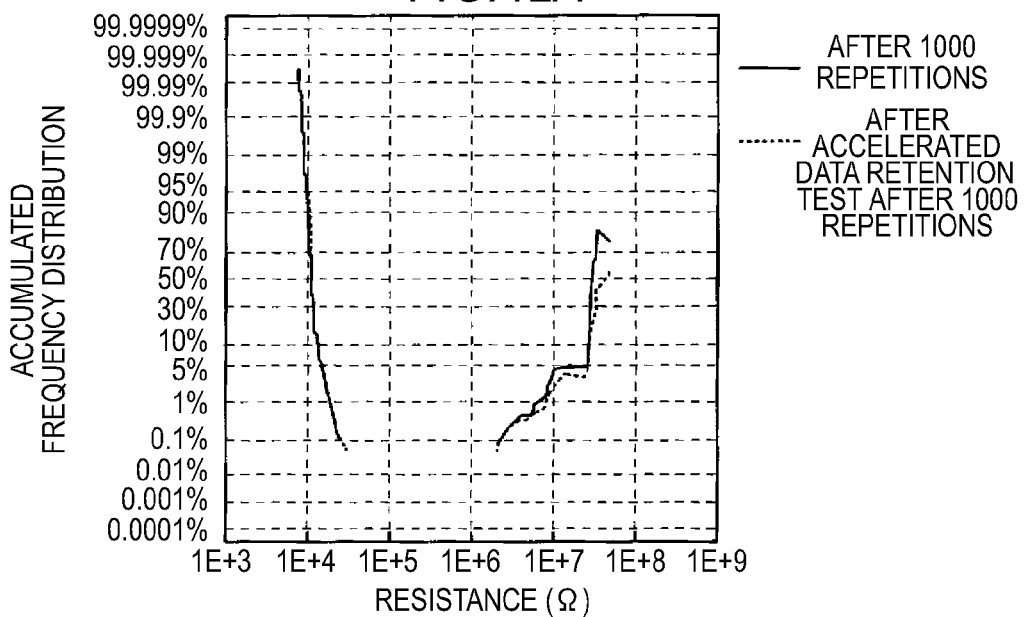
FIGS. 42A to 42C are diagrams showing the results of Example 12.
Figure 42B:
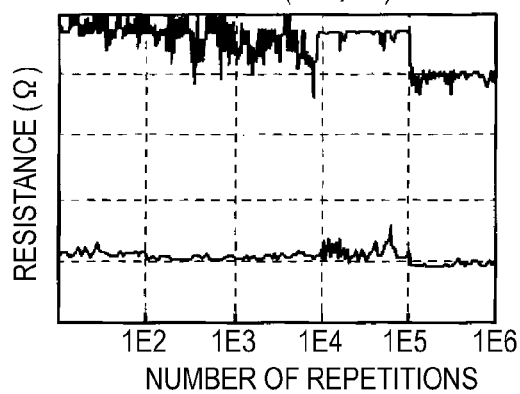
Figure 42C:
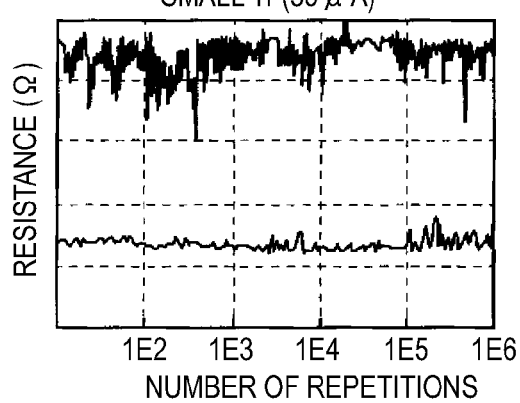
Figure 43A:
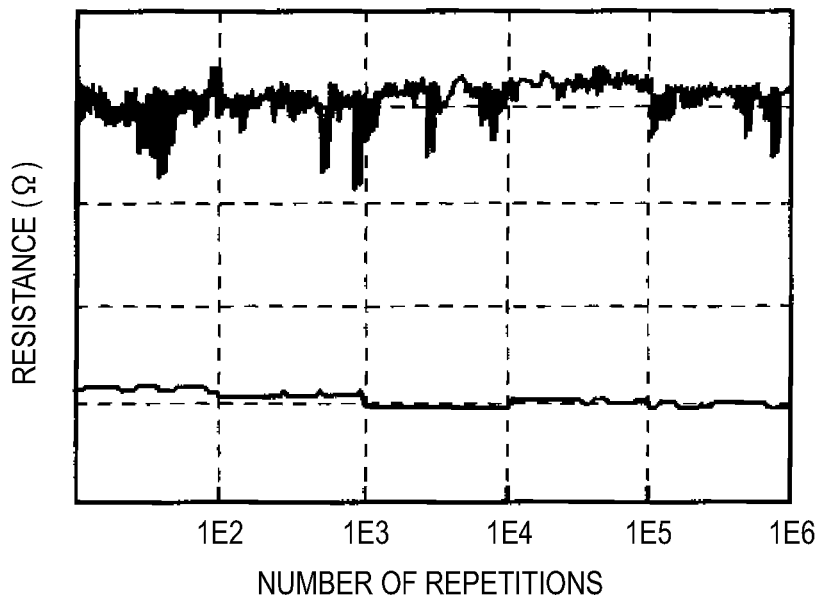
FIGS. 43A and 43B are diagrams showing the results of Example 13-1.
Figure 43B:
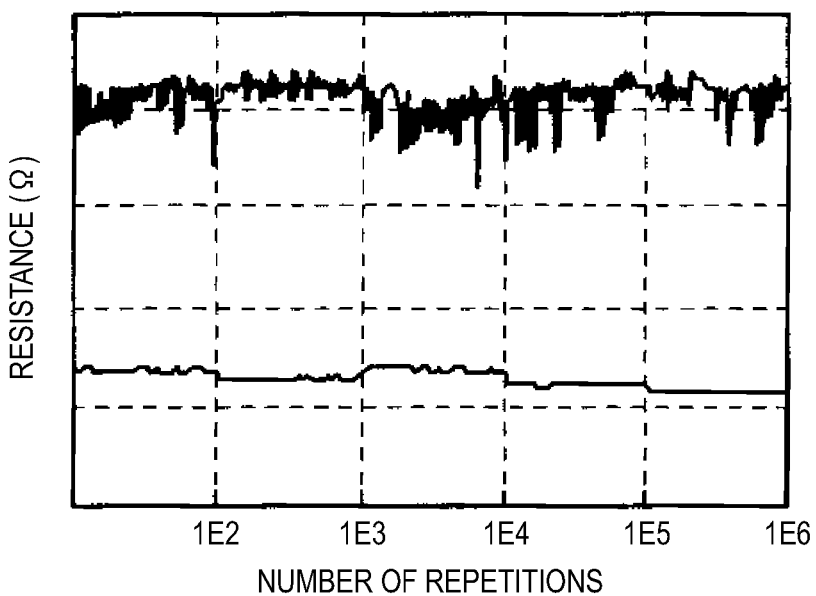
Figure 44A:
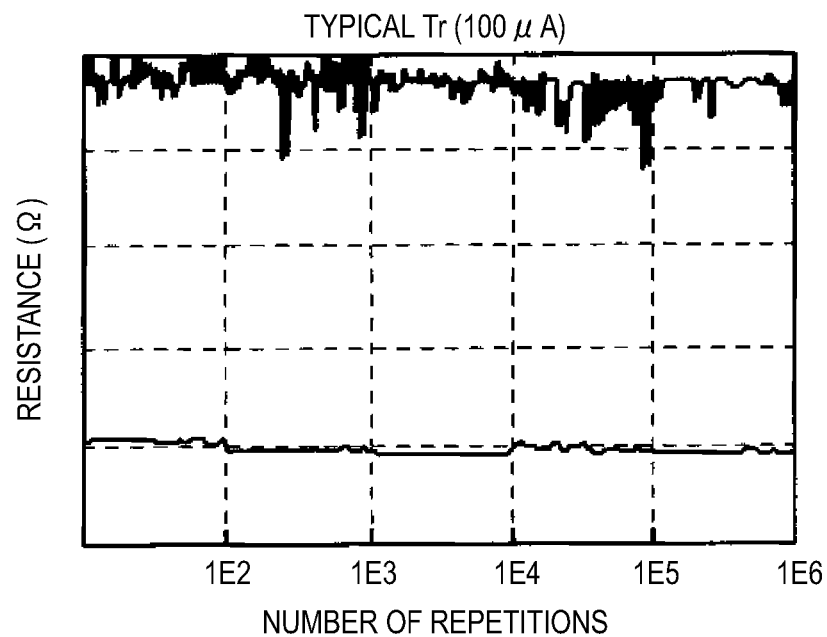
FIGS. 44A and 44B are diagrams showing the results of Example 13-2.
Figure 44B:
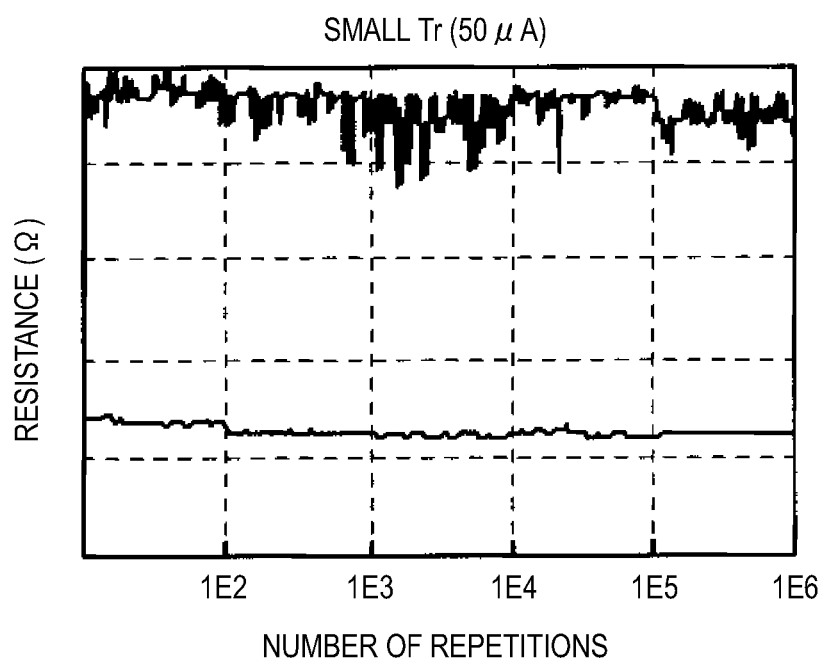
Figure 45A:
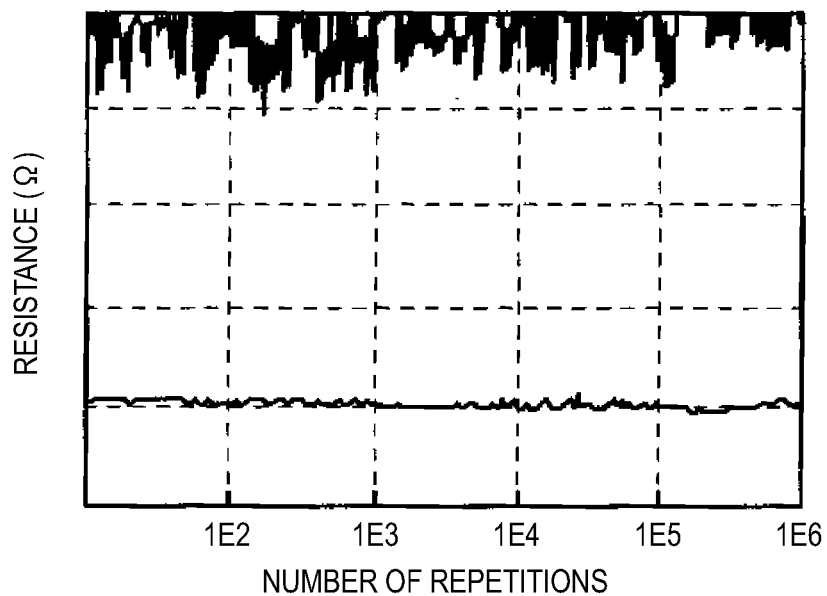
FIGS. 45A and 45B are diagrams showing the results of Example 13-3.
Figure 45B:
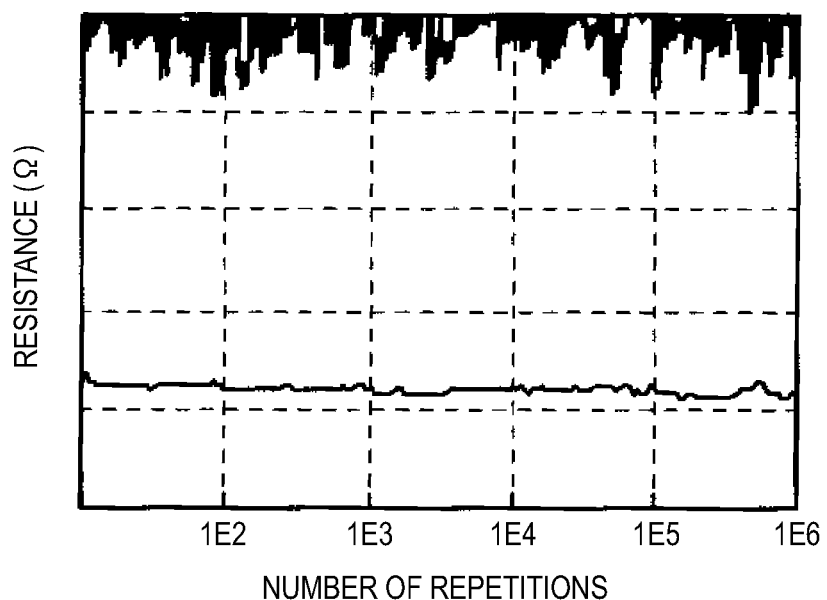

The cumulative frequency distribution, the repeated rewriting characteristics, and the resistance separation characteristics were examined for the obtained memory cell array of Example 12. As shown in FIGS. 42A to 42C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that even when the lower electrode 10 was made of WN instead of TiN, favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Zr was added in the intermediate layer 21A as the transition metal.

Examples 13-1 to 13-3

Other Materials of Oxynitride of First Layer

Memory cell arrays having the memory component 1 were manufactured similarly to Example 10. At that time, on the CMOS circuit on which the plug of the lower electrode 10 made of TiN is formed, a TiN film, a tantalum nitride (TaN) film, and a hafnium nitride (HfN) film were formed respectively for Examples 13-1, 13-2, and 13-3. The respective films were oxidized by plasma oxidation, whereby the first layer 22A made of TiON, tantalum oxynitride (TaON), and hafnium oxynitride (HfON) respectively for Examples 13-1, 13-2, and 13-3 was formed.

The repeated rewriting characteristics and the resistance separation characteristics were examined for the obtained memory cell arrays of Examples 13-1 to 13-3. As shown in FIGS. 43A and 43B to FIGS. 45A and 45B, favorable characteristics were obtained as compared to Comparative Example 1 where the transition metal oxide or the transition metal oxynitride of the embodiment was not used.

That is, it was understood that favorable resistance separation characteristics and favorable repetition characteristics were obtained even when the first layer 22A was made of TiON, TaON, or HfON.

Example 14

Oxygen Added in Ion Supply Layer 21B

A memory cell array having the memory component 1 was manufactured similarly to the fourth embodiment. First, a Zr film was formed to a thickness of 0.5 nm on a CMOS circuit, on which the plug of the lower electrode 10 made of TiN is formed, by reactive sputtering similarly to Example 10. Subsequently, the ZrN film was oxidized by plasma oxidation, whereby the first layer 22A made of ZrON was formed.

Subsequently, the intermediate layer 21A made of Te95Zr5 was formed to a thickness of 5 nm, and the ion supply layer 21B made of CuZrTeAlGeO was formed to a thickness of 60 nm. As a method of doping oxygen to the ion supply layer 21B, a reactive sputtering method was used. As the deposition conditions, a voltage having the same magnitude as that used for depositing the ion supply layer made of CuZrTeAlGe in Example 1 was applied to the respective targets. The flow rates of argon and oxygen ($O_2$) supplied into a chamber were 25 sccm and 5 sccm, respectively, and the total pressure was $2.4E^4$ (Torr). The partial pressure of Ar atmosphere was estimated as $2.0E^{-4}$ (Torr) and the partial pressure of oxygen atmosphere was estimated as $4.0E^{-5}$ (Torr).

After that, the upper electrode 30 made of W was formed to a thickness of 50 nm. The process of this example can be summarized as follows.

TiN/ZrN (0.5 nm)/plasma oxidation/Te95Zr5 (5 nm)/CuZrTeAlGeO (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 11 was manufactured.

Figure 46A:
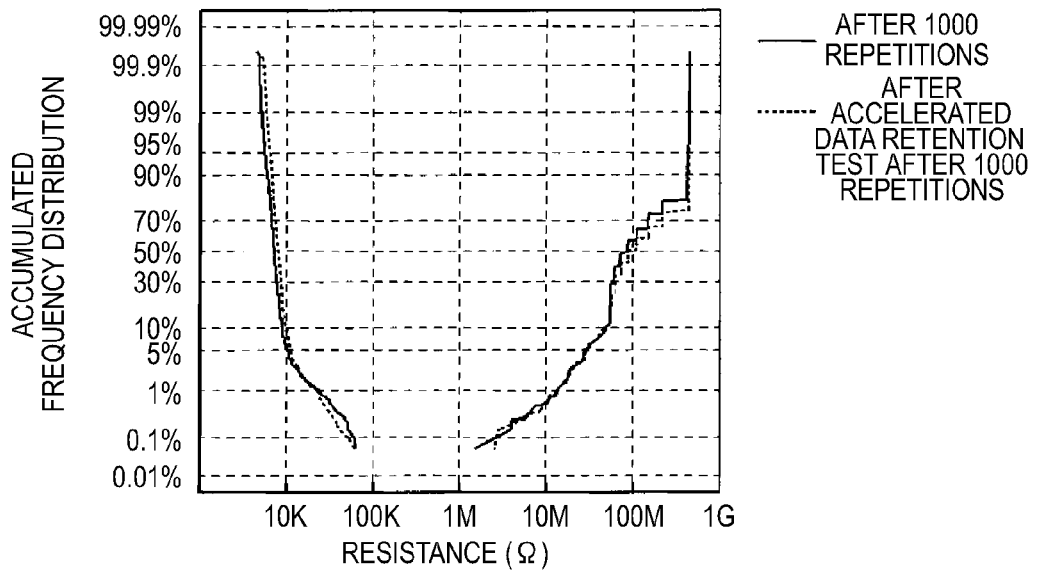
FIGS. 46A to 46C are diagrams showing the results of Example 14.
Figure 46B:
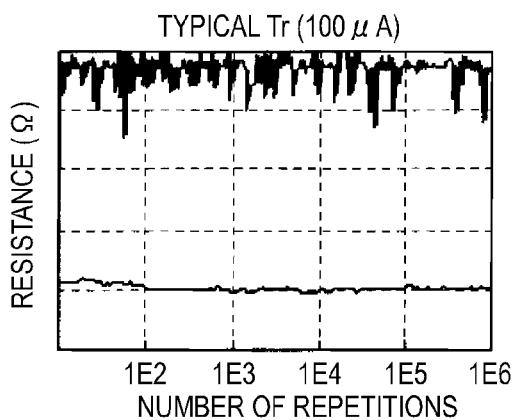
Figure 46C:
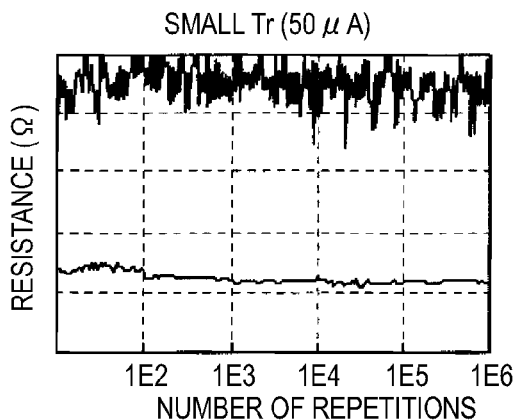

The cumulative frequency distribution, the repeated rewriting characteristics, and the resistance separation characteristics were examined for the obtained memory cell array of Example 14. As shown in FIGS. 46A to 46C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and oxygen was added in the ion supply layer 21B.

Example 15

Oxygen and Transition Metal Added in Intermediate Layer 21A

A memory cell array having the memory component 1 was manufactured similarly to the fourth embodiment. First, a ZrN film was formed to a thickness of 0.5 nm on a CMOS circuit, on which the plug of the lower electrode 10 made of TiN is formed, by reactive sputtering similarly to Example 10. Subsequently, the ZrN film was oxidized by plasma oxidation, whereby the first layer 22A made of ZrON was formed.

Subsequently, the intermediate layer 21A made of TeZrO was formed to a thickness of 5 nm. As a method of doping oxygen to the intermediate layer 21A, a reactive sputtering method was used. As the deposition conditions, the flow rates of Ar and oxygen ($O_2$) supplied into a chamber were 25 sccm and 5 sccm, respectively, similarly to Example 11. The partial pressure of Ar atmosphere was estimated as $2.0E^{-4}$ (Torr) and the partial pressure of oxygen atmosphere was estimated as $4.0E^{-5}$ (Torr).

After that, the ion supply layer 21B made of CuZrTeAlGe (Cu 11 at %-Zr 11 at %-Te 30 at %-Al 40 at %-Ge 8 at %) was formed to a thickness of 60 nm, and finally, the upper electrode 30 made of W was formed to a thickness of 50 nm. The process of this example can be summarized as follows.

TiN/ZrN (0.5 nm)/plasma oxidation/TeZrO (5 nm)/CuZrTeAlGe (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 11 was manufactured.

Figure 47A:
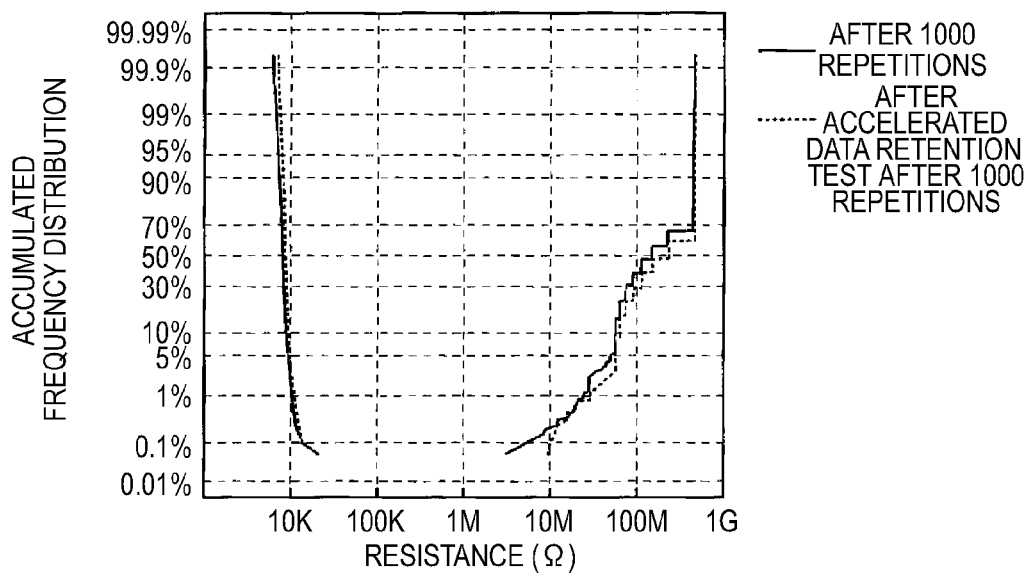
FIGS. 47A to 47C are diagrams showing the results of Example 15.
Figure 47B:
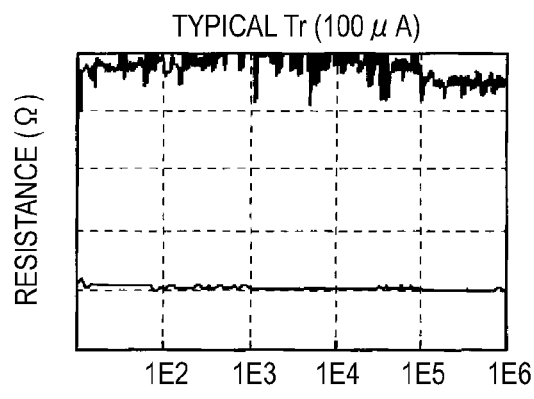
Figure 47C:
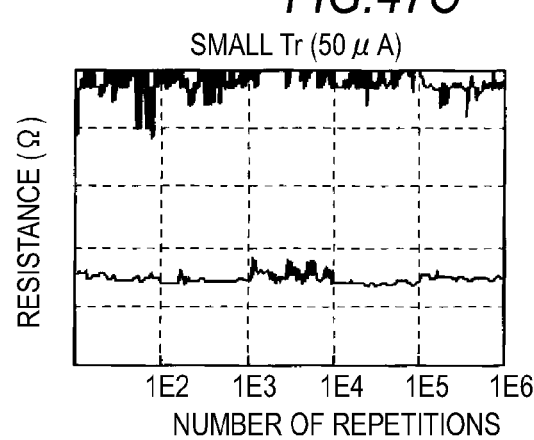

The cumulative frequency distribution, the repeated rewriting characteristics, and the resistance separation characteristics were examined for the obtained memory cell array of Example 15. As shown in FIGS. 47A to 47C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Zr and oxygen were added in the intermediate layer 21A as the transition metal.

As can be understood from comparison between Example 10 and Example 15, the erasure-side resistance distribution of Example 15 is on the higher-resistance side than Example 10. This is considered to be attributable to the fact that by doping oxygen to the intermediate layer 21A, the resistivity of the intermediate layer 21A increases. Thus, at the time of the erase operation, the voltage applied to the intermediate layer 21A increases, and the metal ions can easily return to the ion supply layer 21B. In addition, a reaction in which the metal element of the conduction path is ionized to be dissolved into the ion source layer 21 or combined with Te or the like, thus realizing a higher resistance state, is likely to proceed.

Example 16

Only Oxygen but no Transition Metal Added in Intermediate Layer 21A and Oxygen Added in Ion supply Layer 21B A memory cell array having the memory component 1 was manufactured similarly to the fourth embodiment. First, a ZrN film was formed to a thickness of 0.5 nm on a CMOS circuit, on which the plug of the lower electrode 10 made of TiN is formed, by reactive sputtering similarly to Example 10. Subsequently, the ZrN film was oxidized by plasma oxidation, whereby the first layer 22A made of ZrON was formed.

Subsequently, the intermediate layer 21A made of TeO was formed to a thickness of 5 nm similarly to Example 15. After that, the ion supply layer 21B made of CuZrTeAlGe (Cu 11 at %-Zr 11 at % Te 30 at %-Al 40 at %-Ge 8 at %) including oxygen (O) was formed to a thickness of 60 nm similarly to Example 14. Finally, the upper electrode 30 made of W was formed to a thickness of 50 nm. The process of this example can be summarized as follows.

TiN/ZrN (0.5 nm)/plasma oxidation/TeO (5 nm)/CuZrTeAlGeO (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 11 was manufactured.

Figure 48A:
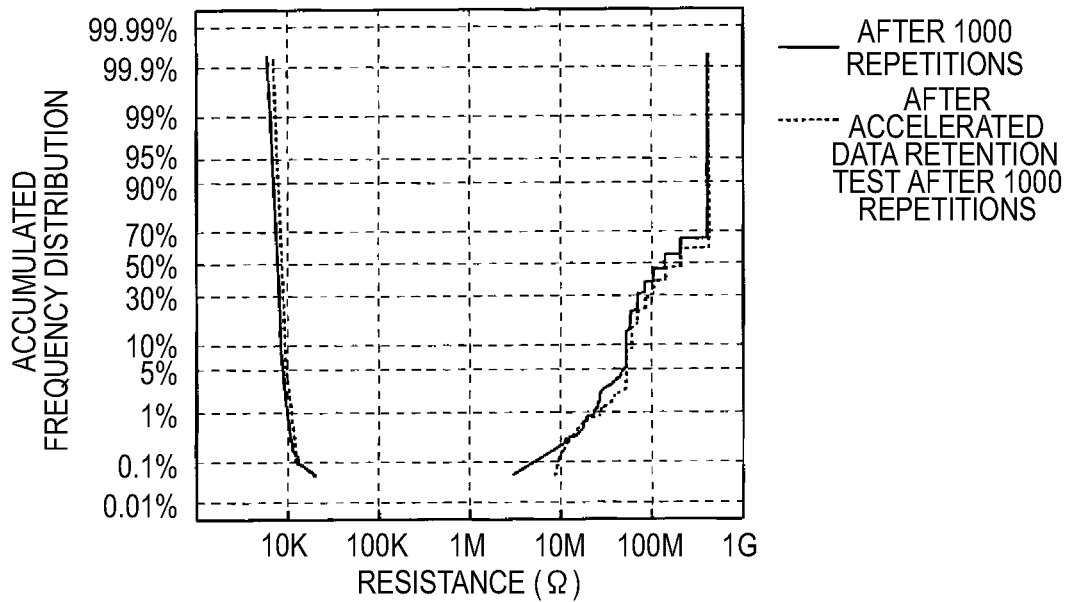
FIGS. 48A to 48C are diagrams showing the results of Example 16.
Figure 48B:
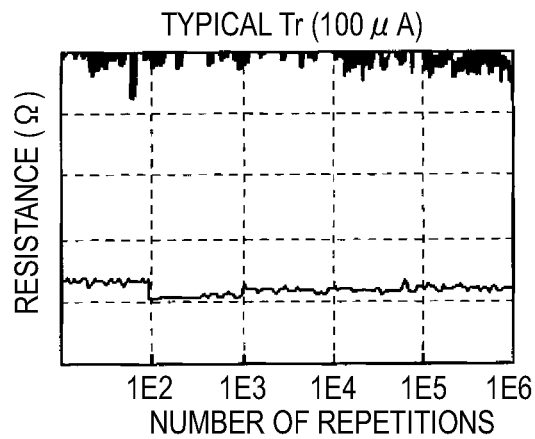
Figure 48C:
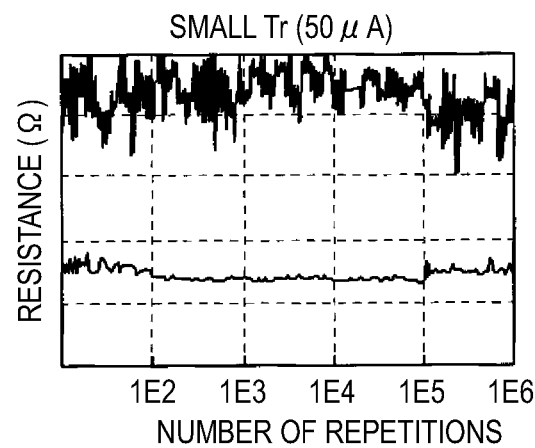

The cumulative frequency distribution, the repeated rewriting characteristics, and the resistance separation characteristics were examined for the obtained memory cell array of Example 16. As shown in FIGS. 48A to 48C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and oxygen was added in both the intermediate layer 21A and the ion supply layer 21B.

Example 17

Transition Metal and Oxygen Added in Intermediate Layer 21A and Oxygen Added in Ion supply Layer 21B A memory cell array having the memory component 1 was manufactured similarly to the fourth embodiment. First, a ZrN film was formed to a thickness of 0.5 nm on a CMOS circuit, on which the plug of the lower electrode 10 made of TiN is formed, by reactive sputtering similarly to Example 10. Subsequently, the ZrN film was oxidized by plasma oxidation, whereby the first layer 22A made of ZrON was formed.

Subsequently, the intermediate layer 21A made of TeZrO was formed to a thickness of 5 nm similarly to Example 15. After that, the ion supply layer 21B made of CuZrTeAlGe (Cu 11 at %-Zr 11 at %-Te 30 at %-Al 40 at %-Ge 8 at %) including oxygen (O) was formed to a thickness of 60 nm similarly to Example 14. Finally, the upper electrode 30 made of W was formed to a thickness of 50 nm. The process of this example can be summarized as follows.

TiN/ZrN (0.5 nm)/plasma oxidation/TeZrO (5 nm)/CuZrTeAlGeO (60 nm)/W (50 nm)

After the laminated film of the lower electrode 10, the memory layer 20, and the upper electrode 30 was formed, the laminated film was subjected to patterning and heat treatment similarly to Example 1. In this way, a memory cell array having the memory component 1 shown in FIG. 11 was manufactured.

Figure 49A:
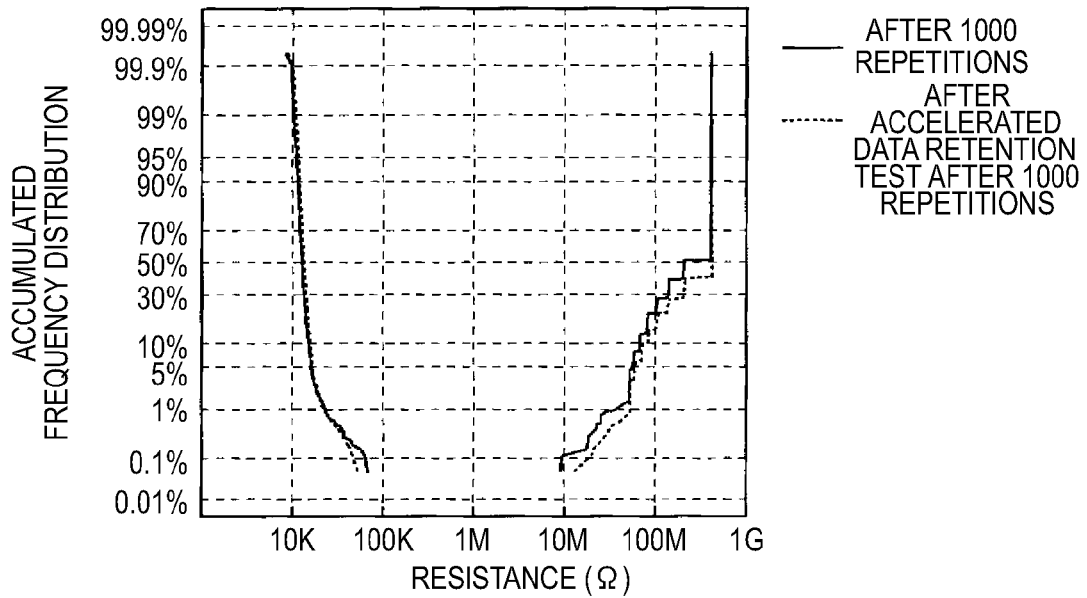
FIGS. 49A to 49C are diagrams showing the results of Example 17.
Figure 49B:
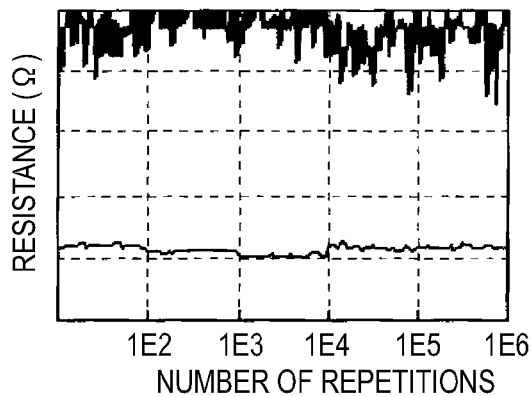
Figure 49C:
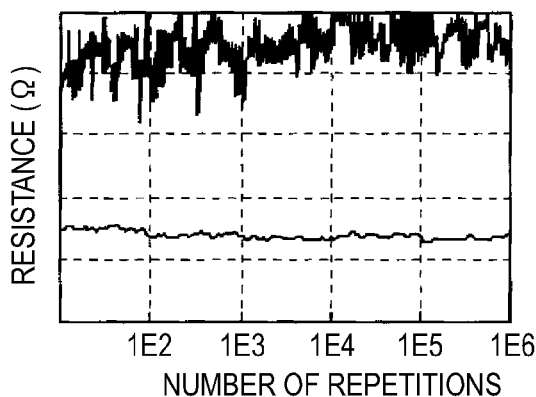

The cumulative frequency distribution, the repeated rewriting characteristics, and the resistance separation characteristics were examined for the obtained memory cell array of Example 17. As shown in FIGS. 49A to 49C, favorable characteristics were obtained in all of the cumulative frequency distribution, the repetition characteristics, and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, Zr and oxygen were added in the intermediate layer 21A as the transition metal, and oxygen was added in the ion supply layer 21B.

Example 18

Transition Metal and Oxygen Added in Intermediate Layer 21A

A memory cell array having the memory component 1 was manufactured similarly to the fourth embodiment. First, the lower electrode 10 made of TiN exposed on the CMOS circuit was oxidized by plasma oxidation, whereby the first layer 22A made of TiOx was formed to a thickness of about 1 nm.

Subsequently, a CuZrTe film was formed to a thickness of 5 nm and exposed to oxygen at a pressure of 10 Torr, whereby the intermediate layer 21A made of CuZrTeOx was formed.

After that, the ion supply layer 21B made of CuZrTeAlGe (Cu 11 at %-Zr 11 at %-Te 30 at %-Al 40 at %-Ge 8 at %) was formed to a thickness of 60 nm, and finally, the upper electrode 30 made of W was formed to a thickness of 50 nm. The process of this example can be summarized as follows.

TiN/plasma oxidation/CuZrTeOx(5 nm)/CuZrTeAlGe (60 nm)/W (50 nm)

Here, although the CuZrTeOx which is the intermediate layer 21A has a composition of CuZrTeOx as denoted during the deposition, since actually Al is diffused from the CuZrTeAlGe layer which is the ion supply layer 21B even at the room temperature, the CuZrTeOx becomes CuZrTeAlOx.

After the laminated film of the lower electrode 10, the memory layer 20, and the upper electrode 30 was formed, the laminated film was patterned so that the resistance variable layer 22, the ion source layer 21, and the upper electrode 30 was left in a memory cell array portion. Moreover, etching was performed on the surface of the upper electrode 30 so as to expose the contact portion of the upper electrode 30 for connecting to an external circuit that applies an intermediate potential (Vdd/2).

After the laminated film was patterned, a wiring layer (not shown), for example, made of Al was formed to a thickness of 200 nm, and the wiring layer was connected to the contact portion of the upper electrode 30. After that, the laminated film was subjected to heat treatment at a temperature of 300° C. for 2 hours in a vacuum heat treatment furnace. In this way, a memory cell array having the memory component 1 shown in FIG. 11 was manufactured.

The repeated rewriting characteristics were examined for the obtained memory cell array of Example 18. During the examination, a pulse having a voltage Vw of 3 V, a current of about 100 μA, and a pulse width of 10 ns was used as a write pulse, a pulse having a voltage Ve of 2 V, a current of about 100 μA, and a pulse width of 10 nm was used as an erase pulse, and the rewrite operation was repeated $10^5$ times or more using the pulses. The results of the examination are shown in FIG. 50A.

Figure 50A:
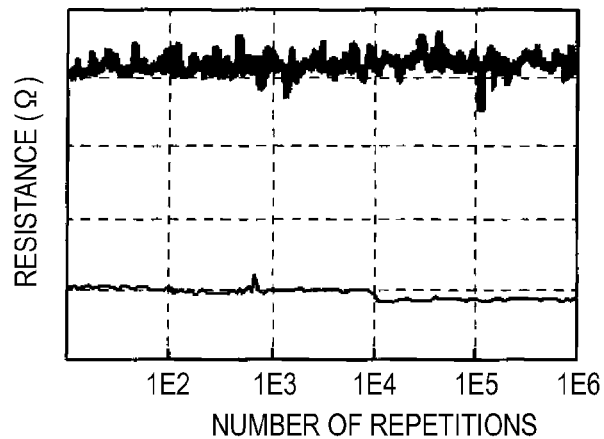
FIGS. 50A and 50B are diagrams showing the results of Example 18.

As can be understood from FIG. 50A, a favorable memory operation wherein the resistance values of the low-resistance state and the high-resistance state are different in the order of one digit or more was obtained.

Subsequently, the cumulative frequency distribution (depicted by a broken line) after 1000 repetitions with a 4-kbit memory cell array and the cumulative frequency distribution (depicted by a solid line) after an accelerated data retention test at a temperature of 130° C. for 2 hours were examined. The results of the examination are shown in FIG. 50B.

Figure 50B:
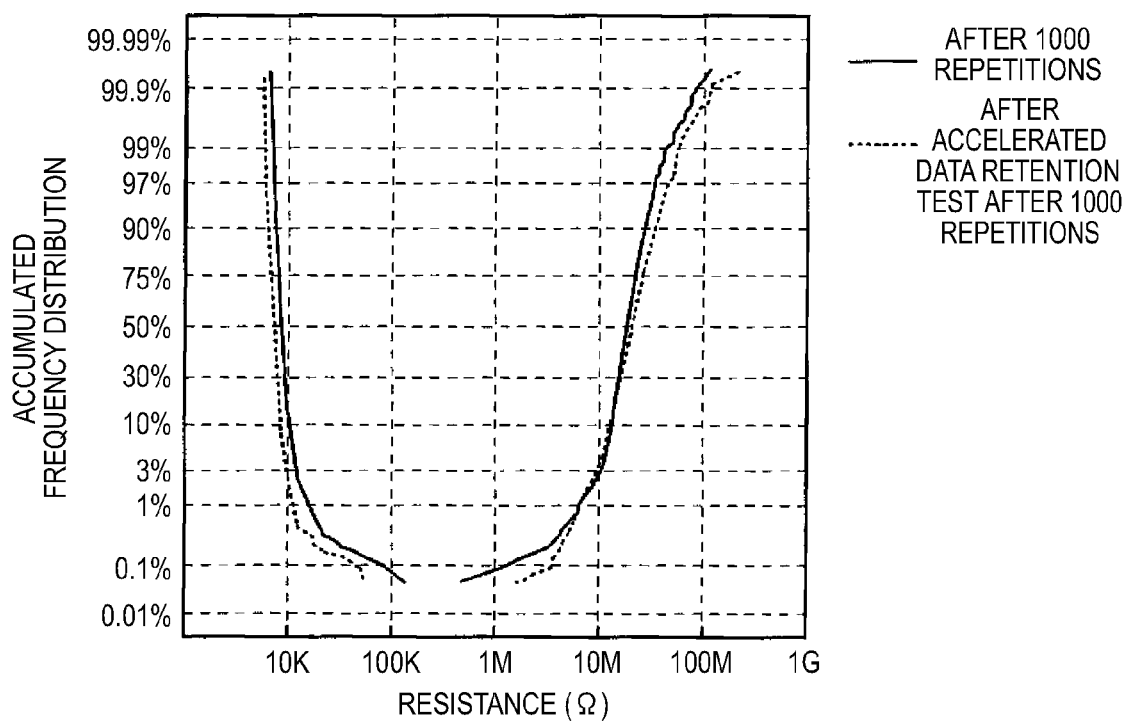

As can be understood from FIG. 50B, the written state (low-resistance state) and the erased state (high-resistance state) are separated, favorable variation characteristics were obtained, and favorable resistance separation characteristics were obtained even after the accelerated data retention test. Therefore, it can be understood that by providing a reference resistance between the two resistance states, it was possible to read the written state (low-resistance state) and the erased state (high-resistance state), and favorable variation characteristics were obtained.

That is, it was understood that favorable resistance separation characteristics and favorable repetition characteristics were obtained when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Cu, Zr, and oxygen were added in the intermediate layer 21A as the transition metal.

Example 19

Transition Metal Added in Intermediate Layer 21A

A memory cell array having the memory component 1 was manufactured similarly to Example 18, except that the intermediate layer 21A was made of CrTe. The process of this example can be summarized as follows.

TiN/plasma oxidation/CrTe (5 nm)/CuZrTeAlGe (60 nm)/W (50 nm)

In this case, similarly to Example 18, the CrTe layer which is the intermediate layer 21A becomes CrAlTe due to diffusion of Al from the ion supply layer 21B.

Comparative Example 4

A memory cell array having a memory component was manufactured similarly to Example 18, except that the intermediate layer was made of Te. The process of Comparative Example 4 can be summarized as follows.

TiN/plasma oxidation/Te (5 nm)/CuZrTeAlGe (60 nm)/W (50 nm)

In this case, similarly to Example 18, the Te layer which is the intermediate layer becomes AlTe due to diffusion of Al from the ion supply layer.

Figure 51A:
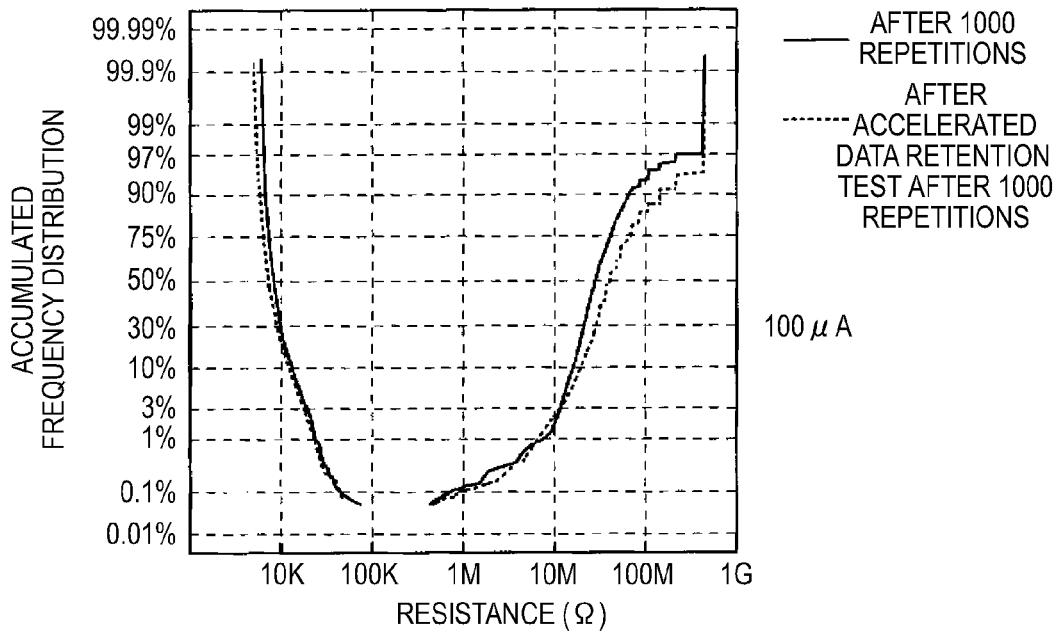
FIGS. 51A and 51B are diagrams showing the results of Comparative Example 4.
Figure 51B:
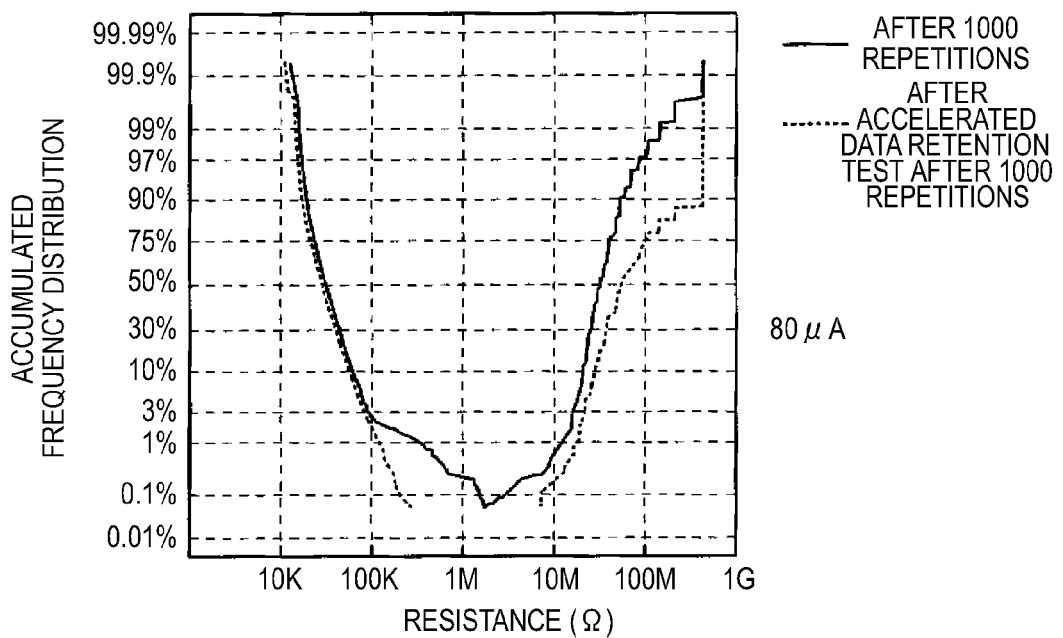

The resistance separation characteristics after 1000 repetitions were examined for the memory cell array obtained in Comparative Example 4. At that time, the currents used were 110 µA which is the same condition as used in Example 18 and 80 µA which is a lower current. The examination results are shown in FIGS. 51A and 51B.

As can be understood from FIGS. 50A and 50B and FIGS. 51A and 51B, under the write conditions of the current of 100 µA, in all case of Example 18 and Comparative Example 4, no overlap was found at the tail portions of 4 kbit data, and resistance separation was possible. However, when the current was decreased to 80 µA for Comparative Example 4, the resistance distribution of both the low-resistance side for writing and the high-resistance side for erasure was deteriorated, and resistance separation was not possible. Therefore, it can be understood that in the configuration of Comparative Example 4, it was difficult to decrease the rewrite current as compared to Example 18.

The resistance separation characteristics after 1000 repetitions with the current of 80 µA were examined for the memory cell array obtained in Example 19. The examination results are shown in FIG. 52B. Moreover, FIGS. 52A and 52C show the results of the examination of the resistance separation characteristics after 1000 repetitions with the current of 80 µA for Example 18 and Comparative Example 4, respectively.

As can be understood from FIGS. 52A to 52C, in the case of Example 19 where chromium (Cr) was added in the intermediate layer 21A, the rewrite operation at a low current was stable and a resistance separation margin was secured.

In order to investigate the reason thereof, the CuZrTeOx layer of the intermediate layer 21A for Example 18, the CrTe layer of the intermediate layer 21A for Example 19, and the Te layer of the intermediate layer for Comparative Example 4 were produced, and the sheet resistances thereof were measured. The volume resistivities thereof were calculated as follows.

Te: 0.27 Ωcm
CuZrTeOx: 0.44 Ωcm
CrTe: 0.56 Ωcm

As can be understood from the result, the resistance of the intermediate layers for Examples 18 and 19 was higher than that of the Te layer which is the intermediate layer for Comparative Example 4. This is considered to be attributable to the fact that since the resistance of the intermediate layer 21A becomes higher than the resistance of the ion supply layer 21B, when the write and erase bias voltages are applied, an electric field can be applied to the intermediate layer 21A more effectively, and a stronger electric field is applied to the ion species mainly of Al, whereby the ions can move more easily. Thus, both the write and erase operations are stabilized in Examples 18 and 19.

That is, it was understood that favorable resistance separation characteristics and favorable repetition characteristics were obtained, and particularly, the resistance separation characteristics at a low current were improved when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Cr was added in the intermediate layer 21A.

As described above, even when Cr was added in the intermediate layer 21A, by adding oxygen further, it can be expected that an appropriately high resistance value can be obtained. Therefore, it can be expected that the same or superior effect as Example 19 can be obtained.

Example 20

Transition Metal Added in Intermediate Layer 21A

A memory cell array having the memory component 1 was manufactured similarly to Example 19, except that the intermediate layer 21A was made of MnTe. The process of Example 20 can be summarized as follows.

TiN/plasma oxidation/MnTe (5 nm)/CuZrTeAlGe (60 nm)/W (50 nm)

In this case, similarly to Example 18, the MnTe layer which is the intermediate layer 21A becomes MnAlTe due to diffusion of Al from the ion supply layer 21B.

Figure 53A:
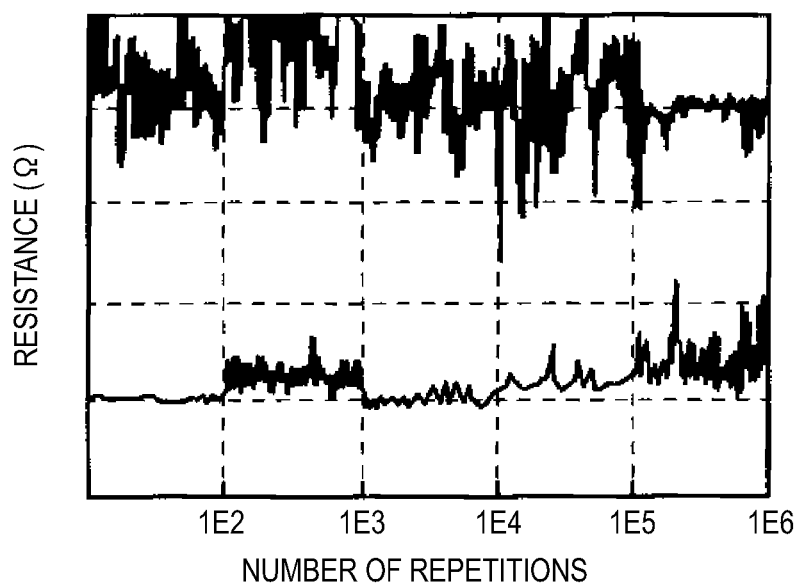
FIGS. 53A and 53B are diagrams showing the results of Example 20.
Figure 53B:
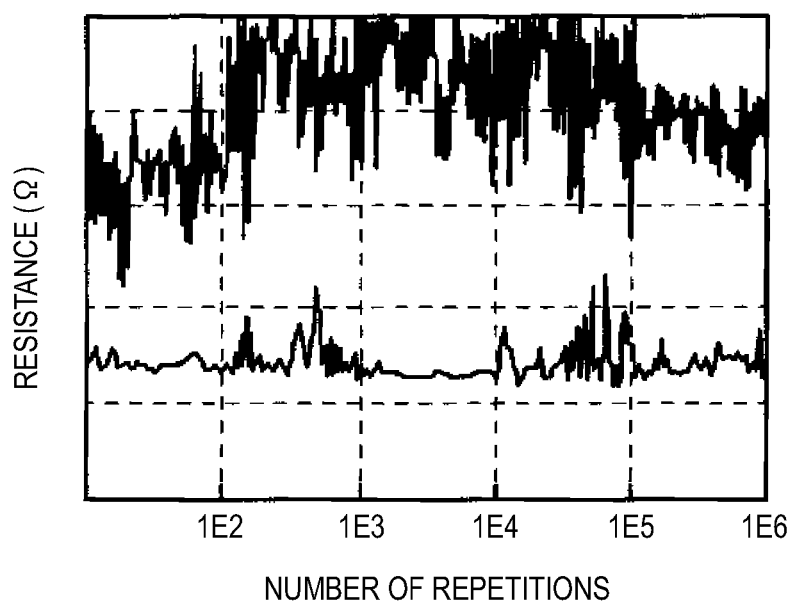

The repeated rewriting characteristics and the resistance separation characteristics were examined for the obtained memory cell array of Example 20. As shown in FIGS. 53A and 53B, favorable characteristics were obtained in all of the repetition characteristics and resistance separation characteristics, as compared to Comparative Example 1 where the transition metal oxide or the transition metal oxynitride of the embodiment was not used.

That is, it was understood that favorable resistance separation characteristics and favorable repetition characteristics were obtained, and particularly, the resistance separation characteristics at a low current were improved when the resistance variable layer 22 had a configuration in which the first layer 22A made of the transition metal oxynitride and the second layer 22B containing the aluminum oxide as its main component were laminated in that order from the side of the lower electrode 10; the ion source layer 21 had the two-layered structure of the intermediate layer 21A and the ion supply layer 21B, and Mn was added in the intermediate layer 21A.

As described above, even when Mn was added in the intermediate layer 21A, by adding oxygen further, it can be expected that an appropriately high resistance value can be obtained. Therefore, it can be expected that the same or superior effect as Example 20 can be obtained.

While the present invention has been described by way of embodiments and examples, the present invention is not limited to the embodiments and examples described above but may be modified in various forms.

For example, the present invention is not limited to the materials of the respective layers or the deposition method and deposition conditions described in the embodiments and examples, but other materials and other deposition methods may be used. For example, other transition metal elements such as Ti, Hf, V, Nb, Ta, Cr, Mo, or W may be added in the ion source layer 21 without departing from the above-mentioned composition ratios.

Moreover, for example, in the embodiments described above, although specific layer configurations of the memory component 1 and the memory cell array 2 have been described, it is not necessary to have all the layers, and another layer may be further provided.

In addition, for example, in the embodiments and examples, although a case where the memory component 1 has the lower electrode 10 (first electrode), the memory layer 20, and the upper electrode 30 (second electrode) which are provided in that order on the silicon substrate 41 on which the CMOS circuit is formed has been described, the lamination order may be reversed. In that case, the memory component 1 has a configuration in which the upper electrode 30 (second electrode), the memory layer 20, and the lower electrode 10 (first electrode) are laminated in that order on the silicon substrate 41.

The present application contains subject matter related to those disclosed in Japanese Priority Patent Applications JP 2010-026573 and JP 2010-261517 filed in the Japan Patent Office on Feb. 9, 2010 and Nov. 24, 2010, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
a first electrode;
a second electrode; and
a memory layer between the first and second electrodes, wherein,
the memory layer includes (a) a first memory layer containing aluminum (Al) and a chalcogen element, and (b) a second memory layer between the first memory layer and the first electrode and containing an aluminum oxide and at least one of a transition metal oxide and a transition metal oxynitride having a lower resistance than the aluminum oxide, and
the first memory layer has a resistance lower than the resistance value of the second memory layer.

2. The memory device of claim 1, wherein the second memory layer has a first sublayer made of at least one of the transition metal oxide and the transition metal oxynitride and a second sublayer containing the aluminum oxide as its main component, the second sublayer being between the first sublayer and the first electrode.

3. The memory device of claim 1, wherein the chalcogen element is selected from the group consisting of tellurium (Te), sulfur (S) and selenium (Se).

4. The memory component according to claim 3, wherein the aluminum oxide and at least one of the transition metal oxide and the transition metal oxynitride are present in the first sub layer of the second memory layer in a mixed state.

5. The memory device according to claim 1, wherein the transition metal oxide or the transition metal oxynitride is at least one oxide or oxynitride of a transition metal selected from the group consisting of titanium (Ti), zirconium (Zr), hafnium (Hf), vanadium (V), niobium (Nb), tantalum (Ta), chromium (Cr), molybdenum (Mo), and tungsten (W).

6. The memory component according to claim 1, wherein:
the chalcogen element is selected from the group consisting of tellurium (Te), sulfur (S), and selenium (Se) together with aluminum (Al), and
the first memory layer includes a metal element from the group consisting of copper (Cu), zinc (Zn), silver (Ag), nickel (Ni), cobalt (Co), manganese (Mn), iron (Fe), titanium (Ti), zirconium (Zr), hafnium (Hf), vanadium (V), niobium (Nb), tantalum (Ta), chromium (Cr), molybdenum (Mo), and tungsten (W).

7. The memory device of claim 1, wherein:
aluminum is present in the first memory layer in the amount of 30 to 50 at %;
the transition metal is present in the first memory layer in the amount of 7.5 to 26 at %;
Ge is present in the first memory layer in the amount of at most 15 at %; and
Si is present in the first memory layer in the amount of 10-45 at %.

8. The memory device according to claim 1, wherein the first memory layer has a first sub layer comprising aluminum, a chalcogen element and a transition metal element, and a second sublayer comprising aluminum and a chalcogen element, the second sublayer of the first memory layer being between the second memory layer and the first sublayer of the first memory layer.

9. The memory component according to claim 8, wherein the second sublayer of the first memory layer contains at least one transition metal element selected from the group consisting of zirconium (Zr), copper (Cu), chromium (Cr), manganese (Mn), titanium (Ti), and hafnium (Hf).

10. The memory component according to claim 1, wherein the first memory layer includes oxygen.

11. The memory component according to claim 8, wherein the second sublayer of the first memory layer includes oxygen (O) and at least one transition metal element selected from the group consisting of copper (Cu), titanium (Ti), zirconium (Zr), hafnium (Hf), chromium (Cr), and manganese (Mn).

12. The memory component according to claim 1, wherein information is stored using a change in electrical characteristics of the memory layer caused by at least one of a redox reaction of the aluminum oxide in response to application of a voltage to the first electrode and the second electrode and a movement of ions of the metal element contained in the first memory layer.

13. The memory component according to claim 12, wherein the metal element contained in the first memory layer is at least one element selected from the group consisting of copper (Cu), zinc (Zn), silver (Ag), nickel (Ni), cobalt (Co), manganese (Mn), iron (Fe), titanium (Ti), zirconium (Zr), hafnium (Hf), vanadium (V), niobium (Nb), tantalum (Ta), chromium (Cr), molybdenum (Mo), and tungsten (W).

14. The memory component according to claim 1, wherein the first electrode is made of at least one transition metal selected from the group consisting of titanium (Ti), zirconium (Zr), hafnium (Hf), vanadium (V), niobium (Nb), tantalum (Ta), chromium (Cr), molybdenum (Mo), and tungsten (W) or a nitride thereof.

15. A memory device comprising:
first and second electrodes; and
a memory layer between the first and second electrodes, wherein:
the memory layer includes first and second layers with the second layer being between the first layer and the first electrode, each of the first and second layers includes first and second sublayers with the second layer being between the first sublayer and the first electrode, the first sublayer of the first memory layer comprises aluminum, a chalcogen element and a transition metal element;

the second sublayer of the first memory layer comprises aluminum and a chalcogen element;

the first sublayer of the second memory layer containing the aluminum oxide as its main component; and the second sublayer of the second memory layer comprises at least one of the transition metal oxide and the transition metal oxynitride.

16. The memory device of claim 15, wherein the chalcogen element is selected from the group consisting of tellurium (Te), sulfur (S) and selenium (Se).

17. The memory device of claim 15, wherein the transition metal oxide or the transition metal oxynitride is at least one oxide or oxynitride of a transition metal selected from the group consisting of titanium (Ti), zirconium (Zr), hafnium (Hf), vanadium (V), niobium (Nb), tantalum (Ta), chromium (Cr), molybdenum (Mo), and tungsten (W).

18. The memory device of claim 15, wherein the second sublayer of the first memory layer contains at least one transition metal element selected from the group consisting of zirconium (Zr), copper (Cu), chromium (Cr), manganese (Mn), titanium (Ti), and hafnium (Hf).

19. The memory device of claim 15, wherein information is stored using a change in electrical characteristics of the memory layer caused by at least one of a redox reaction of the aluminum oxide in response to application of a voltage to the first electrode and the second electrode and a movement of ions of the metal element contained in the first memory layer.

20. The memory device of claim 15, wherein the metal element contained in the first memory layer is at least one element selected from the group consisting of copper (Cu), zinc (Zn), silver (Ag), nickel (Ni), cobalt (Co), manganese (Mn), iron (Fe), titanium (Ti), zirconium (Zr), hafnium (Hf), vanadium (V), niobium (Nb), tantalum (Ta), chromium (Cr), molybdenum (Mo), and tungsten (W).

* * * * *